(12) United States Patent
Ogura et al.

(10) Patent No.: US 9,625,615 B2
(45) Date of Patent: Apr. 18, 2017

(54) NON-AQUEOUS DISPERSANT, COLOR MATERIAL DISPERSION LIQUID AND METHOD FOR PRODUCING THE SAME, COLOR RESIN COMPOSITION AND METHOD FOR PRODUCING THE SAME, COLOR FILTER, LIQUID CRYSTAL DISPLAY DEVICE, AND ORGANIC LIGHT-EMITTING DISPLAY DEVICE

(71) Applicant: DAI NIPPON PRINTING CO., LTD., Tokyo-to (JP)

(72) Inventors: Michihiro Ogura, Tokyo-to (JP); Tomoki Murata, Tokyo-to (JP); Hiroaki Segawa, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 0 days.

(21) Appl. No.: 14/395,278

(22) PCT Filed: Apr. 26, 2013

(86) PCT No.: PCT/JP2013/062463
§ 371 (c)(1),
(2) Date: Oct. 17, 2014

(87) PCT Pub. No.: WO2013/179841
PCT Pub. Date: Dec. 5, 2013

(65) Prior Publication Data
US 2015/0065658 A1     Mar. 5, 2015

(30) Foreign Application Priority Data

May 31, 2012   (JP) ................. 2012-125225

(51) Int. Cl.
| | | |
|---|---|---|
| C08F 265/04 | (2006.01) | |
| C08F 265/06 | (2006.01) | |
| C09D 17/00 | (2006.01) | |
| G02B 1/04 | (2006.01) | |
| G02B 5/20 | (2006.01) | |
| H01L 27/32 | (2006.01) | |
| G02F 1/1335 | (2006.01) | |

(52) U.S. Cl.
CPC .............. *G02B 1/04* (2013.01); *C08F 265/04* (2013.01); *C08F 265/06* (2013.01); *C09D 17/002* (2013.01); *G02B 5/201* (2013.01); *G02F 1/133514* (2013.01); *H01L 27/322* (2013.01)

(58) Field of Classification Search
CPC .... C08F 265/04; C08F 265/06; C09D 17/002; G02B 1/04; G02B 5/201; G02F 1/133514; H01L 27/322
See application file for complete search history.

(56) References Cited

U.S. PATENT DOCUMENTS

| 5,352,740 A | 10/1994 | Ishidoya et al. |
| 8,298,452 B2 * | 10/2012 | Ogura ............... G03F 7/0007 |
| | | 106/31.28 |
| 2009/0108241 A1 | 4/2009 | Ogura et al. |
| 2009/0214834 A1 | 8/2009 | Miyabayashi et al. |
| 2013/0018208 A1 | 1/2013 | Kondou et al. |
| 2014/0125930 A1 | 5/2014 | Sawada |

FOREIGN PATENT DOCUMENTS

| JP | 04-218561 A | 8/1992 |
| JP | 2006-106503 A | 4/2006 |
| JP | 2008-207093 A | 9/2008 |
| JP | 2009-186657 A | 8/2009 |
| JP | 2009-265649 A | 11/2009 |
| JP | 2010-079244 A | 4/2010 |
| JP | 2010-083923 A | 4/2010 |
| JP | 2010-085647 A | 4/2010 |
| JP | 2011-186043 A | 9/2011 |
| JP | 2011-191783 A | 9/2011 |
| JP | 4-911253 B1 | 4/2012 |
| JP | 2012-083411 A | 4/2012 |
| JP | 2012-236882 A | 12/2012 |
| TW | 201139476 A | 11/2011 |
| WO | 2006/137393 A1 | 12/2006 |
| WO | 2012/039417 A1 | 3/2012 |

OTHER PUBLICATIONS

International Search Report dated Jul. 23, 2013; PCT/JP2013/062463.

* cited by examiner

*Primary Examiner* — Irina S Zemel
*Assistant Examiner* — Jeffrey Lenihan
(74) *Attorney, Agent, or Firm* — Ladas & Parry LLP

(57) ABSTRACT

Disclosed is a non-aqueous dispersant which is excellent in dispersibility and dispersion stability and able to form a resin layer with excellent hydrolysis resistance; a color material dispersion liquid containing the non-aqueous dispersant; and a color resin composition containing the non-aqueous dispersant. The non-aqueous dispersant is a polymer comprising at least one constitutional unit represented by the following general formula (I), wherein at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid:

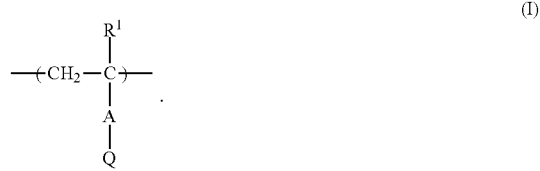

22 Claims, 1 Drawing Sheet

NON-AQUEOUS DISPERSANT, COLOR MATERIAL DISPERSION LIQUID AND METHOD FOR PRODUCING THE SAME, COLOR RESIN COMPOSITION AND METHOD FOR PRODUCING THE SAME, COLOR FILTER, LIQUID CRYSTAL DISPLAY DEVICE, AND ORGANIC LIGHT-EMITTING DISPLAY DEVICE

TECHNICAL FIELD

The present invention relates to a non-aqueous dispersant, a color material dispersion liquid and a method for producing the same, a color resin composition and a method for producing the same, a color filter, a liquid crystal display device, and an organic light-emitting display device.

BACKGROUND ART

Thin image display devices as typified by displays, i.e., flat panel displays, have been released on the market because they are thinner than cathode-ray tube displays and they do not occupy much space in depth. Their market price has decreased year by year with advances in production techniques, resulting in a further increase in demand and a yearly increase in production. Especially, color LCD TVs have almost become the mainstream of TVs. Also in recent years, organic light-emitting display devices such as organic EL displays, which emit light by themselves and thereby have high visibility, have received attention as the next generation of image display devices. In relation to the performance of these image display devices, there is a strong demand for a further increase in image quality, such as an increase in contrast and color reproducibility, and a decrease in power consumption.

A color filter is used in these liquid crystal display devices and organic light-emitting display devices. For example, in the case of color LCDs, the amount of light is controlled by using a back light as the light source and electrically driving the liquid crystal. Colors are represented by the light that passed through the color filter. Accordingly, the color filter is indispensible for color representation in LCD TVs and plays a large role in determining display performance. In organic light-emitting display devices, a color image is formed in the same manner as liquid crystal display devices, when the color filter is used in combination with an organic, white light-emitting element.

A recent trend is that there is a demand for power-saving image display devices. To increase backlight use efficiency, there is a very high demand for high-luminance color filters. This is a major issue especially for mobile displays such as mobile phones, smart phones and tablet PCs.

Even though technological advances have increased battery capacity, there is still a limit on battery capacity of mobile devices. Meanwhile, there is a trend that power consumption has grown with the increase in screen size. Image display devices containing a color filter determine the design and performance of mobile terminal devices because they are directly linked to the usable time and charging frequency of mobile terminal devices.

In general, a color filter has a transparent substrate, color layers made of color patterns of the three primary colors (red, green and blue), and a light shielding part formed on the transparent substrate so as to define each color pattern.

To form such color layers, a dispersion method in which pigments with excellent heat resistance and light resistance are used as colorants, has been widely used. However, it is difficult for color filters produced by use of pigments to satisfy the latest demand for higher luminance. As a result, in recent years, it has been considered to use dyes, which generally have higher transparency than pigments, or lake pigments, which are dyes made insoluble by a precipitant, in place of pigments (Patent Literatures 1 and 2). However, dyes and lake pigments are problematic in that they are inferior in heat resistance to pigments and the chromaticity is likely to change when they are heated at high temperature in color filter production process. Since dyes show particularly poor heat resistance when they are dissolved for use, it has been considered to disperse dyes for use (Patent Literature 3).

To satisfy the demand for higher contrast, it is requested to make these color materials finer at the time of dispersion. Once the color materials are made finer, the surface area is increased and creates a need to increase the amount of a dispersant added, in order to homogeneously disperse the color materials. However, once the amount is increased, although the color materials can be homogeneously dispersed, there is such a problem that alkaline developability of a photocurable resist composition thus formed is decreased and the photocurable resist composition, which is not subjected to exposure, remains on a substrate, or that the productivity and quality of the photocurable resist composition are reduced.

By using a phosphate-modified block or graft copolymer as a dispersant, which forms a salt with a specific acidic organophosphorous compound, the inventors of the present invention have developed a color resin composition which is good in dispersibility, able to form a color filter with high contrast, and excellent in alkaline developability (for example, see Patent Literatures 4 to 6).

CITATION LIST

Patent Literature 1: Japanese Patent Application Laid-Open (JP-A) No. 2009-186657
Patent Literature 2: JP-A No. 2011-186043
Patent Literature 3: JP Patent No. 4911253
Patent Literature 4: JP-A No. 2009-265649
Patent Literature 5: JP-A No. 2011-191783
Patent Literature 6: JP-A No. 2010-79244

SUMMARY OF INVENTION

Technical Problem

However, the dispersants disclosed in Patent Literatures 4 to 6 have such a problem that the acidic phosphoric acid ester disclosed in the literatures is used for salt formation of the dispersants, hydrolysis is likely to proceed in alkaline aqueous solution and a coating film thus formed is likely to be removed. To solve the problem, an organic phosphonic acid or organic phosphinic acid is used as an organophosphate compound to improve alkali resistance. However, in the case of using an organic phosphonic acid, when the amount of salt formed in the dispersant is large, a dispersion liquid thus obtained is likely to increase viscosity and result in poor dispersion stability. An organic phosphinic acid is difficult to use because it may produce toxic phosphine by pyrolysis.

The present invention was achieved under the above circumstances. An object of the present invention is to provide: a non-aqueous dispersant which is excellent in dispersibility and dispersion stability and able to form a resin layer with excellent hydrolysis resistance; a color material dispersion liquid which is excellent in dispersibility and dispersion stability and able to form a color layer with excellent hydrolysis resistance, and a method for producing the same; a color resin composition which is excellent in dispersibility and dispersion stability and able to form a color layer with excellent hydrolysis resistance, and a method for producing the same; a color filter which is good in contrast and contains color layers with excellent hydrolysis resistance; a liquid crystal display device containing the color filter; and an organic light-emitting display device containing the color filter.

Solution to Problem

As a result of diligent researches made to achieve the above object, the inventors of the present invention have found the following: dispersibility and dispersion stability are increased by using a polymer comprising at least one specific constitutional unit as a non-aqueous dispersant, in which at least part of nitrogen sites of the polymer each form a salt with an organic phosphonic acid monoester compound in which one of two acidic groups of the organic phosphonic acid is esterified; moreover, by use of the non-aqueous dispersant, heat resistance of color layers is also increased even when a color material with low heat resistance, such as a lake pigment, is used.

The present invention was achieved in light of the above knowledge.

The non-aqueous dispersant of the present invention is a polymer comprising at least one constitutional unit represented by the following general formula (I), wherein at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid:

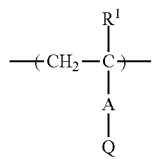

(I)

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

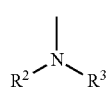

(I-a)

wherein $R^2$ and $R^3$ each independently represent a hydrogen atom or a hydrocarbon group which can contain a hetero atom, and $R^2$ and $R^3$ can be the same as or different from each other.

The color material dispersion liquid of the present invention comprises a color material, a dispersant and a solvent, the dispersant being a polymer comprising at least one constitutional unit represented by the general formula (I), wherein at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid.

The color material dispersion liquid production method of the present invention comprises the steps of: preparing a dispersant by mixing a polymer comprising at least one constitutional unit represented by the general formula (I) with an acidic organophosphorous compound comprising one or more selected from the group consisting of organic phosphonic acid monoester compounds resulting from addition of a monofunctional epoxy compound or monofunctional oxetane compound to an organic phosphonic acid, thereby allowing that at least part of nitrogen sites of the constitutional units represented by the general formula (I) each form a salt with the acidic organophosphorous compound, and dispersing the obtained dispersant and a color material in a solvent.

The color resin composition of the present invention comprises a color material, a dispersant, a binder component and a solvent, the dispersant being a polymer comprising at least one constitutional unit represented by the general formula (I), wherein at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid.

The color resin composition production method of the present invention comprises the steps of: preparing a dispersant by mixing a polymer comprising at least one constitutional unit represented by the general formula (I) with an acidic organophosphorous compound comprising one or more selected from the group consisting of organic phosphonic acid monoester compounds resulting from addition of a monofunctional epoxy compound or monofunctional oxetane compound to an organic phosphonic acid, thereby allowing that at least part of nitrogen sites of the constitutional units represented by the general formula (I) each form a salt with the acidic organophosphorous compound; preparing a color material dispersion liquid by dispersing the obtained dispersant and a color material in a solvent; and mixing the obtained color material dispersion liquid with a binder component.

The present invention provides a color filter comprising at least a transparent substrate and color layers disposed on the transparent substrate, wherein at least one of the color layers is a color layer formed by curing a composition containing a color material, a dispersant and a binder component, and wherein the dispersant is a polymer comprising at least one constitutional unit represented by the general formula (I), in which at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid.

In the non-aqueous dispersant of the present invention, the color material dispersion liquid and the method for producing the same of the present invention, the color resin composition and the method for producing the same of the present invention, and the color filter of the present invention, from the viewpoint of being excellent in dispersibility and dispersion stability and being able to form a color layer with excellent heat resistance and hydrolysis resistance, it is preferable that the polymer is a block copolymer comprising at least one constitutional unit represented by the general formula (I) and at least one constitutional unit represented by the following general formula (II), wherein at least part of nitrogen sites of the constitutional units represented by the general formula (I) each form a salt with the acidic organophosphorous compound, or wherein the polymer is a graft copolymer in which at least one nitrogen-containing monomer represented by the following general formula (I') and a polymerizable oligomer comprising a polymer chain having at least one of constitutional units represented by the following general formulae (III) and (IV) and a group having an ethylenically unsaturated double bond at a terminal of the chain, are contained as copolymerizable components, and in which at least part of nitrogen sites of the nitrogen-containing monomers represented by the following general formula (I') each form a salt with the acidic organophosphorous compound:

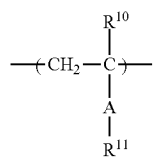
(II)

wherein A is a direct bond or a divalent linking group; $R^{10}$ is a hydrogen atom or a methyl group; $R^{11}$ is a hydrocarbon group or a monovalent group described by $-[CH(R^{12})-CH(R^{13})-O]_x-R^{14}$ or $-[(CH_2)_y-O]_z-R^{14}$; $R^{12}$ and $R^{13}$ each independently represent a hydrogen atom or a methyl group; $R^{14}$ is a hydrogen atom, a hydrocarbon group or a monovalent group described by $-CHO$, $-CH_2CHO$, or $-CH_2COOR^{15}$; $R^{15}$ is a hydrogen atom or an alkyl group having 1 to 5 carbon atoms; the hydrocarbon group can have a substituent group; x is an integer of 1 to 18; y is an integer of 1 to 5; and z is an integer of 1 to 18;

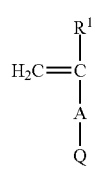
(I')

wherein $R^1$ is a hydrogen atom or methyl group; A is a direct bond or divalent linking group; and Q is a group represented by the following general formula (I-a) or a nitrogen-containing heterocyclic group which is able to form a salt with an acid and which can have a substituent group;

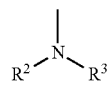
(I-a)

wherein $R^2$ and $R^3$ each independently represent a hydrogen atom or a hydrocarbon group which can contain a hetero atom, and $R^2$ and $R^3$ can be the same as or different from each other;

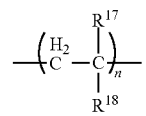
(III)

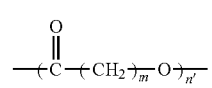
(IV)

wherein $R^{17}$ is a hydrogen atom or a methyl group; $R^{18}$ is a hydrocarbon group, a cyano group or a monovalent group described by $-[CH(R^{19})-CH(R^{20})-O]_x-R^{21}$, $-[(CH_2)_y-O]_z-R^{21}$, $-[CO-(CH_2)_y-O]_z-R^{21}$, $-CO-O-R^{22}$ or $-O-CO-R^{23}$; $R^{19}$ and $R^{20}$ each independently represent a hydrogen atom or a methyl group; $R^{21}$ is a hydrogen atom, a hydrocarbon group or a monovalent group described by a $-CHO$, $-CH_2CHO$ or $-CH_2COOR^{24}$; $R^{22}$ is a hydrocarbon group, a cyano group or a monovalent group described by $-[CH(R^{19})-CH(R^{20})-O]_x-R^{21}$, $-[(CH_2)_y-O]_z-R^{21}$ or $-[CO-(CH_2)_y-O]_z-R^{21}$; $R^{23}$ is an alkyl group having 1 to 18 carbon atoms; $R^{24}$ is a hydrogen atom or an alkyl group having 1 to 5 carbon atoms; the hydrocarbon groups can have a substituent group each; m is an integer of 1 to 5; n and n' are each an integer of 5 to 200; x is an integer of 1 to 18; y is an integer of 1 to 5; and z is an integer of 1 to 18.

In the non-aqueous dispersant, the color material dispersion liquid and the method for producing the same of the present invention, the color resin composition and the method for producing the same of the present invention, and the color filter of the present invention, from the viewpoint of being excellent in dispersibility and dispersion stability and being able to form a color layer with excellent hydrolysis resistance, it is preferable that the acidic organophosphorous compound contains at least one of organic phosphonic acid monoester compounds represented by the following general formulae (V) and (VI):

$$R^a-\underset{\underset{OH}{|}}{\overset{\overset{O}{\|}}{P}}-O-\underset{\underset{R^c}{|}}{\overset{\overset{R^b}{|}}{C}}-\underset{\underset{R^e}{|}}{\overset{\overset{R^d}{|}}{C}}-OH \quad (V)$$

$$R^a-\underset{\underset{OH}{|}}{\overset{\overset{O}{\|}}{P}}-O-\overset{H_2}{C}-\underset{\underset{R^g}{|}}{\overset{\overset{R^f}{|}}{C}}-\overset{H_2}{C}-OH \quad (VI)$$

wherein $R^a$ is a hydrocarbon group or a monovalent group described by $-[CH(R^h)-CH(R^i)-O]_s-R^j$ or $-[(CH_2)_t-O]_u-R^j$; $R^h$ and $R^i$ each independently represent a hydrogen atom or a methyl group; $R^j$ is a hydrogen atom, a hydrocarbon group or a monovalent group described by $-CHO$, $-CH_2CHO$, $-CO-CH=CH_2$, $-CO-C(CH_3)=CH_2$ or $-CH_2COOR^k$; $R^k$ is a hydrogen atom or an alkyl group having 1 to 5 carbon atoms; $R^b$, $R^c$, $R^d$, $R^e$, $R^f$ and $R^g$ each independently represent a hydrogen atom, a hydrocarbon group or a group in which hydrocarbon groups are bound by at least one of an ether bond and an ester bond; $R^b$ and $R^d$ can be bound to form a cyclic structure; the cyclic structure can have a substituent group $R^L$; $R^L$ is a hydrogen atom, a hydrocarbon group or a group in which hydrocarbon groups are bound by at least one of an ether bond and an ester bond; the hydrocarbon groups can have a substituent group each; s is an integer of 1 to 18; t is an integer of 1 to 5; and u is an integer of 1 to 18.

The present invention also provides a liquid crystal display device comprising the color filter of the present invention, a counter substrate, and a liquid crystal layer disposed between the color filter and the counter substrate.

The present invention further provides an organic light-emitting display device comprising the color filter of the present invention and an organic light-emitting material.

Advantageous Effects of Invention

The present invention provides the following: a non-aqueous dispersant which is excellent in dispersibility and dispersion stability and able to form a resin layer with excellent hydrolysis resistance; a color material dispersion liquid which is excellent in dispersibility and dispersion stability and able to form a color layer with excellent hydrolysis resistance, and a method for producing the same; a color resin composition which is excellent in dispersibility and dispersion stability and able to form a color layer with excellent hydrolysis resistance, and a method for producing the same; a color filter which is good in contrast and contains color layers with excellent hydrolysis resistance; a liquid crystal display device containing the color filter; and an organic light-emitting display device containing the color filter.

DESCRIPTION OF EMBODIMENTS

Figure 1:
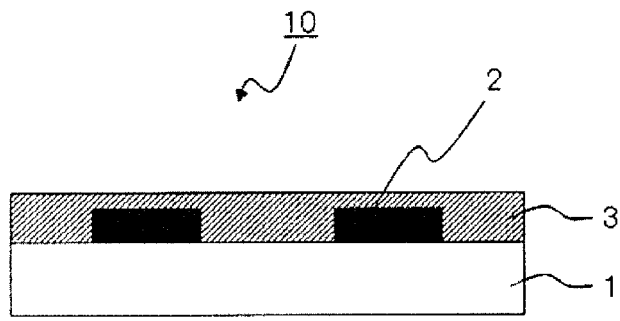
FIG. 1 is a schematic view of an example of the color filter of the present invention.

Hereinafter, the present invention will be described in detail. In particular, the non-aqueous dispersant, the color material dispersion liquid and the method for producing the same, the color resin composition and the method for producing the same, the color filter, the liquid crystal display device, and the organic light-emitting display device will be described in order.

In the present invention, light encompasses electromagnetic waves with wavelengths in the visible and invisible range, and radial rays. Radial rays include microwaves and electron beams, for example. More specifically, light include electromagnetic waves with wavelengths of 5 μm or less, and electron beams. Also in the present invention, "(meth) acrylic" means any one of acrylic and methacrylic, and "(meth)acrylate" means any one of acrylate and methacrylate.

[Non-Aqueous Dispersant]

The non-aqueous dispersant of the present invention is a polymer comprising at least one constitutional unit represented by the following general formula (I), wherein at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid:

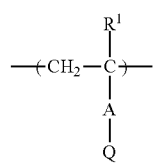

(I)

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

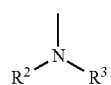

(I-a)

wherein $R^2$ and $R^3$ each independently represent a hydrogen atom or a hydrocarbon group which can contain a hetero atom, and $R^2$ and $R^3$ can be the same as or different from each other.

Because the non-aqueous dispersant of the present invention is the polymer containing at least one constitutional unit represented by the general formula (I) which has a nitrogen site that forms a salt with the above-specified organic phosphonic acid monoester compound, dispersibility and dispersion stability of particles of color materials, etc., are increased, and a resin layer with excellent hydrolysis resistance can be formed.

Also, the non-aqueous dispersant of the present invention is advantageous in that when the dispersant is used to disperse a color material with low heat resistance, such as a lake pigment, and color layers are formed with the resulting color material dispersion liquid, the heat resistance of the color layers is increased, that is, change in the chromaticity of the color material can be suppressed even upon heating.

The mechanism that the non-aqueous dispersant exerts the above-mentioned effects because the non-aqueous dispersant is the polymer containing at least one constitutional unit represented by the general formula (I) which has a nitrogen site that forms a salt with the above-specified organic phosphonic acid monoester compound, is presumed as follows.

It is presumed that since an organic phosphonic acid has two acidic groups, one of the acidic groups is left even after a salt is formed between the nitrogen site of the polymer and the organic phosphonic acid; therefore, when a large number of salts are formed in the dispersant, the polarity of the absorption group of the dispersant to particles to be dispersed is too high and result in a deterioration in dispersibility into a non-aqueous solvent or an increase in viscosity of a dispersion liquid containing a non-aqueous solvent. Meanwhile, the acidic organophosphorous compound used in the non-aqueous dispersant of the present invention is an organic phosphonic acid monoester compound resulting from addition of a monofunctional epoxy compound or monofunctional oxetane compound to an organic phosphonic acid; therefore, one of the acidic groups is left and the other becomes a phosphoric acid ester structure which contains an alcoholic hydroxyl group formed by the addition of an epoxy or oxetane group to the acidic group. Because the organic phosphonic acid monoester compound used in the present invention has one acidic group and one phosphoric acid ester structure specified above, an appropriate polarity is obtained, and even in the case where the number of salt-forming sites in the polymer is increased, a deterioration in the dispersibility and an increase in the viscosity are less likely to occur.

It is also presumed that the organic phosphonic acid monoester compound is able to prevent generation of active oxygen or to deactivate generated active oxygen. Therefore, it is presumed that active oxygen, which is generally increased upon heating at high temperature, is less likely to increase around the organic phosphonic acid monoester compound. Since the color material adsorbs to the salt-forming site having the organic phosphonic acid monoester compound in the non-aqueous dispersant, it is presumed that even upon heating at high temperature, the color material is insusceptible to active oxygen, and the color material with low heat resistance is prevented from being oxidized and thus discolored.

In the general formula (I), A is a direct bond or a divalent linking group. "Direct bond" means that Q is directly bound to a carbon atom, not through a linking group, like the following general formula (I-1):

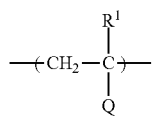

(I-1)

wherein $R^1$ and Q are the same as those in the general formula (I).

When A is a divalent linking group, examples thereof include an alkylene group having 1 to 10 carbon atoms, an arylene group, a —CONH— group, a —COO— group, an ether group having 1 to 10 carbon atoms (—R'—OR"— wherein R' and R" are each independently an alkylene group) and combinations thereof. From the viewpoint of heat resistance and light resistance of the polymer thus obtained, A is preferably a direct bond or a divalent linking group containing a —COO— group or —CONH— group. For example, when A is a divalent linking group containing a —COO— group and Q is a group represented by the general formula (I-a), an example of the constitutional unit represented by the general formula (I) is a structure represented by the following formula (I-2):

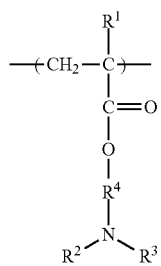

(I-2)

wherein $R^1$ is the same as that in the general formula (I); $R^2$ and $R^3$ are the same as those in the general formula (I-a); $R^4$ is an alkylene group having 1 to 8 carbon atoms, —[CH($R^5$)—CH($R^6$)—O]$_x$—CH($R^5$)—CH($R^6$)— or —[(CH$_2$)$_y$—O]$_z$—(CH$_2$)$_y$—; $R^5$ and $R^6$ are each independently a hydrogen atom or a methyl group; x is an integer of 1 to 18; y is an integer of 1 to 5; and z is an integer of 1 to 18.

When $R^4$ is an alkylene group having 1 to 8 carbon atoms, it may be a straight- or branched-chain alkylene group having 1 to 8 carbon atoms. Examples thereof include a methylene group, an ethylene group, a trimethylene group, a propylene group, various kinds of butylene groups, various kinds of pentylene groups, various kinds of hexylene groups and various kinds of octylene groups.

Also, x is an integer of 1 to 18, preferably an integer of 1 to 4, more preferably an integer of 1 to 2; y is an integer of 1 to 5, preferably an integer of 1 to 4, more preferably is 2 or 3; z is an integer of 1 to 18, preferably an integer of 1 to 4, more preferably an integer of 1 to 2.

From the viewpoint of dispersibility, $R^4$ is preferably an alkylene group having 1 to 8 carbon atoms. $R^4$ is more preferably a methylene group, an ethylene group, a propylene group or a butylene group. Of them, a methylene group and an ethylene group are preferred.

When $R^2$ and $R^3$ in the general formula (I-a) are each a hydrocarbon group which can contain a hetero atom, examples of the hydrocarbon group include an alkyl group, an aralkyl group and an aryl group.

Examples of the alkyl group include a methyl group, an ethyl group, a propyl group, a butyl group, a pentyl group, a hexyl group, an octyl group, an isopropyl group, a tert-butyl group, a 2-ethylhexyl group, a cyclopentyl group, a cyclohexyl group and a cyclooctyl group. The alkyl group preferably has 1 to 18 carbon atoms, and more preferably is a methyl group or an ethyl group.

Examples of the aralkyl group include a benzyl group, a phenethyl group, a naphthylmethyl group and a biphenylmethyl group. The aralkyl group preferably has 7 to 20 carbon atoms, more preferably 7 to 14.

Examples of the aryl group include a phenyl group, a biphenyl group, a naphthyl group, a tolyl group and a xylyl group. The aryl group preferably has 6 to 24 carbon atoms, more preferably 6 to 12. The above-mentioned preferred numbers of carbon atoms do not include the number of carbon atoms of substituent groups.

The hydrocarbon group containing a hetero atom has a structure in which the carbon atom in the hydrocarbon group has been substituted by a hetero atom. Examples of the hetero atom that can be contained in the hydrocarbon group include an oxygen atom, a nitrogen atom, a sulfur atom and a silicon atom.

The hydrogen atom in the hydrocarbon group can be substituted by an alkyl group having 1 to 5 carbon atoms or a halogen atom such as a fluorine atom, a chlorine atom or a bromine atom.

When Q is a nitrogen-containing heterocyclic group which is able to form a salt with an acid and which can have a substituent group, examples thereof include 5-7 membered, nitrogen-containing mono-heterocyclic rings and condensed rings thereof. The nitrogen-containing heterocyclic group can further have a different hetero atom, or it can have a substituent group. The nitrogen-containing heterocyclic group can also have aromaticity.

Concrete examples of nitrogen-containing heterocyclic ring compounds that are able to form the nitrogen-containing heterocyclic group include pyridine, piperidine, piperazine, morpholine, pyrrolidine, pyrrole, pyrroline, indole, carbazole, imidazole, pyrazole, triazole, tetrazole and benzimidazole. Preferred are nitrogen-containing, heterocyclic ring compounds that contain only a nitrogen atom as the heteroatom, such as pyridine, piperidine, piperazine and imidazole. More preferred are nitrogen-containing heterocyclic groups having aromaticity, such as pyridine and imidazole.

Examples of the substituent group that can be incorporated in the nitrogen-containing heterocyclic group include a straight-chain, branched-chain or cyclic alkyl group having 1 to 12 carbon atoms, an aralkyl group, an aryl group and halogen atoms such as F, Cl and Br. These examples can be combined for use. The substitution position and number of the substituent groups are not particularly limited.

In the present invention, from the viewpoint of increasing the heat resistance of the color layers thus obtained, it is preferable that the constitutional unit represented by the general formula (I) contains a constitutional unit having the nitrogen-containing heterocyclic group.

Examples of the constitutional units represented by the general formula (I) include, but not limited to, constitutional units derived from the following: nitrogen-containing (meth)acrylates such as dimethylaminoethyl (meth)acrylate, dimethylaminopropyl (meth)acrylate, diethylaminoethyl (meth)acrylate, diethylaminopropyl (meth)acrylate, pentamethylpiperidyl (meth)acrylate; nitrogen-containing vinyl monomers such as vinylcarbazole, vinylimidazole and vinylpyridine; and acrylamide-based monomers such as dimethylaminopropylacrylamide.

The constitutional units represented by the general formula (I) can be one kind of constitutional units or two or more kinds of constitutional units.

In the present invention, the polymer used as the non-aqueous dispersant, i.e., the polymer comprising at least one constitutional unit represented by the general formula (I), wherein at least part of nitrogen sites of the constitutional units each form a salt with the acidic organophosphorous compound, is preferably a block copolymer specified below or a graft copolymer specified below, from the viewpoint of being excellent in dispersibility and dispersion stability and being able to form a resin layer with excellent hydrolysis resistant.

Hereinafter, the preferred specific block copolymer and the preferred specific graft copolymer will be described in order.

<Block Copolymer>

In the present invention, from the viewpoint of being excellent in dispersibility and dispersion stability and being able to form a resin layer with excellent hydrolysis resistance, the polymer used as the non-aqueous dispersant is preferably a block copolymer having a block portion comprising at least one constitutional unit represented by the general formula (I) and a block portion comprising at least one constitutional unit represented by the following general formula (II), wherein at least part of nitrogen sites of the constitutional units represented by the general formula (I) each form a salt with the acidic organophosphorous compound:

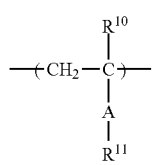
(II)

wherein A is a direct bond or a divalent linking group; $R^{10}$ is a hydrogen atom or a methyl group; $R^{11}$ is a hydrocarbon group or a monovalent group described by $—[CH(R^{12})—CH(R^{13})—O]_x—R^{14}$ or $—[(CH_2)_y—O]_z—R^{14}$; $R^{12}$ and $R^{13}$ each independently represent a hydrogen atom or a methyl group; $R^{14}$ is a hydrogen atom, a hydrocarbon group or a monovalent group described by $—CHO$, $—CH_2CHO$, or $—CH_2COOR^{15}$; $R^{15}$ is a hydrogen atom or an alkyl group having 1 to 5 carbon atoms; the hydrocarbon group can have a substituent group; x is an integer of 1 to 18; y is an integer of 1 to 5; and z is an integer of 1 to 18.

(Block Portion Comprising the Constitutional Units Represented by the General Formula (I))

The block copolymer has a block portion comprising at least one constitutional unit represented by the general formula (I). The constitutional unit represented by the general formula (I) is the same as described above and is not described here.

The number of the constitutional units represented by the general formula (I) contained in the block portion is preferably three or more. From the viewpoint of obtaining good dispersibility and increasing heat resistance, the number of the constitutional units contained in the block portion is preferably 3 to 200, more preferably 3 to 50, still more preferably 3 to 30.

The constitutional units represented by the general formula (I) are needed to function as a site with an affinity for the color material. The constitutional units contained in the block portion can be one kind of constitutional units or two or more kinds of constitutional units.

In the block copolymer comprising the constitutional units represented by the general formula (I), the content ratio of the constitutional units represented by the general formula (I) is preferably 5 to 60% by mass, more preferably 10 to 40% by mass, when the whole block copolymer comprising the constitutional units represented by the general formula (I) is 100% by mass.

The content ratio of the constitutional units is calculated from the amount of the constitutional units used to synthesize the block copolymer comprising the constitutional units represented by the general formula (I).

(Block Portion Comprising the Constitutional Units Represented by the General Formula (II))

The block copolymer has a block portion comprising at least one constitutional unit represented by the general formula (II). Due to having the block portion, good solvent affinity, good color material dispersibility and dispersion stability and good heat resistance are obtained.

In the general formula (II), A can be the same as described above for the general formula (I). From the viewpoint of compatibility with a binder component in a color resin composition formed, A is preferably a structure represented by the following general formula (II-1):

(II-1)

wherein $R^{10}$ and $R^{11}$ are the same as those of the general formula (II).

In the general formulae (II) and (II-1), $R^{11}$ is a hydrocarbon group, $-[CH(R^{12})-CH(R^{13})-O]_x-R^{14}$ or $-[(CH_2)_y-O]_z-R^{14}$.

When $R^{11}$ is a hydrocarbon group, it is preferably an alkyl group having 1 to 18 carbon atoms, an alkenyl group having 2 to 18 carbon atoms, an aralkyl group or an aryl group.

The alkyl group having 1 to 18 carbon atoms can be any one of straight-chain, branched-chain and cyclic alkyl groups having 1 to 18 carbon atoms. Examples thereof include a methyl group, an ethyl group an n-propyl group, an isopropyl group, an n-butyl group, a cyclopentyl group, a cyclohexyl group, a bornyl group, an isobornyl group, a dicyclopentanyl group, an adamantyl group and a lower alkyl group-substituted adamantyl group.

The alkenyl group having 2 to 18 carbon atoms can be any one of straight-chain, branched-chain and cyclic alkenyl groups having 2 to 18 carbon atoms. Examples of such an alkenyl group include a vinyl group, an allyl group and a propenyl group. The position of the double bond of the alkenyl group is not particularly limited. From the viewpoint of reactivity of the polymer thus obtained, it is preferable that a double bond is present at the terminal of the alkenyl group.

Examples of the aryl group include a phenyl group, a biphenyl group, a naphthyl group, a tolyl group and a xylyl group. The aryl group can further have a substituent group. The aryl group preferably has 6 to 24 carbon atoms, more preferably 6 to 12 carbon atoms.

Examples of the aralkyl group include a benzyl group, a phenethyl group, a naphthylmethyl group and a biphenylmethyl group. The aralkyl group can further have a substituent group. The aralkyl group preferably has 7 to 20 carbon atoms, more preferably 7 to 14 carbon atoms.

When the aromatic ring such as an aryl group or aralkyl group has a substituent group, examples of the substituent group include a straight- or branched-chain alkyl group having 1 to 4 carbon atoms, an alkenyl group, a nitro group and a halogen atom.

The above-mentioned preferred numbers of carbon atoms do not include the number of carbon atoms of substituent groups.

$R^{14}$ is a hydrogen atom, a hydrocarbon group or a monovalent group described by $-CHO$, $-CH_2CHO$, or $-CH_2COOR^{15}$. $R^{15}$ is a hydrogen atom or a straight-chain, branched-chain or cyclic alkyl group having 1 to 5 carbon atoms.

When $R^{14}$ is a hydrocarbon group, it can be the same as described above for $R^{11}$.

In $R^{11}$, x, y and z are the same as described above for $R^2$.

Also, $R^{11}$s in the constitutional units represented by the general formulae (II) and (II-1) can be the same as or different from each other.

As $R^{11}$, it is preferable to use a group with excellent solubility in a solvent described below. When the solvent is an ether alcohol acetate-based, ether-based or ester-based solvent that is generally used as a solvent for color resin compositions, concrete examples of the group include a methyl group, an ethyl group, an n-butyl group, a 2-ethylhexyl group, a 2-ethoxyethyl group and a benzyl group.

Also, within a scope which does not impair the dispersion performance and so on of the block copolymer, $R^{11}$ can be one substituted by a substituent group such as an alkoxy group, a hydroxyl group, a carboxyl group, an amino group, an epoxy group, an isocyanate group or a hydrogen bond-forming group. Also, after the synthesis of the block copolymer, the substituent group can be added thereto by reaction with a compound having the substituent group. Also, after the synthesis of the block copolymer having such a substituent group, $R^{11}$ can be reacted with a compound having a functional group that is reactive with the substituent group and a polymerizable group so as to add the polymerizable group thereto. For example, a polymerizable group can be added by reaction of a block copolymer having a carboxyl group with glycidyl (meth)acrylate, or by reaction with a block copolymer having an isocyanate group with hydroxyethyl (meth)acrylate.

The number of the constitutional units constituting the block portion comprising the constitutional units represented by the general formula (II) is not particularly limited. From the viewpoint of allowing the site with an affinity for solvent and the site with an affinity for the color material to work effectively and increasing the dispersibility of the color material dispersion liquid, it is preferably 10 to 200, more preferably 10 to 100, still more preferably 10 to 70.

In the block copolymer, the content ratio of the constitutional units represented by the general formula (II) accounts for preferably 40 to 95% by mass, more preferably 60 to 90% by mass of the whole block copolymer.

The content ratio of the constitutional units is calculated from the amount of the constitutional units used to synthesize the block portion comprising the constitutional units represented by the general formula (II).

The block portion comprising the constitutional unit represented by the general formula (II) is needed to be selected so as to function as a site with affinity for solvent. The constitutional units represented by the general formula (II) can be one kind of constitutional units or two or more kinds of constitutional units. In the present invention, the constitutional unit having a tertiary amine is needed to be contained as the block portion, and when the constitutional units represented by the general formula (II) contain two or more kinds of constitutional units, the two or more kinds of constitutional units can be randomly arranged inside the block portion.

In the block copolymer serving as the dispersant, from the viewpoint of color material dispersibility and dispersion stability, the ratio m/n is preferably in a range of 0.01 to 1, more preferably in a range of 0.05 to 0.7, in which "m" is the unit number of the constitutional units constituting the block portion comprising the constitutional units represented by the general formula (I), and "n" is the unit number of the constitutional units constituting the block portion comprising the constitutional units represented by the general formula (II).

The binding order of the block portions in the block copolymer is not particularly limited, as long as the block portion comprising the constitutional unit represented by the general formula (I) and the block portion comprising the constitutional unit represented by the general formula (II) are contained therein and the color material can be stably dispersed. From the viewpoint of excellent interaction with the color material and effectively preventing the dispersant from aggregation, it is preferable that the block portion comprising the constitutional unit represented by the general formula (I) is bound to only one terminal of the block copolymer.

The mass average molecular weight of the block copolymer is not particularly limited. From the viewpoint of being good in dispersibility and excellent in heat resistance, it is preferably 2,500 to 20,000, more preferably 3,000 to 12,000, still more preferably 5,000 to 10,000.

The mass average molecular weight Mw is a value measured by gel permeation chromatography (GPC). The measurement was carried out with HLC-8120GPC manufactured by Tosoh Corporation, using the following:

Elution solvent: N-methylpyrrolidone mixed with 0.01 mol/L lithium bromide

Polystyrene standards for the calibration curve: Mw377400, 210500, 96000, 50400, 20650, 10850, 5460, 2930, 1300, 580 (Easi PS-2 Series manufactured by Polymer Laboratories Ltd.) and Mw1090000 (manufactured by Tosoh Corporation)

Measurement columns: TSK-GEL ALPHA-M (manufactured by Tosoh Corporation, the number of columns used: 2)

<Graft Copolymer>

In the non-aqueous dispersant of the present invention, from the viewpoint of being excellent in dispersibility and dispersion stability and being able to form a resin layer with excellent hydrolysis resistance, it is preferable that the polymer is a graft copolymer in which at least one nitrogen-containing monomer represented by the following general formula (I') and a polymerizable oligomer comprising a polymer chain having at least one of constitutional units represented by the following general formulae (III) and (IV) and a group having an ethylenically unsaturated double bond at a terminal of the chain, are contained as copolymerizable components, and in which at least part of nitrogen sites of the nitrogen-containing monomers represented by the following general formula (I') each form a salt with the acidic organophosphorous compound:

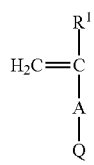

(I')

wherein $R^1$ is a hydrogen atom or methyl group; A is a direct bond or divalent linking group; and Q is a group represented by the following general formula (I-a) or a nitrogen-containing heterocyclic group which is able to form a salt with an acid and which can have a substituent group;

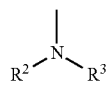

(I-a)

wherein $R^2$ and $R^3$ each independently represent a hydrogen atom or a hydrocarbon group which can contain a hetero atom, and $R^2$ and $R^3$ can be the same as or different from each other;

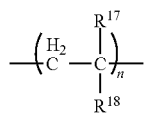

(III)

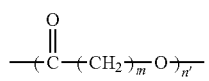

(IV)

wherein $R^{17}$ is a hydrogen atom or a methyl group; $R^{18}$ is a hydrocarbon group, a cyano group or a monovalent group described by $-[CH(R^{19})-CH(R^{20})-O]_x-R^{21}$, $-[(CH_2)_y-O]_z-R^{21}$, $-[CO-(CH_2)_y-O]_z-R^{21}$, $-CO-O-R^{22}$ or $-O-CO-R^{23}$; $R^{19}$ and $R^{20}$ each independently represent a hydrogen atom or a methyl group; $R^{21}$ is a hydrogen atom, a hydrocarbon group or a monovalent group described by a $-CHO$, $-CH_2CHO$ or $-CH_2COOR^{24}$; $R^{22}$ is a hydrocarbon group, a cyano group or a monovalent group described by $-[CH(R^{19})-CH(R^{20})-O]_x-R^{21}$, $-[(CH_2)_y-O]_z-R^{21}$ or $-[CO-(CH_2)_y-O]_z-R^{21}$; $R^{23}$ is an alkyl group having 1 to 18 carbon atoms; $R^{24}$ is a hydrogen atom or an alkyl group having 1 to 5 carbon atoms; the hydrocarbon groups can have a substituent group each; m is an integer of 1 to 5; n and n' are each an integer of 5 to 200; x is an integer of 1 to 18; y is an integer of 1 to 5; and z is an integer of 1 to 18.

In the graft copolymer, the nitrogen-containing monomer represented by the general formula (I'), which is contained as a copolymerizable component in the graft copolymer serving as the dispersant, serves as the constitutional unit represented by the general formula (I) and becomes a salt-forming site formed between the nitrogen site and the below-mentioned acidic organophosphorous compound. The salt-forming site functions to increase the adsorption ability of the dispersant to the color material and to provide particularly excellent color material dispersibility and stability. Meanwhile, grafted branched polymer chains have high solubility in solvent and increases color material dispersion stability.

(Nitrogen-Containing Monomer Represented by the General Formula (I'))

In the graft copolymer, the nitrogen-containing monomer represented by the general formula (I') is used, from the viewpoint of being excellent in dispersibility and dispersion stability and being able to form a resin layer with excellent hydrolysis resistance.

The divalent linking group A of the general formula (I') can be the same as described above for A in the general formula (I). Among them, the divalent linking group A is preferably a double bond or a divalent linking group containing a $-CONH-$ group or $-COO-$ group.

Also, Q in the general formula (I') can be the same as described above for Q in the general formula (I). The general formula (I-a) and the nitrogen-containing heterocyclic group which is able to form a salt with an acid and which can have a substituent group can also be the same as described above for the general formula (I).

Examples of the monomer represented by the formula (I') include, but not limited to, the following: nitrogen-containing (meth)acrylates such as dimethylaminoethyl (meth)acrylate, dimethylaminopropyl (meth)acrylate, diethylaminoethyl (meth)acrylate, diethylaminopropyl (meth)acrylate and pentamethylpiperidyl (meth)acrylate; nitrogen-containing vinyl monomers such as vinylcarbazole, vinylimidazole and vinylpyridine; nitrogen-containing acrylamide-based monomers such as dimethylaminopropylacrylamide.

As the nitrogen-containing monomer represented by the general formula (I'), one kind of nitrogen-containing monomer can be used alone or two or more kinds of nitrogen-containing monomers can be used in combination.

(Polymerizable Oligomer Comprising a Polymer Chain Having at Least One of Constitutional Units Represented by the General Formulae (III) and (IV) and a Group Having an Ethylenically Unsaturated Double Bond at a Terminal of the Chain)

The graft copolymer contains, as a copolymerizable component, the polymerizable oligomer comprising a polymer chain having at least one of constitutional units represented by the general formulae (III) and (IV) and a group having an ethylenically unsaturated double bond at a terminal of the chain (hereinafter may be referred to as "polymerizable oligomer"). Because the polymerizable oligomer has a polymer chain having at least one of constitutional units represented by the general formulae (III) and (IV), good solvent affinity is obtained and good color material dispersibility and dispersion stability are obtained.

In the graft copolymer, the ethylenically unsaturated double bond serves as a linking section to other polymerizable oligomer or to the monomer.

As an indication, it is preferable that the polymerizable oligomer comprising a polymer chain and a group having an ethylenically unsaturated double bond at a terminal of the chain, has a solubility of 50 (g/100 g solvent) or more in the solvent used in combination at 23° C.

In the polymerizable oligomer, it is preferable that the group having an ethylenically unsaturated double bond is present only at a terminal of the polymer chain (hereinafter may be referred to as "single terminal"). The polymerizable oligomer can be substituted by a substituent group, such as a halogen atom, within a scope which does not impair the dispersion performance and so on of the graft copolymer.

Preferred examples of the group having an ethylenically unsaturated double bond include a (meth)acryloyl group, a vinyl group and an allyl group. Of them, a (meth)acryloyl group and a vinyl group are more preferred, and a (meth)acryloyl group is particularly preferred.

The hydrocarbon group mentioned as $R^{18}$, $R^{21}$ and $R^{22}$ in the general formulae (III) and (IV) can be the same as the hydrocarbon group described above for $R^{11}$.

The alkyl group having 1 to 18 carbon atoms mentioned as $R^{23}$ can be a straight-chain, branched-chain or cyclic alkyl group having 1 to 18 carbon atoms. Examples thereof include a methyl group, an ethyl group, an n-propyl group, an isopropyl group, an n-butyl group, a cyclopentyl group, a cyclohexyl group, an isobornyl group, a dicyclopentanyl group, an adamantyl group and a lower alkyl group-substituted adamantyl group.

When the solvent is a low-polar solvent such as propylene glycol monomethyl ether acetate, it is preferable that $R^{18}$, $R^{21}$, $R^{22}$ and $R^{23}$ are each a methyl group, an ethyl group, various kinds of propyl groups, various kinds of butyl groups, various kinds of hexyl groups, a benzyl group, etc., from the viewpoint of obtaining particularly excellent color material dispersibility and stability.

When $R^{18}$, $R^{21}$, $R^{22}$ and $R^{23}$ are each a group having an aromatic ring, the aromatic ring can further have a substituent group. Examples of the substituent group include a straight-chain, branched-chain or cyclic alkyl group having 1 to 5 carbon atoms and halogen atoms such as F, Cl and Br.

Also, within a scope which does not impair the dispersion performance and so on of the graft copolymer, $R^{18}$, $R^{21}$, $R^{22}$ and $R^{23}$ can be one substituted by a substituent group such as an alkoxy group, a hydroxyl group, a carboxyl group, an amino group, an epoxy group, an isocyanate group or a hydrogen bond-forming group. Also, after the synthesis of the graft copolymer having such a substituent group, polymerizabie groups can be added to the graft copolymer by reacting the copolymer with a compound having a functional group that is reactive with the above-mentioned substituent group and a polymerizable group. For example, a polymerizable group can be added by reaction of a graft copolymer having a carboxyl group with a glycidyl (meth)acrylate, or by reaction of a block copolymer having an isocyanate group with hydroxyethyl (meth)acrylate.

Considering the points mentioned above, it is preferable that among the above-mentioned constitutional units, the polymer chain of the polymerizable oligomer has a constitutional unit(s) derived from methyl (meth)acrylate, ethyl (meth)acrylate, isopropyl (meth)acrylate, n-butyl (meth) acrylate, isobutyl (meth)acrylate, tert-butyl (meth)acrylate, 2-ethoxyethyl (meth)acrylate, cyclohexyl (meth)acrylate, benzyl (meth)acrylate, phenyl (meth)acrylate, isobornyl (meth)acrylate, dicyclopentanyl (meth)acrylate, adamantyl (meth)acrylate, styrene, α-methylstyrene, vinylcyclohexane, etc. It is more preferable that the polymer chain has at least one constitutional unit derived from methyl methacrylate, benzyl (meth)acrylate, phenyl (meth)acrylate, cyclohexyl (meth)acrylate and isobornyl (meth)acrylate. However, the constitutional unit(s) is not limited to them.

In the general formula (III) or (IV), m is an integer of 1 to 5, preferably an integer of 2 to 5, more preferably an integer of 4 or 5. The unit numbers n and n' of the constitutional units of the polymer chain of the polymerizable oligomer, are needed to be an integer of 5 to 200, and they are preferably, but not limited to, in a range of 5 to 100.

The mass average molecular weight Mw of the polymerizable oligomer is preferably in a range of 500 to 20,000, more preferably in a range of 1,000 to 10,000. When the mass average molecular weight is in the range, the dispersant can maintain sufficient steric repulsion and prevent an increase in the time required for dispersion of the color material by steric effects.

The polymer chain of the polymerizable oligomer can be a homopolymer or copolymer. As the polymerizable oligomer, only one kind of polymerizable oligomer can be used alone, or two or more kinds of polymerizable oligomers can be used in combination.

Such a polymerizable oligomer can be one synthesized appropriately or a commercially-available product. Examples of the commercially-available product include a single terminal methacryloylated polymethylmethacrylate oligomer (mass average molecular weight 6000, "AA-6" (product name) manufactured by TOAGOSEI Co., Ltd.), a single terminal methacryloylated poly-n-butyl acrylate oligomer (mass average molecular weight 6000, "AB-6" (product name) manufactured by TOAGOSEI Co., Ltd.), a single terminal methacryloylated polystyrene oligomer (mass average molecular weight 6000, "AS-6" (product name) manufactured by TOAGOSEI Co., Ltd.), a caprolactone-modified hydroxyethyl methacrylate ("PLACCEL FM5" (product name) manufacture by DAICEL Chemical Industries, Ltd.) and a caprolactone-modified hydroxyethyl acrylate ("PLACCEL FA10L" (product name) manufactured by DAICEL Chemical Industries, Ltd.)

Well-known methods for synthesizing such a polymerizable oligomer include a living polymerization method and a radical polymerization method using a chain transfer agent. The radical polymerization method is easier to use since it provides a wider range of monomer choice. For example, by radical polymerization of a monomer in the presence of a chain transfer agent having a carboxyl group, such as mercaptopropionic acid, an oligomer having a carboxyl group at the single terminal is obtained. By adding glycidyl methacrylate to this oligomer, an oligomer having a methacryloyl group at the single terminal, i.e., polymerizable oligomer, is obtained.

In the graft copolymer, the constitutional units derived from the nitrogen-containing monomers represented by the general formula (I') preferably account for 3 to 80% by mass, more preferably 5 to 50% by mass, still more preferably 10 to 40% by mass of the graft copolymer. When the content of the constitutional units derived from the nitrogen-containing monomers in the graft copolymer is in the range, the ratio of the salt-forming sites in the graft copolymer becomes an appropriate ratio, and a decrease in solubility in solvent due to the polymerizable oligomer can be inhibited.

Therefore, good adsorption to the color material and excellent dispersion and dispersion stability are obtained.

The weight average molecular weight Mw of the graft copolymer is preferably in a range of 1,000 to 100,000, more preferably in a range of 3,000 to 50,000, still more preferably 5,000 to 30,000. When the weight average molecular weight is in the range, the color material can be homogeneously dispersed.

The weight average molecular weight Mw is a value measured by gel permeation chromatography (GPC). The measurement was carried out with HLC-8120GPC manufactured by Tosoh Corporation, using the following:

Elution solvent: N-methylpyrrolidone mixed with 0.01 mol/L lithium bromide

Polystyrene standards for the calibration curve: Mw377400, 210500, 96000, 50400, 20650, 10850, 5460, 2930, 1300, 580 (Easi PS-2 Series manufactured by Polymer Laboratories Ltd.) and Mw1090000 (manufactured by Tosoh Corporation)

Measurement column: TSK-GEL ALPHA-M (manufactured by Tosoh Corporation, the number of columns used: 2)

<Acidic Organophosphorous Compound>

The acidic organophosphorous compound used in the non-aqueous dispersant of the present invention is an acidic organophosphorous compound comprising one or more selected from the group consisting of organic phosphonic acid monoester compounds resulting from addition of a monofunctional epoxy compound or monofunctional oxetane compound to an organic phosphonic acid.

In the present invention, by use of the above-specified acidic organophosphorous compound, the non-aqueous dispersant is excellent in dispersibility and stability and able to form a resin layer with excellent hydrolysis resistance. Moreover, by preventing active oxygen generation even upon heating, the heat resistance of a color material with low heat resistance, such as a lake pigment, is increased.

An organic phosphonic acid is a group of compounds represented by the general formula R—P(=O) (OH)$_2$ (wherein R is an organic group in which the atom bound to P is a carbon atom, and the organic group is a general term for a functional group that contains at least one carbon atom).

As the organic phosphonic acid, a compound having one phosphonic acid group (—P(=O) (OH)$_2$) per molecule is preferably used in the present invention, from the viewpoint of stability with the copolymer.

It is preferable that the organic phosphonic acid used in the present invention is an organic phosphonic acid represented by the following general formula (VII), from the viewpoint of increasing the above-mentioned dispersibility and dispersion stability and the above-mentioned hydrolysis resistance:

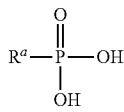

(VII)

wherein $R^a$ is a hydrocarbon group or a monovalent group described by —[CH($R^h$)—CH($R^i$)—O]$_s$—$R^j$ or —[(CH$_2$)$_t$—O]$_u$—$R^j$; $R^h$ and $R^i$ each independently represent a hydrogen atom or a methyl group; $R^j$ is a hydrogen atom, a hydrocarbon group or a monovalent group described by —CHO, —CH$_2$CHO, —CO—CH=CH$_2$, —CO—C(CH$_3$)=CH$_2$ or —CH$_2$COOR$^k$; $R^k$ is a hydrogen atom or an alkyl group having 1 to 5 carbon atoms; the hydrocarbon groups can have a substituent group each; s is an integer of 1 to 18; t is an integer of 1 to 5; and u is an integer of 1 to 18.

When $R^a$ and $R^j$ are each a hydrocarbon group, examples thereof include an alkyl group having 1 to 18 carbon atoms, an alkenyl group having 2 to 18 carbon atoms, an aralkyl group and an aryl group. The alkyl group having 1 to 18 carbon atoms, the alkenyl group having 2 to 18 carbon atoms, the aralkyl group and the aryl group can be the same as those described above for $R^{11}$ in the general formula (II).

The monofunctional epoxy compound means a compound having one epoxy group per molecule. The monofunctional oxetane compound means a compound having one oxetanyl group per molecule.

Examples of the monofunctional epoxy compound used in the present invention include, but not limited to, glycidyl (meth)acrylate, methyl glycidyl ether, ethyl glycidyl ether, propyl glycidyl ether, isopropyl glycidyl ether, butyl glycidyl ether, isobutyl glycidyl ether, t-butyl glycidyl ether, 2-ethylhexyl glycidyl ether, allyl glycidyl ether, propargyl glycidyl ether, p-methoxyethyl glycidyl ether, phenyl glycidyl ether, p-butylphenol glycidyl ether, cresyl glycidyl ether, 2-methylcresyl glycidyl ether, 4-nonylphenyl glycidyl ether, benzyl glycidyl ether, 4-vinylbenzyl glycidyl ether, p-cumylphenyl glycidyl ether, trityl glycidyl ether, 1,2-epoxy-4-vinylcyclohexane, styrene oxide, methylstyrene oxide, cyclohexene oxide, 3,4-epoxycyclohexyl methyl (meth)acrylate, 3,4-epoxycyclohexyl ethyl(meth)acrylate, and 3,4-epoxycyclohexyl propyl(meth)acrylate.

Examples of the monofunctional oxetane compound include, but not limited to, 3-ethyl-3-(2-ethylhexyloxymethyl)oxetane, 3-ethyl-3-(cyclohexyloxymethyl)oxetane, 3-ethyl-3-(phenoxymethyl)oxetane, 3-ethyl-3-hydroxymethyloxetane and 3-methyl-3-oxetanylmethyl (meth)acrylate.

As the monofunctional epoxy compound or the monofunctional oxetane compound, one kind of compound can be used alone, or two or more kinds of compounds can be used in combination.

The reaction scheme of the addition of the monofunctional epoxy compound or the monofunctional oxetane compound to the organic phosphonic acid is represented by the following scheme 1 or 2. When the organic phosphonic acid represented by the general formula (VII) is reacted with the below-specified monofunctional epoxy compound or monofunctional oxetane compound, an organic phosphonic acid monoester compound represented by the following general formula (V) or (VI) is obtained. In the present invention, it is preferable to use the organic phosphonic acid monoester compound represented by the following general formula (V) or (VI), from the point of view that the non-aqueous dispersant obtained in the present invention is excellent in dispersibility and dispersion stability and is able to form a resin layer with excellent hydrolysis resistance, and the heat resistance of a color material with low heat resistance is increased:

Scheme 1

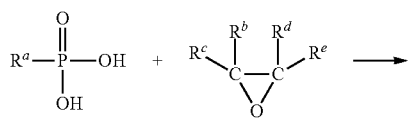

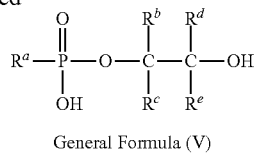

General Formula (V)

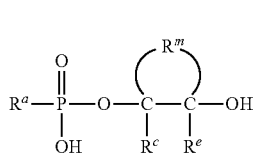

(V-1)

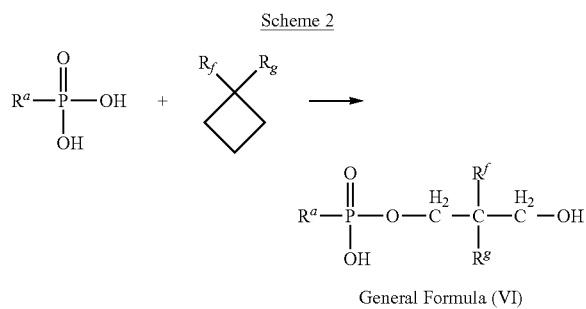

General Formula (VI)

wherein $R^a$ is a hydrocarbon group or a monovalent group described by $-[CH(R^h)-CH(R^i)-O]_s-R^j$ or $-[(CH_2)_t-O]_u-R^j$; $R^h$ and $R^i$ each independently represent a hydrogen atom or a methyl group; $R^j$ is a hydrogen atom, a hydrocarbon group or a monovalent group described by $-CHO$, $-CH_2CHO$, $-CO-CH=CH_2$, $-CO-C(CH_3)=CH_2$ or $-CH_2COOR^k$; $R^k$ is a hydrogen atom or an alkyl group having 1 to 5 carbon atoms; $R^b$, $R^c$, $R^d$, $R^e$, $R^f$ and $R^g$ each independently represent a hydrogen atom, a hydrocarbon group or a group in which hydrocarbon groups are bound by at least one of an ether bond and an ester bond; $R^b$ and $R^d$ can be bound to form a cyclic structure; the cyclic structure can have a substituent group $R^L$; $R^L$ is a hydrogen atom, a hydrocarbon group or a group in which hydrocarbon groups are bound by at least one of an ether bond and an ester bond; the hydrocarbon groups can have a substituent group each; s is an integer of 1 to 18; t is an integer of 1 to 5; and u is an integer of 1 to 18.

When $R^a$, $R^b$, $R^c$, $R^d$, $R^e$, $R^f$, $R^g$, $R^j$ and $R^l$ are each a hydrocarbon group, examples thereof include an alkyl group having 1 to 18 carbon atoms, an alkenyl group having 2 to 18 carbon atoms, an aralkyl group and aryl group. The alkyl group having 1 to 18 carbon atoms, the alkenyl group having 2 to 18 carbon atoms, the aralkyl group and the aryl group can be the same as those described above for $R^{11}$ in the general formula (II).

When $R^b$, $R^c$, $R^d$, $R^e$, $R^f$ and $R^g$ are each a group in which hydrocarbon groups are bound by at least one of an ether bond and an ester bond, the group is a group described by $-R'-O-R''$, $-R'-(C=O)-O-R''$ or $-R'-O-(C=O)-R''$ (wherein R' and R'' are each a hydrocarbon group or a group in which hydrocarbon groups are bound by at least one of an ether bond and an ester bond). Two or more ether bonds or ester bonds can be contained per group. When the hydrocarbon group is a monovalent hydrocarbon group, examples thereof include an alkyl group, an alkenyl group, an aralkyl group and an aryl group. When the hydrocarbon group is a divalent hydrocarbon group, examples thereof include an alkylene group, an alkenylene group, an arylene group and combinations thereof.

In specific, the general formula (V) in which $R^b$ and $R^d$ are bound to form a cyclic structure is represented by the following general formula (V-1):

wherein $R^a$, $R^c$ and $R^e$ are the same as those described above for the general formula (V), and $R^m$ is a group in which $R^b$ and $R^d$ are bound and can further have the substituent group $R^l$.

When $R^b$ and $R^d$ are bound to form a cyclic structure, the number of carbon atoms forming the cyclic structure is preferably 5 to 8, more preferably 6. That is, a 6-membered ring is preferable.

The hydrocarbon group and the group in which hydrocarbon groups are bound by at least one of an ether bond and an ester bond mentioned as the substituent $R^l$ can be the same as those described above for $R^b$, $R^c$, $R^d$, $R^e$, $R^f$ and $R^g$.

In the case of using the color material dispersion liquid for a negative-type resist composition, at the time of exposure that is carried out upon forming color layers using the negative-type resist composition, the polymerizable groups can be readily polymerized with each other, and/or the polymerizable groups can be readily polymerized with an alkali-soluble resin, polyfunctional monomer or the like that is contained in the negative-type resist composition. Moreover, the non-aqueous dispersant is allowed to be stably present in the color layers of a color filter. Therefore, when a liquid crystal display device is produced by use of such a color filter, the bleed out of the non-aqueous dispersant to the liquid crystal layer, etc., can be prevented.

When the acidic organophosphorous compound contains the polymerizable groups, the polymerizable groups of the acidic organophosphorous compound can be polymerized in the vicinity of the color material, after the color material is dispersed. As a result, the non-aqueous dispersant is fixed around the color material and color material dispersibility and dispersion stability can be increased.

In the case of using the non-aqueous dispersant of the present invention in a negative-type resist composition, it is preferable that the acidic organophosphorous compound is a compound having an aryl group, from the viewpoint of being able to form a color filter with excellent hydrolysis resistance.

The acidic organophosphorous compound used in the present invention preferably has a molecular weight of 100 to 1,000, more preferably 250 to 500.

"Molecular weight" as used herein means the molecular weight of a compound when the acidic organophosphorous compound has no repeating unit. When the acidic organophosphorous compound has a repeating unit, it means the mass average molecular weight of a compound.

The acidic organophosphorous compound used in the present invention can be one kind of acidic organophosphorous compound or a mixture of two more kinds of acidic organophosphorous compounds.

The acidic organophosphorous compound used in the non-aqueous dispersant of the present invention can contain an acidic organophosphorous compound other than one or more kinds of organic phosphonic acid monoester compounds selected from the group consisting of the organic phosphonic acid monoester compounds resulting from addition of a monofunctional epoxy compound or monofunctional oxetane compound to an organic phosphonic acid.

Examples of such an acidic organophosphorous compound include an organic phosphonic acid which can be incorporated upon the synthesis of the organic phosphonic acid monoester compound, or an organic phosphonic acid diester formed by esterification of two acidic groups of an organic phosphonic acid.

In the acidic organophosphorous compound contained in the non-aqueous dispersant of the present invention, the total amount of one or more kinds of organic phosphonic acid monoester compounds selected from the group consisting of organic phosphonic acid monoester compounds resulting from addition of a monofunctional epoxy compound or monofunctional oxetane compound to an organic phosphonic acid, is preferably 20% by mass or more, more preferably 40% by mass or more of the acidic organophosphorous compound in the non-aqueous dispersant, from the viewpoint of being excellent in dispersibility and dispersion stability and forming a resin layer with excellent hydrolysis resistance.

The total amount of one or more kinds of organic phosphonic acid monoester compounds selected from the group consisting of organic phosphonic acid monoester compounds resulting from addition of a monofunctional epoxy compound or monofunctional oxetane compound to an organic phosphonic acid in the acidic organophosphorous compound contained in the non-aqueous dispersant, can be confirmed by the $^{31}$P-NMR measurement.

The content of the acidic organophosphorous compound in the non-aqueous dispersant of the present invention is not particularly limited, as long as excellent dispersibility and dispersion stability are exerted. The content is generally about 0.05 to 4.0 molar equivalent, preferably 0.1 to 2.0 molar equivalent, more preferably 0.3 to 1.0 molar equivalent, with respect to the nitrogen site contained in the constitutional unit represented by the general formula (I).

Particularly in the case where the non-aqueous dispersant of the present invention is used in combination with a color material with low heat resistance, such as a lake pigment, the content of the acidic organophosphorous compound in the non-aqueous dispersant is generally 0.8 to 4.0 molar equivalent, preferably 1.0 to 3.0 molar equivalent, with respect to the nitrogen site contained in the constitutional unit represented by the general formula (I), from the viewpoint of increasing the heat resistance of color layers to be obtained.

<Production of the Non-Aqueous Dispersant>

The method for producing a salt-type polymer that is used in the non-aqueous dispersant of the present invention is not particularly limited, as long as it is a method that is able to produce the polymer comprising at least one constitutional unit represented by the general formula (I), wherein at least part of nitrogen sites of the constitutional units each form a salt with the acidic organophosphorous compound. In the present invention, for example, the salt-type polymer can be produced by polymerizing the monomer constituting the constitutional unit represented by the general formula (I) and, as needed, other monomer(s) by a known polymerization technique, dissolving or dispersing the resultant in the below-described solvent, adding the acidic organophosphorous compound to the solvent, and then agitating the resultant.

The technique for polymerizing a salt-type copolymer for example is not particularly limited, as long as it is a technique that can polymerize a copolymer so as to obtain the constitutional units represented by the general formula (I) and other constitutional units at a desired unit ratio and obtain a desired molecular weight. There may be used methods that are generally used for polymerization of compounds having a vinyl group, such as anion polymerization and living radical polymerization. In the present invention, it is particularly preferable to use a method in which, like the group transfer polymerization (GTP) disclosed in "J. Am. Chem. Soc." 105, 5706 (1983), living polymerization proceeds. According to this method, it is easy to adjust the molecular weight, molecular weight distribution, etc., in desired ranges, so that the properties of the non-aqueous dispersant (e.g., dispersibility and alkaline developability) can be homogenous.

The method for producing a salt-type graft copolymer is not particularly limited, as long as it is a method that is able to produce a salt-type graft copolymer in which nitrogen-containing monomer represented by the general formula (I') and a polymerizable oligomer comprising a polymer chain and a group having an ethylenically unsaturated double bond at a terminal of the chain, are contained as copolymerizable components, and in which nitrogen sites of the nitrogen-containing monomers each form a salt with the acidic organophosphorous compound. In the present invention, for example, graft-polymerization of the nitrogen-containing monomer, the polymerizable oligomer and, as needed, other monomer(s) can be carried out by a known polymerization technique. Then, the acidic organophosphorous compound is added to the solvent and agitated (and then heated as needed), thereby producing a salt-type graft copolymer. In the polymerization, additives that are generally used for polymerization, such as a polymerization initiator, a dispersion stabilizer and a chain transfer agent, can be used.

[Color Material Dispersion Liquid]

The color material dispersion liquid of the present invention comprises a color material, a dispersant and a solvent, the dispersant being a polymer comprising at least one constitutional unit represented by the following general formula (I), wherein at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid:

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

wherein $R^2$ and $R^3$ each independently represent a hydrogen atom or a hydrocarbon group which can contain a hetero atom, and $R^2$ and $R^3$ can be the same as or different from each other.

Because of the use of a color material in combination with the above-specified dispersant, the color material dispersion liquid is excellent in color material dispersibility and dispersion stability and able to form color layers with excellent hydrolysis resistance. Also, in the case of using a color material with low heat resistance, such as a lake pigment, the color material dispersion liquid increases the heat resistance of color layers formed by using the color material dispersion liquid.

The color material dispersion liquid of the present invention contains at least a color material, the above-specified dispersant and a solvent. It can contain other components, as needed, as long as the effects of the present invention are not impaired.

Hereinafter, the components of the color material dispersion liquid of the present invention will be described in detail.

<Color Material>

In the represent invention, the color material is not particularly limited, as long as it is able to provide a desired color. As the color material, various kinds of organic or inorganic colorants can be used alone or in combination of two or more kinds. As the color material, for example, there may be used an organic pigment, an inorganic pigment and a dye.

(Pigment)

Concrete examples of the organic pigment include compounds sorted in the Pigment group by the color index (C.I.; published by the Society of Dyers and Colourists Corp.)

Examples of such compounds include those identified by the following color index (C.I.) numbers: yellow pigments such as C.I. pigment yellow 1, C.I. pigment yellow 3, C.I. pigment yellow 12, C.I. pigment yellow 138, C.I. pigment yellow 139, C.I. pigment yellow 150, C.I. pigment yellow 180 and C.I. pigment yellow 185; red pigments such as C.I. pigment red 1, C.I. pigment red 2, C.I. pigment red 3, C.I. pigment red 209, C.I. pigment red 242, C.I. pigment red 254 and C.I. pigment red 177; blue pigments such as C.I. pigment blue 15, C.I. pigment blue 15:3, C.I. pigment blue 15:4 and C.I. pigment blue 15:6; violet pigments such as C.I. pigment violet 23; and green pigments such as C.I. pigment green 36 and C.I. pigment green 58.

In the present invention, the above-specified dispersant has the effect of increasing heat resistance when the dispersant is combined with a lake pigment with low heat resistance. Therefore, of organic pigments, a lake pigment is preferably used with the dispersant. "Lake pigment" as used herein means an organic pigment obtained by precipitating a water-soluble dye with a laking agent (precipitant) to make it water-insoluble. Lake pigments are derived from a dye, so that they have higher transmittance than ordinary pigments and are able to satisfy the demand for higher luminance. However, many lake pigments generally have low heat resistance.

Examples of lake pigments include the following: C.I. pigment blue 1, C.I. pigment blue 2, C.I. pigment blue 3, C.I. pigment blue 8, C.I. pigment blue 9, C.I. pigment blue 10, C.I. pigment blue 12, C.I. pigment blue 14, C.I. pigment blue 17:1, C.I. pigment blue 18, C.I. pigment blue 19, C.I. pigment blue 24, C.I. pigment blue 24:1, C.I. pigment blue 53, C.I. pigment blue 56, C.I. pigment blue 61, C.I. pigment blue 62, C.I. pigment blue 63, C.I. pigment violet 1, C.I. pigment violet 2, C.I. pigment violet 3, C.I. pigment violet 3:1, C.I. pigment violet 3:3, C.I. pigment violet 4, C.I. pigment violet 5, C.I. pigment violet 5:1, C.I. pigment violet 6:1, C.I. pigment violet 7:1, C.I. pigment violet 9, C.I. pigment violet 12, C.I. pigment violet 20, C.I. pigment violet 26, C.I. pigment violet 27, C.I. pigment violet 39, C.I. pigment green 1, C.I. pigment green 2, C.I. pigment green 3, C.I. pigment green 4, C.I. pigment red 48:1, C.I. pigment red 48:2, C.I. pigment red 48:3, C.I. pigment red 48:4, C.I. pigment red 48:5, C.I. pigment red 49, C.I. pigment red 49:1, C.I. pigment red 49:2, C.I. pigment red 49:3, C.I. pigment red 52:1, C.I. pigment red 52:2, C.I. pigment red 53:1, C.I. pigment red 54, C.I. pigment red 57:1, C.I. pigment red 58, C.I. pigment red 58:1, C.I. pigment red 58:2, C.I. pigment red 58:3, C.I. pigment red 58:4, C.I. pigment red 60:1, C.I. pigment red 63, C.I. pigment red 63:1, C.I. pigment red 63:2, C.I. pigment red 63:3, C.I. pigment red 64:1, C.I. pigment red 68, C.I. pigment red 81, C.I. pigment red 81:1, C.I. pigment red 82, C.I. pigment red 83, C.I. pigment red 84, C.I. pigment red 169, C.I. pigment red 172, C.I. pigment red 173, C.I. pigment red 174, C.I. pigment red 191, C.I. pigment red 193, C.I. pigment red 200, C.I. pigment red 237, C.I. pigment red 239, C.I. pigment red 247, C.I. pigment yellow 61, C.I. pigment yellow 61:1, C.I. pigment yellow 62, C.I. pigment yellow 100, C.I. pigment yellow 104. C.I. pigment yellow 133, C.I. pigment yellow 168, C.I. pigment yellow 169, C.I. pigment yellow 183, C.I. pigment yellow 191, C.I. pigment yellow 209, C.I. pigment yellow 209:1 and C.I. pigment yellow 212.

In the case of using the color material dispersion liquid of the present invention for color filter application, a lake pigment containing a triarylmethane-based dye is particularly preferably used as the lake pigment, from the viewpoint of achieving a blue color layer with higher luminance.

A lake pigment being represented by the following general formula (A) and comprising a basic triarylmethane dye and an anion containing, as essential elements, oxygen and one or more elements selected from molybdenum, tungsten, silicon and phosphorus, is preferably used from the viewpoint of achieving a blue color layer with higher luminance:

General Formula (A)

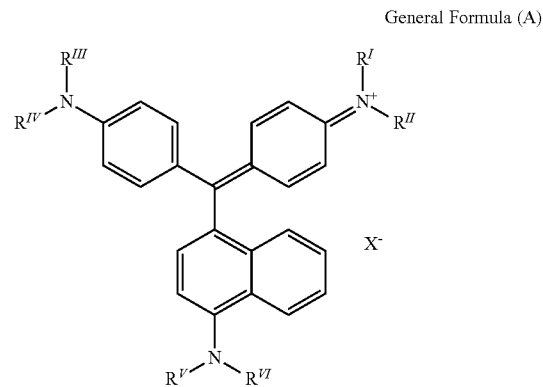

wherein $R^I$, $R^{II}$, $R^{III}$, $R^{IV}$, $R^V$ and $R^{VI}$ are each independently a hydrogen atom, an alkyl group having 1 to 12 carbon atoms, an aryl group having 6 to 12 carbon atoms, or an aralkyl group having 7 to 16 carbon atoms, and $X^-$ is an anion containing, as essential elements, oxygen and one or more elements selected from molybdenum, tungsten, silicon and phosphorus.

The anion $X^-$ is preferably an anion of a heteropoly or isopoly acid containing at least one of molybdenum and tungsten as an essential component. Of them, one or more kinds selected from the group consisting of a phosphotungstic acid, a silicotungstic acid, a phosphotungstic molybdic acid and a silicotungstic molybdic acid are particularly preferably used.

Of them, $(PMo_xW_{12-x}O_{40})^{3-}/3$ (wherein x is an integer of 1, 2 or 3), $(SiMoW_{11}O_{40})^{4-}/4$, $(P_2Mo_yW_{18-y}O_{62})^{6-}/6$ (wherein y is an integer of 1, 2 or 3) are particularly preferably used as the anion $X^-$. It is preferable to at least one of $(SiMoW_{11}O_{40})^{4-}/4$ and $(P_2Mo_yW_{18-y}O_{62})^{6-}/6$ (wherein y is an integer of 1, 2 or 3), from the viewpoint of increasing heat resistance.

Concrete examples of the inorganic pigment include titanium oxide, silica, barium sulfate, calcium carbonate, zinc oxide, lead sulfate, yellow lead, zinc yellow, red iron oxide (red iron(III) oxide), cadmium red, ultramarine blue, Prussian blue, chromium oxide green, cobalt green, amber, titanium black, synthetic iron black and carbon black.

(Dye)

Examples of red dyes include xanthene-based dyes, azo-based dyes, anthraquinone-based dyes and perinone-based dyes. Examples of blue dyes include methine-based dyes, anthraquinone-based dyes, azo-based dyes, triarylmethane-based dyes, phthalocyanine-based dyes and anthraquinone-based dyes. Examples of green dyes include triaminotriphenylmethane-based basic dyes and phthalocyanine-based dyes. Examples of magenta dyes include crimson and anthraquinone-based dyes. Examples of yellow dyes include azo-based dyes, anthraquinone-based dyes, methine-based dyes, quinophthalone-based dyes and pyrazolone-based dyes.

In the case of using the color material dispersion liquid of the present invention for color filter application, the dye is preferably a dye containing xanthene, anthraquinone or phthalocyanine as the basic skeleton, from the viewpoint of heat resistance.

<Dispersant>

The above-specified dispersant used in the color material dispersion liquid of the present invention, will not be described here since it is the same as the non-aqueous dispersant of the present invention.

In the color material dispersion liquid of the present invention, as the dispersant, the above-described non-aqueous dispersants of the present invention can be used alone or in combination of two or more kinds. The content of the dispersant is appropriately determined, depending on the type of the color material used, etc. The content is generally in a range of 5 to 200 parts by mass, preferably 10 to 100 parts by mass, still more preferably 20 to 80 parts by mass, relative to 100 parts by mass of the color material. When the content of the dispersant is in the range, the color material can be homogeneously and stably dispersed.

<Solvent>

In the color material dispersion liquid of the present invention, the solvent is not particularly limited, as long as it is a non-aqueous solvent that is not reactive with the components in the color material dispersion liquid and is able to dissolve or disperse them. Examples of the non-aqueous solvent include the following organic solvents: alcohol-based solvents such as methyl alcohol, ethyl alcohol, N-propyl alcohol, and isopropyl alcohol; ether alcohol-based solvents such as methoxy alcohol, ethoxy alcohol, methoxy ethoxy ethanol, ethoxy ethoxy ethanol, and propylene glycol monomethyl ether; ester-based solvents such as ethyl acetate, butyl acetate, 3-methoxybutyl acetate, methyl methoxypropionate, ethyl ethoxypropionate, and ethyl lactate; ketone-based solvents such as acetone, methyl isobutyl ketone, and cyclohexanone; ether alcohol acetate-based solvents such as methoxy ethyl acetate, methoxy propyl acetate, methoxy butyl acetate, ethoxy ethyl acetate, ethyl cellosolve acetate, methoxy ethoxy ethyl acetate, ethoxy ethoxy ethyl acetate, and propylene glycol monomethyl ether acetate; ether-based solvents such as diethyl ether, ethylene glycol dimethyl ether, diethylene glycol dimethyl ether, diethylene glycol methyl ethyl ether, and tetrahydrofuran; aprotic amide-based solvents such as N,N-dimethylformamide, N,N-dimethylacetamide, and N-methylpyrrolidone; lactone-based solvents such as γ-butyrolactone; unsaturated hydrocarbon-based solvents such as benzene, toluene, xylene, and naphthalene; and saturated hydrocarbon-based solvents such as n-heptane, n-hexane, and n-octane.

Of them, the following solvents are preferably used: ether alcohol-based solvents such as propylene glycol monomethyl ether; ether alcohol acetate-based solvents such as methoxy ethyl acetate, ethoxy ethyl acetate, ethyl cellosolve acetate, methoxy ethoxy ethyl acetate, ethoxy ethoxy ethyl acetate, and propylene glycol monomethyl ether acetate; ether-based solvents such as ethylene glycol dimethyl ether, diethylene glycol dimethyl ether, diethylene glycol methyl ethyl ether, and propylene glycol diethyl ether; ester-based solvents such as 3-methoxybutyl acetate, methyl methoxypropionate, ethyl ethoxypropionate, and ethyl lactate.

As the solvent used in the present invention, 3-methoxybutyl acetate (MBA), propylene glycol monomethyl ether acetate (PGMEA), diethylene glycol dimethyl ether (DMDG), diethylene glycol methyl ethyl ether, propylene glycol monomethyl ether (PGME) and combinations thereof are particularly preferred, from the viewpoint of solubility and coating property of the non-aqueous dispersant.

In the color material dispersion liquid of the present invention, the content of the solvent is not particularly limited, as long as the components of the color material dispersion liquid can be homogeneously dissolved or dispersed. In the present invention, the solid content of the color material dispersion liquid is preferably in a range of 5 to 40% by mass, more preferably in a range of 10 to 30% by mass. When the solid content is in the range, an appropriate viscosity for coating can be obtained.

<Other Components>

As needed, the color material dispersion liquid of the present invention can further contain a dispersion assisting resin and other components.

Examples of the dispersion assisting resin include alkali-soluble resins exemplified below under "Color Resin Composition". Due to steric hindrance by the alkali-soluble resin, the color material particles become less likely to contact each other and result in stabilization of particle dispersion, and the particle dispersion stabilizing effect may be effective in reducing the dispersant.

Examples of the other components include a surfactant, which is used to increase wettability, a silane coupling agent, which is used to increasing adhesion, a defoaming agent, a cissing inhibitor, an antioxidant, an aggregation inhibitor and a UV absorber.

<Method for Producing a Color Material Dispersion Liquid>

The method for producing a color material dispersion liquid comprises the steps of: preparing a dispersant by mixing a polymer comprising at least one constitutional unit represented by the following general formula (I) with an acidic organophosphorous compound comprising one or more selected from the group consisting of organic phosphonic acid monoester compounds resulting from addition of a monofunctional epoxy compound or monofunctional oxetane compound to an organic phosphonic acid, thereby allowing that at least part of nitrogen sites of the constitutional units represented by the general formula (I) each form a salt with the acidic organophosphorous compound (hereinafter this step may be referred to as dispersant preparation step), and dispersing the obtained dispersant and a color material in a solvent (hereinafter this step may be referred to as dispersion step):

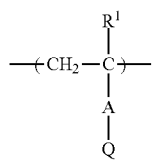
(I)

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

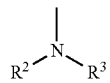
(I-a)

wherein $R^2$ and $R^3$ each independently represent a hydrogen atom or a hydrocarbon group which can contain a hetero atom, and $R^2$ and $R^3$ can be the same as or different from each other.

In the method for producing the color material dispersion liquid according to the present invention, the dispersant is prepared in advance by forming a salt between at least part of nitrogen sites of the constitutional units represented by the general formula (I) each and the acidic organophosphorous compound; thereafter, the color material is dispersed. Therefore, color material dispersibility and dispersion stability are increased, and a color material dispersion liquid which is able to form color layers with excellent hydrolysis resistance can be obtained.

The method for producing the color material dispersion liquid according to the present invention, has the dispersant preparation step and the dispersion step. As needed, the method can further have other steps, within a scope which does not impair the effects of the present invention.

<Dispersant Preparation Step>

The dispersant preparation step is a step of preparing a dispersant by mixing a polymer comprising at least one constitutional unit represented by the general formula (I) with the above-specified acidic organophosphorous compound, thereby forming salts therebetween. In particular, there may be used the method described above under "Production of the non-aqueous dispersant".

<Dispersion Step>

The dispersion step is a step of dispersing the obtained dispersant and a color material in a solvent.

Examples of dispersion machines that can be used to disperse the color material include: roller mills such as a two roller mill and a three roller mill; ball mills such as a ball mill and a vibrating ball mil; paint shakers; and bead mills such as a continuous disk type bead mill and a continuous annular type bead mill. In the case of using a bead mill, a preferred dispersion condition is that the diameter of the beads used is preferably 0.03 to 2 mm, more preferably 0.05 to 1 mm. After the dispersion, it is also preferable to filter the resultant with a membrane filter of about 5.0 to 0.2 µm.

Therefore, the color material dispersion liquid with excellent color material dispersibility can be obtained.

In the case where the above-specified acidic organophosphorous compound contained in the dispersant used in the present invention has a polymerizable group, for example, after adding the dispersant and a photoinitiator to the solvent, or after dispersing or dissolving the dispersant, the color material and a photoinitiator in the solvent, the resultant can be exposed to light to polymerize the dispersant. By polymerizing the dispersant in this manner, the color material dispersion stability in the color material dispersion liquid of the present invention can be increased.

[Color Resin Composition]

The color resin composition of the present invention comprises a color material, a dispersant, a binder component and a solvent, the dispersant being a polymer comprising at least one constitutional unit represented by the following general formula (I), wherein at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid:

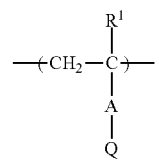
(I)

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

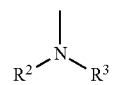
(I-a)

wherein $R^2$ and $R^3$ each independently represent a hydrogen atom or a hydrocarbon group which can contain a hetero atom, and $R^2$ and $R^3$ can be the same as or different from each other.

By using a color material, the above-specified dispersant and a binder component in combination, the color resin composition of the present invention is excellent in dispersibility and dispersion stability, and color layers formed by use of the color resin composition is excellent in hydrolysis resistance. In the case of using a color material with low heat resistance, such as a lake pigment, in the color resin composition of the present invention, color layers with increased heat resistance can be obtained.

The color resin composition of the present invention contains at least a color material, the above-specified dispersant, a binder component and a solvent. As needed, it can contain other components, as long as the effects of the present invention are not impaired.

Hereinafter, the components of the color resin composition of the present invention will be described in detail.

The other components that can be contained in the color resin composition of the present invention will not be described here since, as the other components, there may be used components that are the same as those described above under "Color material dispersion liquid".

<Binder Component>

To obtain film-forming properties and adhesion to a coated surface and to provide sufficient hardness to a coating film, the color resin composition of the present invention preferably contains a curable binder component. The curable binder component is not particularly limited and can be selected from conventionally-known curable binder components that are used to form the color layers of a color filter.

As the curable binder component, for example, there may be used a photocurable binder component containing a photocurable resin that can be polymerized and cured by visible rays, UV rays, electron beams, etc., or there may be used one containing a thermosetting binder component that can be polymerized and cured by heating.

In the case where color layers can be formed by selectively attaching the color resin composition of the present invention in a pattern onto a substrate, e.g., the case of using the composition in the inkjet method, the curable binder component is not needed to have developability. In this case, a known thermosetting binder component, a known photocurable binder component or the like can be appropriately used, which are used for forming the color layers of a color filter by the inkjet method.

In the case of using a photolithography step to form a color filter, a photosensitive binder component with alkaline developability is appropriately used.

Hereinafter, the photosensitive binder component and the thermosetting binder component that is suitable for use in the inkjet method will be described in detail. However, the curable binder component used in the present invention is not limited to them.

(1) Photosensitive Binder Component

As the photosensitive binder component, for example, there may be mentioned a positive-type photosensitive binder component and a negative-type photosensitive binder component. Examples of the positive-type photosensitive binder component include those containing an alkali-soluble resin and an o-quinonediazide group-containing compound as a component which serves to impart photosensitivity. As the alkali-soluble resin, for example, there may be mentioned a polyimide precursor.

As the negative-type photosensitive binder component, those containing at least an alkali-soluble resin, a polyfunctional monomer and a photoinitiator are suitably used. Hereinafter, the alkali-soluble resin, the polyfunctional monomer and the photoinitiator will be described in detail.

(Alkali Soluble Resin)

The alkali soluble resin in the present invention is one having a carboxyl group in a side chain thereof. It functions as a binder resin and can be appropriately selected and used as long as it is soluble in developing solutions used for pattern formation, particularly preferably alkali developing solutions.

The alkali soluble resin preferred in the present invention is a resin having a carboxyl group. Concrete examples thereof include acrylic copolymers having a carboxyl group and epoxy (meth)acrylate resins having a carboxyl group. Of them, particularly preferred is one having a carboxyl group and, moreover, a photopolymerizable functional group such as an ethylenically unsaturated group in a side chain thereof. This is because there is an increase in the hardness of the cured film thus formed, by containing the photopolymerizable functional group. These acrylic copolymers and epoxy (meth)acrylate resins can be used in combination of two or more kinds.

The acrylic copolymer having a carboxyl group is obtained by copolymerizing at least one carboxyl group-containing ethylenically unsaturated monomer and at least one ethylenically unsaturated monomer.

The acrylic copolymer having a carboxyl group can further contain at least one constitutional unit having an aromatic carbon ring. The aromatic carbon ring functions as a component which imparts coatability to the color resin composition.

The acrylic copolymer having a carboxyl group can further contain at least one constitutional unit having an ester group. The constitutional unit having an ester group not only functions as a component which inhibits alkali solubility of the color resin composition, but also functions as a component which increases solubility in solvents and re-dissolubility in solvents.

Examples of the acrylic copolymer having a carboxyl group include copolymers obtained from one or more kinds selected from the group consisting of methyl (meth)acrylate, ethyl (meth)acrylate, n-propyl (meth)acrylate, isopropyl (meth)acrylate, n-butyl (meth)acrylate, sec-butyl (meth)acrylate, isobutyl (meth)acrylate, tert-butyl (meth)acrylate, 2-ethylhexyl (meth)acrylate, 2-ethoxyethyl (meth)acrylate, benzyl (meth)acrylate, phenyl (meth)acrylate, phenoxyethyl (meth)acrylate, cyclohexyl (meth)acrylate, isobornyl (meth)acrylate, dicyclopentanyl (meth)acrylate, 1-adamantyl (meth)acrylate, allyl (meth)acrylate, 2,2'-oxybis(methylene) bis-2-propenoate, styrene, γ-methylstyrene, glycidyl (meth)acrylate, 2-hydroxyethyl (meth)acrylate, 2-dimethylaminoethyl (meth)acrylate, N-vinyl-2-pyrrolidone, N-methylmaleimide, N-cyclohexylmaleimide, N-benzylmaleimide, N-phenylmaleimide and so on, with one or more kinds selected from the group consisting of (meth)acrylic acid, 2-(meth)acryloyloxyethyl succinic acid, 2-(meth)acryloyloxyethyl phthalic acid, acrylic acid dimer (e.g., M-5600 manufactured by TOAGOSEI Co., Ltd.), itaconic acid, crotonic acid, maleic acid, fumaric acid, vinyl acetic acid and anhydrides thereof.

Also, there may be mentioned polymers obtained by introducing an ethylenically unsaturated bond in the above copolymers by, for example, addition of an ethylenically unsaturated compound having a reactive functional group, such as a glycidyl group or hydroxyl group. In the present invention, however, the acrylic copolymer having a carboxyl group is not limited to these examples.

Of these examples, the polymers obtained by introducing an ethylenically unsaturated bond in the above copolymers by, for example, addition of an ethylenically unsaturated compound having a glycidyl group or hydroxyl group, are particularly preferred from the point of view that polymerization with the below-described polyfunctional monomer is possible upon exposure and stable color layers can be obtained.

The copolymerization ratio of the carboxyl group-containing ethylenically unsaturated monomers in the carboxyl group-containing copolymer, is generally 5 to 50% by mass, preferably 10 to 40% by mass. When the copolymerization ratio of the carboxyl group-containing ethylenically unsaturated monomers is less than 5% by mass, there may be a decrease in the solubility of the coating film thus obtained in alkali developing solutions, resulting in a difficulty with pattern formation. When the copolymerization ratio exceeds 50% by mass, upon development with an alkali developing solution, a pattern thus formed is likely to come off of the substrate or roughening of pattern surface is likely to occur.

The molecular weight of the carboxyl group-containing copolymer is preferably in a range of 1,000 to 500,000, more preferably in a range of 3,000 to 200,000. When the molecular weight is less than 1,000, there may be a remarkable decrease in binder function after curing. When the molecular weight exceeds 500,000, upon development with an alkali developing solution, pattern formation may be difficult.

The epoxy (meth)acrylate resin having a carboxyl group is not particularly limited. As the resin, however, an epoxy (meth)acrylate compound obtained by the reaction of an acid anhydride with a reaction product of an epoxy compound and an unsaturated group-containing monocarboxylic acid, is suitable.

The epoxy compound is not particularly limited. Examples thereof include epoxy compounds such as bisphenol A type epoxy compounds, bisphenol F type epoxy compounds, bisphenol S type epoxy compounds, phenol novolac type epoxy compounds, cresol novolac type epoxy compounds, aliphatic epoxy compounds and bisphenol fluorene type epoxy compounds. They can be used alone or in combination of two or more kinds.

As the unsaturated group-containing monocarboxylic acid, for example, there may be mentioned (meth)acrylic acid, 2-(meth)acryloyloxyethyl succinic acid, 2-(meth)acryloyloxyethyl phthalic acid, (meth)acryloyloxyethyl hexahydrophtalic acid, (meth)acrylic acid dimer, β-furfuryl acrylic acid, β-styryl acrylic acid, cinnamic acid, crotonic acid and α-cyano cinnamic acid. These unsaturated group-containing monocarboxylic acids can be used alone or in combination of two or more kinds.

As the acid anhydride, there may be mentioned the following: dibasic acid anhydrides such as maleic anhydride, succinic anhydride, itaconic anhydride, phthalic anhydride, tetrahydrophthalic anhydride, hexahydrophthalic anhydride, methylhexahydrophthalic anhydride, endomethylene tetrahydrophthalic anhydride, methylendomethylene tetrahydrophthalic anhydride, chlorendic anhydride, methyltetrahydrophthalic anhydride; aromatic polycarboxylic acid anhydrides such as trimellitic anhydride, pyromellitic dianhydride, benzophenonetetracarboxylic dianhydride, biphenyltetracarboxylic dianhydride, biphenyl ether tetracarboxylic acid; and polycarboxylic acid anhydride derivatives such as 5-(2,5-dioxotetrahydrofuryl)-3-methyl-3-cyclohexene-1,2-dicarboxylic anhydride and endobicyclo-[2,2,1]-hepto-5-ene-2,3-dicarboxylic anhydride. They can be used alone or in combination of two or more kinds.

The molecular weight of the carboxyl group-containing epoxy (meth)acrylate compound obtained as above, is not particularly limited. However, it is preferably 1,000 to 40,000, more preferably 2,000 to 5,000.

The alkali-soluble resin used in the color resin composition of the present invention can be one kind of alkali-soluble resin or a combination of two or more kinds of alkali-soluble resins. The content is generally in a range of 10 to 1,000 parts by mass, preferably in a range of 20 to 500 parts by mass, relative to 100 parts by mass of the color material contained in the color resin composition. When the content of the alkali-soluble resin is too small, sufficient alkaline developability may not be obtained. Then the content of the alkali-soluble resin is too large, the ratio of the color material is relatively small and sufficient color density may not be obtained, therefore.

(Polyfunctional Monomer)

The polyfunctional monomer used in the color resin composition of the present invention is not particularly limited, as long as it is polymerizable by the below-described photoinitiator. As the polyfunctional monomer, a compound having two or more ethylenically unsaturated double bonds is generally used, and a polyfunctional (meth)acrylate having two or more acryloyl or methacryloyl groups is particularly preferred.

Examples of such a polyfunctional (meth)acrylate include difunctional (meth)acrylates such as ethylene glycol di(meth)acrylate, diethylene glycol di(meth)acrylate, hexanediol di(meth)acrylate, propylene glycol di(meth)acrylate, glycerol di(meth)acrylate, triethylene glycol di(meth)acrylate, tetraethylene glycol di(meth)acrylate, tetramethylene glycol di(meth)acrylate, butylene glycol di(meth)acrylate, dicyclopentanyl di(meth)acrylate, triglycerol di(meth)acrylate, neopentyl glycol-modified trimethylolpropane di(meth)acrylate, allylcyclohexyl di(meth)acrylate, methoxycyclohexyl di(meth)acrylate, acrylated isocyanurate, bis(acryloxyneopentyl glycol)adipate, bisphenol A di(meth)acrylate, tetrabromo bisphenol A di(meth)acrylate, bisphenol S di(meth)acrylate, butanediol di(meth)acrylate, phthalic di(meth)acrylate, di(meth)acrylate phosphate, and zinc di(meth)acrylate.

Examples of trifunctional or higher-functional (meth)acrylates include trimethylolpropane tri(meth)acrylate, trimethylol ethane tri(meth)acrylate, glycerol tri(meth)acrylate, pentaerythritol tri(meth)acrylate, pentaerythritol tetra(meth)acrylate, alkyl-modified dipentaerythritol tri(meth)acrylate, succinic anhydride-modified pentaerythritol tetra(meth)acrylate, tri(meth)acrylate phosphate, tris(acryloxyethyl)isocyanurate, tris(methacryloxyethyl)isocyanurate, dipentaerythritol tetra (meth)acrylate, ditrimethylolpropane tetraacrylate, alkyl-modified dipentaerythritol tetra(meth)acrylate, dipentaerythritol hexa(meth)acrylate, dipentaerythritol penta(meth)acrylate, alkyl-modified dipentaerythritol penta(meth)acrylate, succinic anhydride-modified dipentaerythritol penta(meth)acrylate, urethane tri(meth)acrylate, ester tri(meth)acrylate, urethane hexa(meth)acrylate, and ester hexa(meth)acrylate.

These polyfunctional (meth)acrylates can be used alone or in combination of two or more kinds. In the case where the color resin composition of the present invention is needed to be excellent in photocurability (high sensitivity). The polyfunctional monomer is preferably one having three or more polymerizable double bonds (trifunctional or higher-functional monomer). Preferred are poly(meth)acrylates of trivalent or higher polyalcohols, and dicarboxylic acid-modified products thereof. Concrete examples thereof include trimethylolpropane tri(meth)acrylate, pentaerythritol tri(meth)acrylate, succinic acid-modified pentaerythritol tri(meth)acrylate, pentaerythritol tetra(meth)acrylate, dipentaerythritol tetra(meth)acrylate, dipentaerythritol penta(meth)acrylate, succinic acid-modified dipentaerythritol penta(meth)acrylate, and dipentaerythritol hexa(meth)acrylate.

The content of the polyfunctional monomer used in the color resin composition of the present invention is not particularly limited. It is generally about 5 to 500 parts by mass, preferably in a range of 20 to 300 parts by mass, relative to 100 parts by mass of the alkali-soluble resin. When the content of the polyfunctional monomer is smaller than the range, photocuring may not proceed sufficiently and the color resin composition exposed to light may be melted. When the content of the polyfunctional monomer is larger than the range, there may be a decrease in alkaline developability.

(Photoinitiator)

The photoinitiator used in the color resin composition of the present invention is not particularly limited and can be selected from conventionally-known various kinds of photoinitiators. Examples thereof include: aromatic ketones such as benzophenone, Michler's ketone, 4,4'-bisdiethylaminobenzophenone, 4-methoxy-4'-dimethylaminobenzophenone, 2-ethylanthraquinone and phenanthrene; benzoin ethers such as benzoin methyl ether, benzoin ethyl ether and benzoin phenyl ether; benzoins such as methylbenzoin and ethylbenzoin; 2-(o-chlorophenyl)-4,5-phenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2,4,5-triarylimidazole dimer, 2-(o-chlorophenyl)-4,5-di(m-methylphenyl)imidazole dimer; 2-benzyl-2-dimethylamino-1-(4-morpholinophenyl)-butanone; halomethyl oxadiazole compounds such as 2-trichloromethyl-5-styryl-1,3,4-oxadiazole, 2-trichloromethyl-5-(p-cyanostyryl)-1,3,4-oxadiazole and 2-trichloromethyl-5-(p-methoxystyryl)-1,3,4-oxadiazole; halomethyl-5-triazine compounds such as 2,4-bis(trichloromethyl)-6-p-methoxystyryl-5-triazine, 2,4-bis(trichloromethyl)-6-(1-p-dimethylaminophenyl-1,3-butadienyl)-S-triazine, 2-trichloromethyl-4-amino-6-p-methoxystyryl-S-triazine, 2-(naphtho-1-yl)-4,6-bis-trichloromethyl-5-triazine, 2-(4-ethoxy-naphtho-1-yl)-4,6-bis-trichloromethyl-5-triazine, 2-(4-butoxy-naphtho-1-yl)-4,6-bis-trichloromethyl-5-triazine; and those including 2,2-dimethoxy-1,2-diphenylethane-1-one, 2-methyl-1-[4-(methylthio)phenyl]-2-morpholinopropanone, 1,2-benzyl-2-dimethylamino-1-(4-morpholinophenyl)-butanone-1,1-hydroxy-cyclohexyl-phenylketone, benzyl, benzoylbenzoic acid, methyl benzoylbenzoate, 4-benzoyl-4'-methyl diphenyl sulfide, benzil methyl ketal, dimethylaminobenzoate, p-isoamyl dimethylaminobenzoate, 2-n-butoxyethyl-4-dimethylaminobenzoate, 2-chlorothioxanthone, 2,4-diethylthioxanthone, 2,4-dimethylthioxanthone, isopropylthioxanthone, ethanone, 1-[9-ethyl-6-(2-methylbenzoyl)-9H-carbazole-3-yl]-1-(o-acetyloxime), 4-benzoyl-methyl diphenyl sulfide, 1-hydroxy-cyclohexyl-phenylketone, 2-benzyl-2-(dimethylamino)-1-[4-(4-morpholinyl)phenyl]-1-butanone, 2-(dimethylamino)-2-[(4-methylphenyl)methyl]-1-[4-(4-morpholinyl)phenyl]-1-butanone, α-dimethoxy-α-phenylacetophenone, phenylbis(2,4,6-trimethylbenzoyl)phosphine oxide, and 2-methyl-1-[4-(methylthio)phenyl]-2-(4-morpholinyl)-1-propanone. These photoinitiators can be used alone or in combination of two or more kinds.

The content of the photoinitiator used in the color resin composition according to the present invention, is generally about 0.01 to 100 parts by mass, preferably 5 to 60 parts by mass, relative to 100 parts by mass of the polyfunctional monomer. When the content is smaller than the range, a sufficient polymerization reaction cannot occur, so that the hardness of the color layers may not be sufficient. When the content is larger than the range, the content of the color material and so on in the solid content of the color resin composition for color filters is relatively small, so that sufficient color concentration may not be obtained.

(2) Thermosetting Binder Component

As the thermosetting binder component, a combination of a compound having two or more thermosetting functional groups per molecule and a curing agent is generally used. In addition, a catalyst that is able to promote a thermosetting reaction can be added. Examples of the thermosetting functional groups include an epoxy group, an oxetanyl group, an isocyanate group and an ethylenically unsaturated bond. As the thermosetting functional groups, epoxy groups are preferably used. In addition, a polymer with no polymerization reactivity can be used in combination with them.

As the compound having two or more thermosetting functional groups per molecule, an epoxy compound having two or more epoxy groups per molecule is preferably used. The epoxy compound having two or more epoxy groups per molecule is an epoxy compound having two or more epoxy groups, preferably 2 to 50 epoxy groups, more preferably 2 to 20 epoxy groups, per molecule (including those that are referred to as epoxy resin). The epoxy groups are needed to be a structure having an oxirane ring, such as a glycidyl group, an oxyethylene group or an epoxycyclohexyl group. As the epoxy compound, there may be mentioned known polyvalent epoxy compounds curable by carboxylic acid. A wide range of such epoxy compounds are disclosed in, for example, "Epoxy resin handbook" edited by Masaki Shimbo and published by Nikkan Kogyo Shimbun Ltd. (1987) and they can be used in the present invention.

i) Compound Having Two or More Thermosetting Functional Groups Per Molecule

As the epoxy compound which is a polymer having a relatively high molecular weight and is generally used as a curable binder component (hereinafter may be referred to as "binder epoxy compound"), there may be used a polymer composed of constitutional units represented by the following formulae (VIII) and (IX) and having two or more glycidyl groups:

(VIII)

wherein $R^{31}$ is a hydrogen atom or an alkyl group having 1 to 3 carbon atoms, and $R^{32}$ is a hydrocarbon group having 1 to 12 carbon atoms;

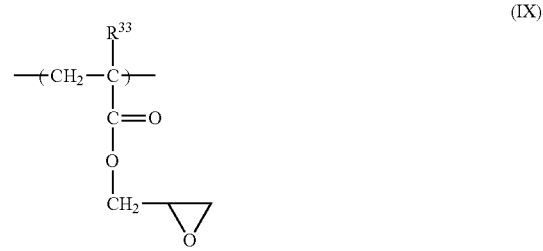

(IX)

wherein $R^{33}$ is a hydrogen atom or an alkyl group having 1 to 10 carbon atoms.

By using the constitutional unit represented by the formula (VIII) as a constitutional unit of the binder epoxy compound, sufficient hardness and transparency can be imparted to the cured coating film formed from the resin composition of the present invention. In the formula (VIII), $R^{31}$ is preferably a hydrogen or a methyl group. $R^{32}$ is a hydrocarbon group having 1 to 12 carbon atoms. It can be a straight-chain aliphatic, alicyclic or aromatic hydrocarbon group and can also contain an additional structure such as a double bond, a hydrocarbon group as a side chain, a spiro cycle as a side chain, an endocyclic cross-linked hydrocarbon group, etc.

Concrete examples of monomers that induce the constitutional unit represented by the formula (VIII) include methyl (meth)acrylate, ethyl (meth)acrylate, i-propyl (meth)acrylate, n-propyl (meth)acrylate, i-butyl (meth)acrylate, n-butyl (meth)acrylate, t-butyl (meth)acrylate, 2-ethylhexyl (meth)acrylate, 2-ethoxyethyl (meth)acrylate, cyclohexyl (meth)acrylate, para-t-butyl cyclohexyl (meth)acrylate, isobornyl (meth)acrylate, benzyl (meth)acrylate, dicyclopentenyl (meth)acrylate and phenyl (meth)acrylate.

The constitutional unit represented by the formula (IX) is used to introduce an epoxy group (epoxy reaction site) in the polymer. The resin composition containing the polymer is excellent in storage stability and is less likely to cause viscosity increase during storage and ejection. One of the reason is presumed to be that the epoxy group in the formula (IX) is a glycidyl group.

In the formula (IX), $R^{33}$ is preferably a hydrogen or a methyl group. Concrete examples of monomers that induce the constitutional unit represented by the formula (IX) include glycidyl (meth)acrylate. Particularly preferred is glycidyl methacrylate (GMA).

The polymer can be a random copolymer or a block copolymer. The polymer can contain a main-chain constitutional unit other than the formula (VIII) or (IX), as long as the properties that the components of a color filter are required to have, can be obtained. Concrete examples of such monomers include acrylonitrile and styrene.

The content of the constitutional units represented by the formula (VIII) and that of the constitutional units represented by the formula (IX) in the binder epoxy compound, is preferably in a range of 10:90 to 90:10. When the content of the constitutional units of the formula (VIII) exceeds the above ratio (90:10), the number of curing reaction sites is decreased and may result in low crosslinking density. On the other hand, the content of the constitutional units of the formula (IX) exceeds the above ratio (10:90), the number of bulky skeletons is decreased and may results in large curing shrinkage.

The mass average molecular weight of the binder epoxy compound is preferably 3,000 or more, more preferably 4,000 or more, in terms of polystyrene equivalent mass average molecular weight. This is because when the molecular weight of the binder epoxy compound is smaller than 3,000, a cured layer, which is a component of a color filter, is likely to have insufficient physical properties such as strength and solvent resistance. On the other hand, the mass average molecular weight of the binder epoxy compound is preferably 20,000 or less, more preferably 15,000 or less, in terms of polystyrene equivalent mass average molecular weight. When the molecular weight exceeds 20,000, viscosity increase is likely to occur and may result in poor sustainability of discharge rate or poor straightness of ejecting direction during ink ejection from an ejection head using the inkjet method, or may result in poor long-term storage stability. The binder epoxy compound can be synthesized by the method as described in paragraph [0148] of Japanese Patent Application Laid-Open (JP-A) No. 2006-106503, for example.

As the thermosetting binder, there may be used an epoxy compound having two or more epoxy groups per molecule (hereinafter may be referred to as "polyfunctional epoxy compound"), which has a smaller molecular weight than the above-mentioned binder epoxy compound. It is particularly preferable to use, as mentioned above, the binder epoxy compound in combination with the polyfunctional epoxy compound. In this case, the polystyrene equivalent mass average molecular weight of the polyfunctional epoxy compound is preferably 4,000 or less, particularly preferably 3,000 or less, provided that it is smaller than that of the binder epoxy compound to be combined therewith. By adding the polyfunctional epoxy compound having a relatively small molecular weight to the resin composition, epoxy groups are supplied to the resin composition, so that epoxy reaction site concentration and crosslinking density can be increased.

Of polyfunctional epoxy compounds, an epoxy compound having four or more epoxy groups per molecule is preferably used to increase crosslinking density for acid-epoxy reaction. Especially in the case where the mass average molecular weight of the binder epoxy compound is 10,000 or less to increase ink ejection performance from the ejection head using the inkjet method, the strength or hardness of the cured layer is likely to decrease. Therefore, it is preferable to increase crosslinking density by adding such a tetrafunctional or higher-functional epoxy compound to the resin composition.

The polyfunctional epoxy compound is not particularly limited, as long as it is one having two or more epoxy groups per molecule. Examples thereof include: bisphenol A type epoxy resins, bisphenol F type epoxy resins, brominated-bisphenol A type epoxy resins, bisphenol S type epoxy resins, diphenyl ether type epoxy resins, hydroquinone type epoxy resins, naphthalene type epoxy resins, biphenyl type epoxy resins, fluorene type epoxy resins, phenol novolac type epoxy resins, o-cresol novolac type epoxy resins, trishydroxyphenylmethane type epoxy resins, trifunctional type epoxy resins, tetraphenylolethane type epoxy resins, dicyclopentadiene phenol type epoxy resins, hydrogenated bisphenol A type epoxy resins, polyol-containing bisphenol A type epoxy resins, polypropylene glycol type epoxy resins, glycidyl ester type epoxy resins, glycidyl amine type epoxy resins, glyoxal type epoxy resins and alicyclic epoxy resins, heterocyclic epoxy resins.

More specifically, there may be mentioned the following: bisphenol A type epoxy resins such as EPIKOTE 828 (product name, manufactured by Japan Epoxy Resins Co., Ltd.), bisphenol F type epoxy resins such as YDF-175S (product name, manufactured by Tohto Kasei Co., Ltd.), brominated-bisphenol A type epoxy resins such as YDB-715 (product name, manufactured by Tohto Kasei Co., Ltd.), bisphenol S type epoxy resins such as EPICLON EXA1514 (product name, manufactured by DIC Corporation), hydroquinone type epoxy resins such as YDC-1312 (product name, manufactured by Tohto Kasei Co., Ltd.), naphthalene type epoxy resins such as EPICLON EXA4032 (product name, manufactured by DIC Corporation), biphenyl type epoxy resins such as EPIKOTE YX4000H (product name, manufactured by Japan Epoxy Resins Co., Ltd.), bisphenol A type novolac epoxy resins such as EPIKOTE 157S70 (product name, manufactured by Japan Epoxy Resins Co., Ltd.), phenol novolac type epoxy resins such as EPIKOTE 154 (product name, manufactured by Japan Epoxy Resins Co., Ltd.) and YDPN-638 (product name, manufactured by Tohto Kasei Co., Ltd.), cresol novolac type epoxy resins such as YDCN-701 (product name, manufactured by Tohto Kasei Co., Ltd.), dicyclopentadiene phenol type epoxy resins such as EPICLON HP-7200 (product name, manufactured by DIC Corporation), trishydroxyphenylmethane type epoxy resins such as EPIKOTE 1032H60 (product name, manufactured by Japan Epoxy Resins Co., Ltd.), trifunctional epoxy resins such as VG3101M80 (product name, manufactured by Mitsui Chemicals, Inc.), tetraphenylolethane type epoxy resins such as EPIKOTE 1031S (product name, manufactured by Japan Epoxy Resins Co., Ltd.), tetrafunctional epoxy resins such as DENACOL EX-411 (product name, manufactured by Nagase ChemteX Corporation), hydrogenated bisphenol A type epoxy resins such as ST-3000 (product name, manufactured by Tohto Kasei Co., Ltd.), glycidyl ester type epoxy resins such as EPIKOTE 190P (product name, manufactured by Japan Epoxy Resins Co., Ltd.), glycidyl amine type epoxy resins such as YH-434 (product name, manufactured by Tohto Kasei Co., Ltd.), glyoxal type epoxy resins such as YDG-414 (product name, manufactured by Tohto Kasei Co., Ltd.), alicyclic polyfunctional epoxy compounds such as EPOLEAD GT-401 (product name, manufactured by DAICEL Chemical Industries and Ltd.), EHPE3150 (product name, manufactured by DAICEL Chemical Industries, Ltd.) and heterocyclic epoxy resins such as triglycidyl isocyanate (TGIC). As needed, the polyfunctional epoxy compound can be mixed with an epoxy reactive diluent such as NEOTOHTO E(product name, manufactured by Tohto Kasei Co., Ltd.)

As for the content ratio (by mass ratio) of the binder epoxy compound and the polyfunctional epoxy compound, which is added as needed, it is preferable that 10 to 80 parts by mass of the binder epoxy compound is used in combination with 10 to 60 parts by mass of the polyfunctional epoxy compound; it is more preferable that 20 to 60 parts by mass of the binder epoxy compound is used in combination with 20 to 50 parts by mass of the polyfunctional epoxy compound; and it is particularly preferable that 30 to 40 parts by mass of the binder epoxy compound is used in combination with 25 to 35 parts by mass of the polyfunctional epoxy compound.

ii) Curing Agent

A curing agent is generally contained in the binder component used in the present invention. As the curing agent, for example, a polycarboxylic acid anhydride or a polycarboxylic acid is used.

Concrete examples of the polycarboxylic acid anhydride include: aliphatic or alicyclic dicarboxylic anhydrides such as a phthalic anhydride, an itaconic anhydride, a succinic anhydride, a citraconic anhydride, a dodecenyl succinic anhydride, a tricarballylic anhydride, a maleic anhydride, a hexahydrophthalic anhydride, a dimethyltetrahydrophthalic anhydride, a himic anhydride and a nadic anhydride; aliphatic polycarboxylic acid dianhydrides such as a 1,2,3,4-butanetetracarboxylic dianhydride and a cyclopentanetetracarboxylic dianhydride; aromatic polycarboxylic acid anhydrides such as a pyromellitic anhydride, a trimellitic anhydride and a benzophenonetetracarboxylic anhydride; and ester group-containing acid anhydrides such as ethylene glycol bistrimellitate anhydride and glycerin tristrimellitate anhydride. Of them, particularly preferred are aromatic polycarboxylic acid anhydrides. Also, commercially-available epoxy resin curing agents containing a carboxylic anhydride can be suitably used.

Concrete examples of the polycarboxylic acid used in the present invention include: aliphatic polycarboxylic acids such as a succinic acid, a glutaric acid, an adipic acid, a butanetetracarboxylic acid, a maleic acid and an itaconic acid; aliphatic polycarboxylic acids such as a hexahydrophtalic acid, a 1,2-cyclohexanedicarboxylic acid, a 1,2,4-cyclohexanetricarboxylic acid and a cyclopentanetetracarboxylic acid; and aromatic polycarboxylic acids such as a phthalic acid, an isophthalic acid, a terephthalic acid, a pyromellitic acid, a trimellitic acid, a 1,4,5,8-naphthalenetetracarboxylic acid and a benzophenonetetracarboxylic acid. Of them, preferred are aromatic polycarboxylic acid.

These curing agents can be used alone or in combination of two or more kinds. The amount of the curing agent used in the present invention is generally in a range of 1 to 100 parts by mass, preferably 5 to 50 parts by mass, based on 100 parts by mass of the epoxy-containing component (the total amount of the binder epoxy compound and the polyfunctional epoxy compound). When the amount of the curing agent used is less than 1 part by mass, a tough coating film may not be formed due to insufficient curing. When the amount of the curing agent used exceeds 100 parts by mass, a coating film with poor adhesion to the substrate may be formed.

iii) Catalyst

To increase the hardness and heat resistance of the cured layer, a catalyst that is able to promote an acid-epoxy thermosetting reaction can be added to the binder component used in the present invention. As such a catalyst, there may be used a thermally latent catalyst which shows activity upon heat-curing.

When heated, the thermally latent catalyst shows catalytic activity, promotes curing reaction and provides good properties to a cured product. It is added as needed. The thermally latent catalyst is preferably one that shows acid catalytic activity at a temperature of 60° C. or more. Examples of such a thermally latent catalyst include a compound produced by neutralizing a proton acid with a Lewis base, a compound produced by neutralizing a Lewis acid with a Lewis base, a mixture of a Lewis acid and a trialkyl phosphate, phosphonate esters and onium compounds. There may be used various kinds of compounds as disclosed in JP-A No. H04-218561.

The amount of the thermally latent catalyst is generally about 0.01 to 10.0 parts by mass, relative to the total amount (100 parts by mass) of the compound having two or more thermosetting functional groups per molecule and the curing agent.

(Optionally Added Components)

As needed, the color resin composition of the present invention can further contain other kinds of additives, within a scope which does not impair the object of the present invention. As the dispersant, a dispersant other than the non-aqueous dispersant of the present invention can be used in combination with the non-aqueous dispersant.

(Other Dispersant)

The dispersant other than the non-aqueous dispersant of the present invention is not particularly limited. For example, there may be used cationic, anionic, nonionic, ampholytic, silicone-containing and fluorine-containing surfactants. Of surfactants, preferred are polymeric surfactants (polymer dispersants) as mentioned below. It is also possible to use a pigment derivative which is slightly soluble in solvents, as the other dispersant.

Examples of the polymer dispersants include (co)polymers of unsaturated carboxylic esters such as polyacrylic acid ester; (partial) amine salts, (partial) ammonium salts or (partial) alkylamine salts of (co)polymers of unsaturated carboxylic acids such as polyacrylic acid; (co)polymers of hydroxyl group-containing unsaturated carboxylic esters such as hydroxyl group-containing polyacrylic acid ester, and modified products thereof; polyurethanes; unsaturated polyamides; polysiloxanes; long-chain polyaminoamide phosphates; and amide obtained by the reaction of poly (lower alkyleneimine) and free carboxyl group-containing polyester, and salts thereof.

(Additives)

Examples of the additives include a polymerization terminator, a chain transfer agent, a leveling agent, a plasticizer, a surfactant, a defoaming agent, a silane coupling agent, an ultraviolet absorber and an adhesion enhancing agent.

Examples of the surfactant that can be used in the present invention include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, fatty acid-modified polyesters and tertiary amine-modified polyurethanes. Also, there may be used a fluorine-containing surfactant.

Examples of the plasticizer include dibutyl phthalate, dioctyl phthalate and tricresyl. As the defoaming agent and leveling agent, there may be mentioned silicone compounds, fluorine compounds and acrylic compounds, for example.

<Contents of the Components in the Color Resin Composition>

The contents of the components in the color resin composition can be appropriately determined depending on applications and are not particularly limited. For example, in the case of using the color resin composition of the present invention for color filter application, the contents can be determined by reference to the following.

The total content of the color material is preferably 5 to 65% by mass, more preferably 8 to 55% by mass, relative to the total solid content of the color resin composition. When the total content of the color material is too small, the layer obtained by applying the color resin composition to a predetermined thickness (generally 1.0 to 5.0 µm) may have insufficient color concentration. When the total content of the color material is too large, the layer obtained by applying the color resin composition to a substrate and curing the same, may have insufficient layer properties, the properties including adhesion to the substrate, surface roughness and hardness of the layer. In addition, properties such as solvent resistance may be insufficient since the content ratio of the dispersant used for dispersion of the color material in the color resin composition, is also large. In the present invention, "solid content" includes all the above-described components other than the solvent, and it also includes the polyfunctional monomer and so on dissolved in the solvent.

The content of the dispersant is not particularly limited, as long as the color material can be homogeneously dispersed. For example, the dispersant can be used in an amount of 10 to 150 parts by mass, relative to 100 parts by mass of the color material. Also, the content of the dispersant is preferably 15 to 80 parts by mass, particularly preferably 15 to 50 parts by mass, relative to 100 parts by mass of the color material. The total content of the dispersant is preferably in a range of 1 to 60% by mass, particularly preferably in a range of 5 to 50% by mass, relative to the total solid content of the color resin composition. When the content is less than 1% by mass, it may be difficult to homogeneously disperse the color material. When the content exceeds 60% by mass, there may be a decrease in curing and developing properties.

The total content of the binder component is 24 to 94% by mass, preferably 40 to 87% by mass, relative to the total solid content of the color resin composition.

The content of the solvent can be appropriately determined within a scope which allows accurate formation of color layers. In general, the content is preferably in a range of 65 to 95% by mass, particularly preferably in a range of 75 to 90% by mass, relative to the total amount of the color resin composition including the solvent. When the content of the solvent is in the range, excellent coatability is provided to the color resin composition.

[Method for Producing a Color Resin Composition]

The color resin composition production method of the present invention comprises the steps of: preparing a dispersant by mixing a polymer comprising at least one constitutional unit represented by the following general formula (I) with an acidic organophosphorous compound comprising one or more selected from the group consisting of organic phosphonic acid monoester compounds resulting from addition of a monofunctional epoxy compound or monofunctional oxetane compound to an organic phosphonic acid, thereby allowing that at least part of nitrogen sites of the constitutional units represented by the general formula (I) each form a salt with the acidic organophosphorous compound; preparing a color material dispersion liquid by dispersing the obtained dispersant and a color material in a solvent (hereinafter may be referred to as color material dispersion liquid preparation step); and mixing the obtained color material dispersion liquid with a binder component (hereinafter may be referred to as mixing step):

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

wherein $R^2$ and $R^3$ each independently represent a hydrogen atom or a hydrocarbon group which can contain a hetero atom, and $R^2$ and $R^3$ can be the same as or different from each other.

In the color resin composition production method of the present invention, a dispersant is prepared by allowing that at least part of nitrogen sites of the constitutional units represented by the general formula (I) each form a salt with the acidic organophosphorous compound of the polymer comprising the constitutional unit represented by the general formula (I); thereafter, a color material is dispersed. Therefore, color material dispersion and dispersion stability are increased, and the color resin composition which is able to form color layers with excellent hydrolysis resistance can be obtained. In the case of using a color material with low heat resistance, such as a lake pigment, color layers with increased heat resistance can be obtained.

The dispersant preparation step of the method for producing the color resin composition of the present invention, can be the same as the dispersant preparation step described above for the color material dispersion liquid of the present invention. Also, the color material dispersion liquid preparation step can prepare the color material dispersion liquid in the same manner as the dispersion step described above for the color material dispersion liquid of the present invention.

<Mixing Step>

In the color resin composition production method, the mixing step can be carried out after the color material dispersion liquid of the present invention is prepared by the color material dispersion liquid preparation step, or it can be carried out at the same time as the color material dispersion liquid preparation step. For example, it can be a method in which the binder component and various kinds of additives, which are used as needed, are added to the solvent and mixed, and then the color material dispersion liquid of the present invention is added to the mixture and mixed. Or, it can be a method in which the color material dispersion liquid of the present invention, the binder component and various kinds of additives used as needed, are added to the solvent at once and mixed.

In the case where the above-specified acidic organophosphorous compound contained in the dispersant of the present invention used in the color resin composition of the present invention, has a polymerizable group, for example, after adding the dispersant and the polymerization initiator to the solvent, or after dispersing or dissolving the dispersant, the color material and the polymerization initiator in the solvent, the resultant can be exposed to light or heated to polymerize the dispersant. By polymerizing the dispersant in this manner, color material dispersion stability of the color resin composition of the present invention can be increased.

[Color Filter]

The color filter of the present invention comprises at least a transparent substrate and color layers disposed on the transparent substrate, wherein at least one of the color layers is a color layer formed by curing a composition containing a color material, a dispersant and a binder component, and wherein the dispersant is a polymer comprising at least one constitutional unit represented by the general formula (I), in which at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid.

Such a color filter of the present invention will be explained with reference to figures. FIG. 1 is a schematic cross-sectional view showing an example of the color filter of the present invention. FIG. 1 shows that a color filter 10 of the present invention contains a transparent substrate 1, a light shielding part 2 and a color layer 3.

(Color Layer)

The color layers used for the color filter of the present invention are not particularly limited, as long as at least one of the color layers is a color layer formed by curing a composition containing a color material, a dispersant and a binder component, and the dispersant is a polymer comprising at least one constitutional unit represented by the general formula (I), in which at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid. The color material, dispersant and binder component contained in the color layers containing the above-specified dispersant will not be described here, since they can be the same as those described above for the color resin composition of the present invention. The color layers containing the above-specified dispersant can be formed by use of the color resin composition of the present invention, for example.

The color layers are generally formed on an opening of the light shielding part on the below-described transparent substrate and generally composed of color patterns in three or more colors.

The arrangement of the color layers is not particularly limited and can be a general arrangement such as a stripe type, a mosaic type, a triangle type or a four-pixel arrangement type. The width, area, etc., of the color layer can be determined appropriately.

The thickness of the color layers is appropriately controlled by controlling the applying method, solid content concentration, viscosity, etc., of the color resin composition. In general, the thickness is preferably in a range of 1 to 5 µm.

For example, when the color resin composition of the present invention is a photosensitive resin composition, the color layers can be formed by the following method.

First, the above-described color resin composition of the present invention is applied onto the below-described transparent substrate by a coating method such as a spray coating method, a dip coating method, a bar coating method, a roll coating method or a spin coating method, thereby forming a wet coating film.

Then, the wet coating film is dried with a hot plate or oven. The dried film is subjected to exposure through a mask with a given pattern to cause a photopolymerization reaction of the alkali-soluble resin, the polyfunctional monomer, etc., thereby obtaining a coating film of the color resin composition. Examples of light sources and lights that can be used for the exposure include a low pressure mercury lamp, a high pressure mercury lamp and a metal halide lamp, and ultraviolet rays and electron beams. The exposure amount is appropriately controlled, according to the used light source and the thickness of the coating film.

After the exposure, the film can be heated to promote the polymerization reaction. The heating condition is appropriately determined, depending on the content ratio of the components used in the color resin composition, the thickness of the coating film, etc.

Next, the thus-obtained film is developed with a developing solution to dissolve and remove unexposed portions, thereby forming a coating film in a desired pattern. As the developing solution, a solution obtained by dissolving alkali in water or aqueous solvent is generally used. An appropriate amount of surfactant, etc., can be added to the alkali solution. The developing method can be selected from general developing methods.

After the development, generally, the developing solution is rinsed off, followed by drying of the cured coating film of the color resin composition, thereby forming a color layer. To sufficiently cure the coating film, heating can be carried out after the development. The heating condition is not particularly limited and appropriately determined depending on the intended use of the coating film.

In the case of forming the color layers by, for example, the inkjet method, the color layers can be formed as follows.

First, color resin compositions (R, G, B) containing the color resin composition of the present invention and containing color materials in blue (B), green (G) and red (R), respectively, are prepared. The color resin compositions (R, G, B) are selectively attached to regions for forming color layers in corresponding colors (R, G, B) on a surface of the transparent substrate 1, the regions being defined by the pattern of the light shielding part 2, thereby forming ink layers. In this ink applying step, it is needed that the color resin compositions are less likely to cause viscosity increase at the end of the inkjet head and that the color resin compositions keep good ejection performance. The color resin compositions in multiple colors can be ejected onto the substrate at the same time using multiple inkjet heads, so that better work efficiency can be obtained compared to the case of forming color layers in multiple colors one by one by printing, etc.

Next, the ink layers are dried and, if necessary, pre-baked. Then, the layers are cured by heating appropriately or appropriate exposure to light. When the ink layers are appropriately heated or exposed to light, the crosslinking components of the curable resin contained in the color resin composition cause a crosslinking reaction. Therefore, the ink layers are cured to form color layers 3.

(Light Shielding Part)

In the color filter of the present invention, the light shielding part is formed in pattern on the below-described transparent substrate and can be the same as those that are used as the light shielding part in general color filters.

The pattern shape of the light shielding part is not particularly limited, and examples thereof include a stripe-shaped pattern, a matrix-shaped patter, etc. As the light shielding pattern, for example, there may be mentioned one produced by dispersing or dissolving a black pigment in a binder resin, and thin metal layers of chromium, chromium oxide, etc. When the light shielding part is such a thin metal layer, the layer can be a stack of two layers of a $CrO_x$ layer ("x" is an arbitrary number) and a Cr layer, or can be a stack of three layers of a $CrO_x$ layer ("x" is an arbitrary number), a $CrN_y$ layer ("y" is an arbitrary number) and a Cr layer, the stack of three layers having a further reduced reflectance.

When the light shielding part is one produced by dispersing or dissolving a black colorant in a binder resin, the method for producing the light shielding part is not particularly limited and is only required to be a method which can pattern the light shielding part. For example, there may be mentioned a photolithography method using a color resin composition for the light shielding part, a printing method using the same, and an ink-jet method using the same.

In the case as described above and when using a printing method or ink-jet method to produce the light shielding part, as the binder resin, there may be mentioned a polymethyl methacrylate resin, a polyacrylate resin, a polycarbonate resin, a polyvinyl alcohol resin, a polyvinylpyrrolidone resin, a hydroxyethyl cellulose resin, a carboxymethyl cellulose resin, a polyvinyl chloride resin, a melamine resin, a phenol resin, an alkyd resin, an epoxy resin, a polyurethane resin, a polyester resin, a maleic acid resin or a polyamide resin, for example.

In the case as described above and when using a photolithography method to form the light shielding part, as the binder resin, there may be used a reactive vinyl group-containing photosensitive resin such as an acrylate-based, methacrylate-based, polyvinyl cinnamate-based or cyclized rubber-based photosensitive resin, for example. In this case, a photopolymerization initiator can be added to the color resin composition for forming the light shielding part, the composition containing a black colorant and a photosensitive resin. In addition, as needed, a sensitizer, a coatability improving agent, a development modifier, a cross-linking agent, a polymerization inhibitor, a plasticizer, a flame retardant, etc., can be added thereto.

When the light shielding part is a thin metal layer, the method of forming such a light shielding part is not particularly limited, as long as the method allows patterning of the light shielding part. The examples include a photolithography method, a deposition method using a mask, and a printing method.

When the light shielding part is a thin metal layer, the thickness is about 0.2 to 0.4 μm. When the light shielding part is formed from the black colorant dispersed or dissolved in the binder resin, the thickness is about 0.5 to 2 μm.

(Transparent Substrate)

In the color filter of the present invention, the transparent substrate is not particularly limited, as long as it is a substrate that is transparent to visible light. It can be selected from general transparent substrates used in color filters. Concrete examples thereof include inflexible transparent rigid materials such as a silica glass plate, a non-alkali glass plate and a synthetic silica plate, and flexible transparent materials such as a transparent resin film and an optical resin plate.

The thickness of the transparent substrate is not particularly limited. Depending on the intended use of the color filter of the present invention, one having a thickness of about 100 μm to 1 mm can be used, for example.

In addition to the transparent substrate, the light shielding part and the color layers, the color filter of the present invention can also contain an overcoat layer and a transparent electrode layer, for example. Moreover, it can further contain an orientation layer, a columnar spacer, etc.

[Liquid Crystal Display Device]

The liquid crystal display device of the present invention comprises the color filter of the present invention, a counter substrate, and a liquid crystal layer disposed between the color filter and the counter substrate.

Figure 2:
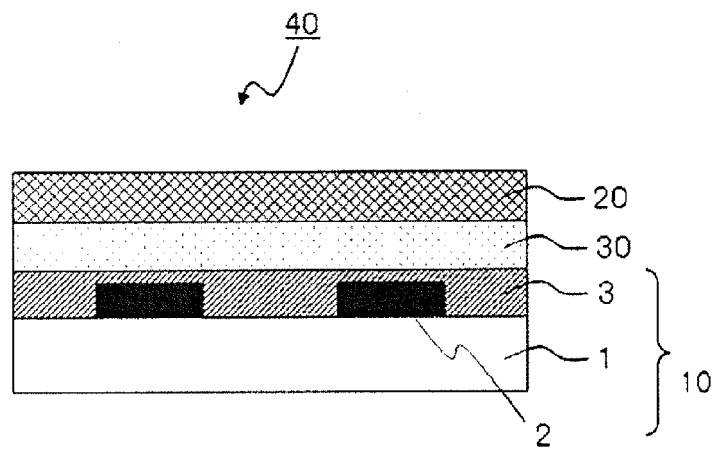
FIG. 2 is a schematic view of an example of the liquid crystal display device of the present invention.

Such a liquid crystal display device of the present invention will be explained with reference to figures. FIG. 2 is a schematic view showing an example of the liquid crystal display device of the present invention. As shown in FIG. 2, a liquid crystal display device 40, which is the liquid crystal display device of the present invention, contains a color filter 10, a counter substrate 20 containing a TFT array substrate, etc., and a liquid crystal layer 30 disposed between the color filter 10 and the counter substrate 20.

The liquid crystal display device of the present invention is not limited to the configuration shown in FIG. 2. It can be a configuration which is generally known as a liquid crystal display device containing a color filter.

The method for driving the liquid crystal display device of the present invention is not particularly limited and can be selected from driving methods which are generally used in liquid crystal display devices. Examples of such driving methods include a TN method, an IPS method, an OCB method and an MVA method. In the present invention, any of these methods can be suitably used.

The counter substrate can be appropriately selected depending on the driving method, etc., of the liquid crystal display device of the present invention.

Also, the liquid crystal of the liquid crystal layer can be selected from various liquid crystals with varying dielectric anisotropies and mixtures thereof, depending on the driving method, etc., of the liquid crystal display device of the present invention.

The method for forming the liquid crystal layer can be selected from methods which are generally used to produce liquid crystal cells. Examples thereof include a vacuum injection method and a liquid crystal dripping method.

In the vacuum injection method, for example, a liquid crystal cell is produced in advance, using a color filter and a counter substrate; liquid crystal is heated to become isotropic liquid; the liquid crystal is injected into the liquid crystal cell, in the form of isotropic liquid, using the capillary effect; the liquid crystal cell is encapsulated with an adhesive agent, thereby forming a liquid crystal layer. Then, the encapsulated liquid crystal can be oriented by gradually cooling the liquid crystal cell to room temperature.

In the liquid crystal dripping method, for example, a sealing agent is applied to the periphery of the color filter; the color filter is heated to the temperature at which the liquid crystal is in an isotropic phase; the liquid crystal is dripped in the form of isotropic liquid, using a dispenser, etc.; the color filter and the counter substrate are stacked under reduced pressure and then attached to each other with the applied sealing agent, thereby forming a liquid crystal layer. Then, the encapsulated liquid crystal can be oriented by gradually cooling the liquid crystal cell to room temperature.

[Organic Light-Emitting Display Device]

The organic light emitting display device of the present invention comprises the color filter of the present invention and an organic light emitting material.

Figure 3:
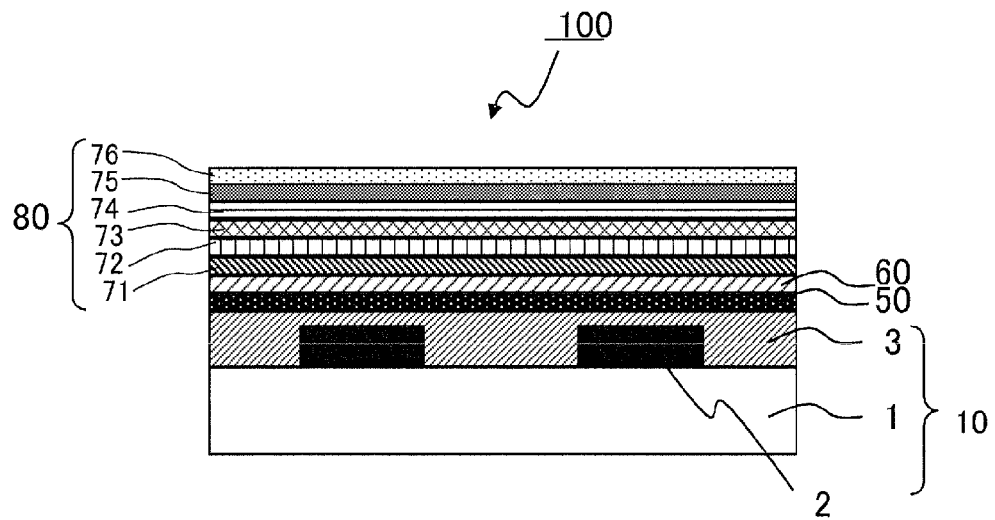
FIG. 3 is a schematic view of an example of the organic light-emitting display device of the present invention.

Such an organic light-emitting display device of the present invention will be explained with reference to figures. FIG. 3 is a schematic view showing an example of the organic light-emitting display device of the present invention. As shown in FIG. 3, an organic light-emitting display device 100, which is the organic light-emitting display device of the present invention, contains a color filter 10 and an organic light-emitting material 80. An organic protection layer 50 and/or an inorganic oxide layer 60 can be present between the color filter 10 and the organic light-emitting material 80.

As the method for stacking the components of the organic light-emitting material 80, for example, there may be mentioned a method of stacking the color filter, a transparent anode 71, a positive hole injection layer 72, a positive hole transport layer 73, a light-emitting layer 74, an electron injection layer 75 and a cathode 76 in this sequence, and a method of attaching the organic light-emitting material 80 formed on a different substrate onto the inorganic oxide layer 60. In the organic light-emitting material 80, the transparent anode 71, the positive hole injection layer 72, the positive hole transport layer 73, the light-emitting layer 74, the electron injection layer 75, the cathode 76 and other components can be selected from conventionally-known materials. The organic light-emitting display device 100 produced as above is applicable to both passive and active drive organic EL displays, for example.

The organic light-emitting display device of the present invention is not limited to the configuration shown in FIG. 3. It can have any one of configurations which are generally known as those of organic light-emitting display devices comprising a color filter.

EXAMPLES

Hereinafter, the present invention will be explained in detail, with reference to examples. The scope of the present invention is not restricted by these examples.

Synthesis Example 1

Synthesis of Binder Resin A

First, as a solvent, 130 parts by mass of diethylene glycol ethyl methyl ether (EMDG) was put in a reactor equipped with a cooling tube, an addition funnel, a nitrogen inlet, a mechanical stirrer and a digital thermometer. While stirring under a nitrogen flow, EMDG was heated to 110° C. To this EMDG, a mixture of 32 parts by mass of methyl methacrylate (MMA), 22 parts by mass of cyclohexyl methacrylate (CHMA), 24 parts by mass of methacrylic acid (MAA), 2 parts by mass of α,α'-azobisisobutyronitrile (AIBN), which serves as a photoinitiator, and 4.5 parts by mass of n-dodecyl mercaptan, which serves as a chain transfer agent, was continuously added dropwise for 1.5 hours.

Then, the synthesis temperature was kept to continue the reaction. Two hours after discontinuing the addition of the mixture, 0.05 part by mass of p-methoxyphenol, which serves as a polymerization initiator, was added thereto.

Next, while injecting air, 22 parts by mass of glycidyl methacrylate (GMA) was added to the mixture. After increasing the temperature of the mixture to 110° C., 0.2 part by mass of triethylamine was added thereto, and the mixture underwent an addition reaction at 110° C. for 15 hours, thus obtaining the binder resin A (solid content: 44% by mass).

The thus-obtained binder resin A had a mass average molecular weight of 8,500 and an acid value of 85 mgKOH/g. The mass average molecular weight was calculated by gel permeation chromatography (GPC), using polystyrene as the reference material and THF as the eluent. The acid value was measured according to JIS-K0070.

Synthesis Example 2

Synthesis of Macromonomer MM-1

First, 80.0 parts by mass of propylene glycol monomethyl ether acetate (PGMEA) was put in a reactor equipped with a cooling tube, an addition funnel, a nitrogen inlet, a mechanical stirrer and a digital thermometer. While stirring under a nitrogen flow, PGMEA was heated to 90° C. To this PGMEA, a mixed solution of 50.0 parts by mass of methyl methacrylate, 30.0 parts by mass of n-butyl methacrylate, 20.0 parts by mass of benzyl methacrylate, 4.0 parts by mass of 2-mercaptoethanol, 30 parts by mass of PGMEA, and 1.0 part by mass of α,α'-azobisisobutyronitrile (AIBN) was added dropwise for 1.5 hours, and the resultant was further reacted for 3 hours. Next, the nitrogen flow was stopped to cool the reaction solution to 80° C. To the reaction solution, 8.74 parts by mass of Karenz MOI (manufactured by Showa Denko K.K.), 0.125 g of dibutyltin dilaurate, 0.125 part by mass of p-methoxyphenol, and 10 parts by mass of PGMEA were added and stirred for 3 hours, thus obtaining a 49.5% by mass solution of the macromonomer MM-1. The thus-obtained macromonomer MM-1 was measured by gel permeation chromatography (GPC) in the condition of N-methylpyrrolidone mixed with 0.01 mol/L lithium bromide and polystyrene standard. As a result, the macromonomer MM-1 was found to have a mass average molecular weight (Mw) of 4,010, a number average molecular weight (Mn) of 1,910, and a molecular weight distribution (Mw/Mn) of 2.10.

Synthesis Example 3

Synthesis of Graft Copolymer GP-1

First, 85.0 parts by mass of PGMEA was put in a reactor equipped with a cooling tube, an addition funnel, a nitrogen inlet, a mechanical stirrer and a digital thermometer. While stirring under a nitrogen flow, PGMEA was heated to 85° C. To this PGMEA, a mixed solution of 67.34 parts by mass (active solid content 33.33 parts by mass) of the macromonomer MM-1 solution of Synthesis Example 2, 16.67 parts by mass of 2-(dimethylamino)ethyl methacrylate, 1.24 parts by mass of n-dodecyl mercaptan, 20.0 parts by mass of PGMEA and 0.5 part by mass of AIBN was added dropwise for 1.5 hours and then heated and stirred for 3 hours. Then, to the mixture, a mixed solution of 0.10 parts by mass of AIBN and 10.0 parts by mass of PGMEA was added dropwise for 10 minutes and then further heated at the same temperature for 1 hour, thus obtaining a 26.0% by mass solution of the graft copolymer GP-1. As a result of GPC measurement, the thus-obtained graft copolymer GP-1 was found to have a mass average molecular weight (Mw) of 12,420, a number average molecular weight (Mn) of 4,980, a molecular weight distribution (Mw/Mn) of 2.49. The amine value was 118 mgKOH/g.

Synthesis Example 4

Synthesis of Graft Copolymer GP-2

First, 85.0 parts by mass of PGMEA was put in a reactor equipped with a cooling tube, an addition funnel, a nitrogen inlet, a mechanical stirrer and a digital thermometer. While stirring under a nitrogen flow, PGMEA was heated to 85° C. To this PGMEA, a mixed solution of 67.34 parts by mass (active solid content 33.33 parts by mass) of the macromonomer MM-1 solution of Synthesis Example 2, 8.33 parts by mass of 2-(dimethylamino)ethyl methacrylate, 8.33 parts by mass of 1-vinylimidazole, 1.24 parts by mass of n-dodecyl mercaptan, 20.0 parts by mass of PGMEA and 0.5 part by mass of AIBN was added dropwise for 1.5 hours and then heated and stirred for 3 hours. Then, to the mixture, a mixed solution of 0.10 part by mass of AIBN and 10.0 parts by mass of PGMEA was added dropwise for 10 minutes and then further heated at the same temperature for 1 hour, thus obtaining a 25.0% by mass solution of the graft copolymer GP-2. As a result of GPC measurement, the thus-obtained graft copolymer GP-2 was found to have a mass average molecular weight (Mw) of 12,430, a number average molecular weight (Mn) of 4,860, and a molecular weight distribution (Mw/Mn) of 2.56. The amine value was 159 mgKOH/g.

Synthesis Example 5

Synthesis of Organic Phosphonic Acid Ester Compound 1

First, 142.61 parts by mass of diethylene glycol ethyl methyl ether (EMDG), 50.00 parts by mass of phenylphosphonic acid (product name: PPA; manufactured by: Nissan Chemical Industries, Ltd.) and 0.10 part by mass of p-methoxyphenol were put in a reactor equipped with a cooling tube, an addition funnel, a nitrogen inlet, a mechanical stirrer and a digital thermometer. While stirring under a nitrogen flow, the mixture was heated to 120° C. To the mixture, 44.96 parts by mass of glycidyl methacrylate (GMA) was added dropwise for 30 minutes and then heated and stirred for 2 hours, thus obtaining a 40.0% by mass solution of the organic phosphonic acid ester compound 1, which contained an organic phosphonic acid monoester compound in which one of the two acidic groups of PPA was esterified with the epoxy group of GMA. The progress of the esterification reaction was confirmed by acid value measurement. The composition ratio of the resulting products was confirmed by $^{31}$P-NMR measurement. The acid value of the thus-obtained organic phosphonic acid ester compound 1 was found to be 190 mgKOH/g. The composition ratio between the organic phosphonic acid monoester compound, the organic phosphonic acid diester compound and PPA was found to be 55:23:22 (% by mass).

Synthesis Example 6

Synthesis of Organic Phosphonic Acid Ester Compound 2

First, 146.25 parts by mass of EMDG and 50.00 parts by mass of PPA were put in a reactor equipped with a cooling tube, an addition funnel, a nitrogen inlet, a mechanical stirrer and a digital thermometer. While stirring under a nitrogen flow, the mixture was heated to 120° C. To the mixture, 47.50 parts by mass of phenyl glycidyl ether (PGE) was added dropwise for 30 minutes and then heated and stirred for 2 hours, thus obtaining a 40.0% by mass solution of the organic phosphonic acid ester compound 2, which contained an organic phosphonic acid monoester compound in which one of the two acidic groups of PPA was esterified with the epoxy group of GPE. The acid value of the thus-obtained organic phosphonic acid ester compound 2 was found to be 185 mgKOH/g. The composition ratio between the organic phosphonic acid monoester compound, the organic phosphonic acid diester compound and PPA was found to be 50:25:25 (% by mass).

Synthesis Example 7

Synthesis of Organic Phosphonic Acid Ester Compound 3

First, 168.26 parts by mass of EMDG, 50.00 parts by mass of PPA and 0.10 part by mass of p-methoxyphenol were put in a reactor equipped with a cooling tube, an addition funnel, a nitrogen inlet, a mechanical stirrer and a digital thermometer. While stirring under a nitrogen flow, the mixture was heated to 120° C. To the mixture, 62.05 parts by mass of 3,4-epoxycyclohexyl methyl methacrylate (product name: CYCLOMER M100; manufactured by: DAICEL Chemical Industries, Ltd.) was added dropwise for 30 minutes and then heated and stirred for 2 hours, thus obtaining a 40.0% by mass solution of the organic phosphonic acid ester compound 3, which contained an organic phosphonic acid monoester compound in which one of the two acidic groups of PPA was esterified with the epoxy group of the CYCLOMER M100. The acid value of the thus-obtained organic phosphonic acid ester compound 3 was found to be 162 mgKOH/g. The composition ratio between the organic phosphonic acid monoester compound, the organic phosphonic acid diester compound and PPA was found to be 51:27:22 (% by mass).

Synthesis Example 8

Synthesis of Organic Phosphonic Acid Ester Compound 4

First, 155.93 parts by mass of EMDG, 50.00 parts by mass of PPA, and 0.10 part by mass of p-methoxyphenol were put in a reactor equipped with a cooling tube, an addition funnel, a nitrogen inlet, a mechanical stirrer and a digital thermometer. While stirring under a nitrogen flow, the mixture was heated to 120° C. To the mixture, 53.83 parts by mass of 3-methyl-3-oxetanylmethyl acrylate (product name: OXE-10; manufactured by: Osaka Organic Chemical Industry Ltd.) was added dropwise for 30 minutes and then heated and stirred for 2 hours, thus obtaining a 40.0% by mass solution of the organic phosphonic acid ester compound 4, which contained an organic phosphonic acid monoester compound in which one of the two acidic groups of PPA was esterified with the oxetane group of OXE-10. The acid value of the thus-obtained organic phosphonic acid ester compound 4 was found to be 175 mgKOH/g. The composition ratio between the organic phosphonic acid monoester compound, the organic phosphonic acid diester compound and PPA was found to be 55:24:21 (% by mass).

Synthesis Example 9

Synthesis of Organic Phosphonic Acid Ester Compound 5

First, 162.58 parts by mass of EMDG, 50.00 parts by mass of PPA and 0.10 part by mass of p-methoxyphenol were put in a reactor equipped with a cooling tube, an addition funnel, a nitrogen inlet, a mechanical stirrer and a digital thermometer. While stirring under a nitrogen flow, the mixture was heated to 120° C. To the mixture, 58.27 parts by mass of 3-methyl-3-oxetanylmethyl methacrylate (product name: OXE-30; manufactured by: Osaka Organic Chemical Industry Ltd.) was added dropwise for 30 minutes and then heated and stirred for 2 hours, thus obtaining a 40.0% by mass solution of the organic phosphonic acid ester compound 5, which contained an organic phosphonic acid monoester compound in which one of the two acidic groups of PPA were esterified with the oxetane groups of OXE-30. The acid value of the thus-obtained organic phosphonic acid ester compound 5 was found to be 166 mgKOH/g. The composition ratio between the organic phosphonic acid monoester compound, the organic phosphonic acid diester compound and PPA was found to be 54:23:22 (% by mass).

Production Example 1

Production of Dispersant Solution A

First, 35.94 parts by mass of PGMEA and 10.15 parts by mass (active solid content 6.09 parts by mass) of a tertiary amino group-containing block copolymer (block copolymer comprising at least one constitutional unit represented by the general formula (I) and at least one constitutional unit represented by the general formula (II)) (product name: BYK-LPN6919; manufactured by BYK Japan KK) (amine value: 120 mgKOH/g, solid content: 60% by mass) were dissolved in a 100 mL recovery flask. To the mixture, 9.78 parts by mass (active solid content: 3.91 parts by mass of) (1.0 molar equivalent relative to the tertiary amino groups of the block copolymer) of the organic phosphonic acid ester compound 1 of Synthesis Example 5, which contained the organic phosphonic acid monoester compound, was added and stirred at 40° C. for 30 minutes, thus producing a dispersant solution A (solid content 20%). At this time, a salt was formed by acid-base reaction of the amino group of the block copolymer with the acidic group of the organic phosphonic acid monoester compound 1.

Production Examples 2 to 13

Production of Dispersant Solutions B to M

Dispersant solutions B to M, in each of which a salt was formed by acid-base reaction of the copolymer with the acidic organophosphorous compound, were produced in the same manner as Production Example 1, except that the amounts used of the copolymer (block copolymer BYK-LPN6919, graft copolymers GP-1 and GP-2 of Synthesis Examples 3 and 4), the acidic organophosphorous compound (the organic phosphonic acid ester compounds 1 to 5 of Synthesis Example 5 to 9, dimethacryloyloxyethyl acid phosphate "Light Ester P-2M" manufactured by Kyoeisha Chemical Co., Ltd.), the phenylphosphonic acid ("PPA" manufactured by Nissan Chemical Industries, Ltd.) and PGMEA, were changed as shown in the following Table 1.

The amount added of the acidic organophosphorous compound was 1.0 molar equivalent, relative to the amino groups of the copolymer component.

TABLE 1

| | | | | Content (Active solid content) (Parts by mass) | | |
|---|---|---|---|---|---|---|
| Production Examples | Dispersant solution | Copolymer | Acidic organophosphorous compound | Copolymer | Acidic organophosphorous compound | Solvent |
| Production Example 1 | Dispersant solution A | BYK-LPN6919 | Organic phosphonic acid ester compound 1 | 10.15 (6.09) | 9.78 (3.91) | 30.07 |
| Production Example 2 | Dispersant solution B | BYK-LPN6919 | Organic phosphonic acid ester compound 2 | 10.04 (6.03) | 9.94 (3.97) | 30.02 |
| Production Example 3 | Dispersant solution C | BYK-LPN6919 | Organic phosphonic acid ester compound 3 | 9.48 (5.69) | 10.78 (4.31) | 29.74 |
| Production Example 4 | Dispersant solution D | BYK-LPN6919 | Organic phosphonic acid ester compound 4 | 9.79 (5.87) | 10.31 (4.13) | 29.90 |
| Production Example 5 | Dispersant solution E | BYK-LPN6919 | Organic phosphonic acid ester compound 5 | 9.62 (5.77) | 10.57 (4.23) | 29.81 |
| Production Example 6 | Dispersant solution F | BYK-LPN6919 | Light Ester P-2M | 10.62 (6.37) | 3.63 | 35.75 |
| Production Example 7 | Dispersant solution G | BYK-LPN6919 | PPA 1 eq. | 12.45 (7.47) | 2.53 | 35.02 |
| Production Example 8 | Dispersant solution H | Graft copolymer GP-1 | Organic phosphonic acid ester compound 1 | 23.50 (6.11) | 9.72 (3.89) | 16.78 |
| Production Example 9 | Dispersant solution I | Graft copolymer GP-2 | Organic phosphonic acid ester compound 1 | 21.62 (5.41) | 11.49 (4.59) | 16.89 |
| Production Example 10 | Dispersant solution J | Graft copolymer GP-1 | Organic phosphonic acid ester compound 2 | 23.26 (6.05) | 9.88 (3.95) | 16.86 |
| Production Example 11 | Dispersant solution K | Graft copolymer GP-1 | Organic phosphonic acid ester compound 3 | 21.96 (5.71) | 10.72 (4.29) | 17.31 |

TABLE 1-continued

| Production Examples | Dispersant solution | Copolymer | Acidic organophosphorous compound | Content (Active solid content) (Parts by mass) | | Solvent |
| --- | --- | --- | --- | --- | --- | --- |
| | | | | Copolymer | Acidic organophosphorous compound | |
| Production Example 12 | Dispersant solution L | Graft copolymer GP-1 | Light Ester P-2M | 24.59 (6.39) | 3.61 | 21.80 |
| Production Example 13 | Dispersant solution M | Graft copolymer GP-1 | PPA 1 eq. | 28.81 (7.49) | 2.51 | 18.68 |

Example 1

(1) Production of Blue Color Material Dispersion Liquid 1

First, 10.0 parts by mass of C.I. Pigment Blue 1 (triphenylmethane lake pigment), which is a lake pigment that serves as a color material, 9.09 parts by mass (solid content equivalent 4.00 parts by mass) of the binder resin A synthesized in Synthesis Example 1, 20.00 parts by mass (solid content equivalent 4.00 parts by mass) of the dispersant solution A produced in Production Example 1, and 60.91 parts by mass of PGMEA were mixed. The mixture was subjected to pre-dispersion for 1 hour with a paint shaker (manufactured by Asada Iron Works Co., Ltd.) using 2 mm zirconia beads. Then, the mixture was further subjected to main dispersion for two hours with the paint shaker using 0.1 mm zirconia beads, thus obtaining the blue color material dispersion liquid 1.

(2) Production of Blue Photosensitive Resin Composition 1

First, 26.67 parts by mass of the blue color material dispersion liquid 1 obtained above under "(1) Production of blue color material dispersion liquid 1", 28.00 parts by mass of the following binder composition A, 45.33 parts by mass of PGMEA, 0.04 part by mass of R08MH (a surfactant manufacture by DIC Corporation) and 0.4 part by mass of KBM503 (a silane coupling agent manufactured by Shin-Etsu Chemical Co., Ltd.) were mixed. The mixture was subjected to pressure filtration, thus obtaining the blue photosensitive resin composition 1.

<Binder Composition A (Solid Content 40%)>
  Alkali soluble resin (the binder resin A of Synthesis Example 1, solid content 44% by mass): 27.27 parts by mass
  Pentafunctional or hexafunctional acrylate monomer (product name: ARONIX M403; manufactured by TOAGOSEI Co., Ltd.): 24.00 parts by mass
  Photopolymerization initiator: 2-methyl-1[4-(methylthio) phenyl]-2-morpholinopropane-1-one (product name: Irgacure 907; manufactured by: BASF): 3.00 parts by mass
  Photosensitizer: 2,4-diethylthioxanthone (product name: KAYACURE DETX-S; manufactured by Nippon Kayaku Co., Ltd.): 1.00 part by mass
  Solvent: propylene glycol monomethyl ether acetate (PGMEA): 44.73 parts by mass Examples 2 to 5

Blue color material dispersion liquids 2 to 5 and blue photosensitive resin compositions 2 to 5 were produced in the same manner as Example 1, except that the dispersant solution A used under "(1) Production of blue color material dispersion liquid 1" was changed to dispersant solutions B to E.

Comparative Examples 1 and 2

Comparative blue color material dispersion liquids 1 and 2 and comparative blue photosensitive resin compositions 1 and 2 were produced in the same manner as Example 1, except that the dispersant solution A used under "(1) Production of blue color material dispersion liquid 1" was changed to dispersant solutions F and G.

Examples 6 and 7

Blue color material dispersion liquids 6 and 7 and blue photosensitive resin compositions 6 and 7 were produced in the same manner as Example 1, except that the dispersant solution A used under "(1) Production of blue color material dispersion liquid 1" was changed to dispersant solutions H and I.

Comparative Examples 3 and 4

Comparative blue color material dispersion liquids 3 and 4 and comparative blue photosensitive resin compositions 3 and 4 were produced in the same manner as Example 1, except that the dispersant solution A used under "(1) Production of blue color material dispersion liquid 1" was changed to dispersant solutions L and M.

Comparative Examples 5

A comparative blue color material dispersion liquid 5 and a comparative blue photosensitive resin composition 5 were produced in the same manner as Example 1, except that the dispersant solution A used under "(1) Production of blue color material dispersion liquid 1" was changed to 10.00 parts by mass (active solid content 4.00 parts by mass) of BYK-LPN21116 (a quaternary ammonium salt type acrylic block copolymer manufactured by BYK Japan KK, solid content 40% by mass) and the amount used of PGMEA was changed to 70.91 parts by mass.

(Evaluation)
<Color Material Dispersion Stability>

To evaluate color material dispersion stability, the blue color material dispersion liquids obtained in Examples and Comparative Examples were left to stand at 40° C. for one week. The average particle diameter of pigment particles in the color material dispersion liquids and the shearing viscosity of the color material dispersion liquids were measured before and after the still standing. To measure the average particle diameter, a Nanotrac particle size analyzer "UPA-EX150" (manufactured by Nikkiso Co., Ltd.) was used. For viscosity measurement, "Rheometer MCR301" manufactured by Anton Paar was used to measure the shearing viscosity at a shearing rate of 60 rpm. The results are shown in Table 2.

TABLE 2

| Examples | Pigment | Dispersant | Pigment dispersant Modifying agent | Modified amount | Dispersion stability After dispersant Particle diameter (nm) | Viscosity (mPa · s) | 40° C. for 1 week Particle diameter (nm) | Viscosity (mPa · s) |
|---|---|---|---|---|---|---|---|---|
| Example 1 | PB1 | LPN6919 | PPA-GMA | 1 | 110 | 3.2 | 118 | 3.3 |
| Example 2 | PB1 | LPN6919 | PPA-GPE | 1 | 112 | 3.2 | 120 | 3.4 |
| Example 3 | PB1 | LPN6919 | PPA-CM100 | 1 | 113 | 3.1 | 112 | 3.0 |
| Example 4 | PB1 | LPN6919 | PPA-OEX10 | 1 | 116 | 3.5 | 117 | 3.4 |
| Example 5 | PB1 | LPN6919 | PPA-OEX30 | 1 | 121 | 3.6 | 122 | 3.7 |
| Comparative Example 1 | PB1 | LPN6919 | P-2M | 1 | 121 | 3.5 | 162 | 5.1 |
| Comparative Example 2 | PB1 | LPN6919 | PPA | 1 | Gelled | | — | — |
| Example 6 | PB1 | DMA-g-MM102 | PPA-GMA | 1 | 160 | 3.7 | 158 | 3.9 |
| Example 7 | PB1 | VI/DMA-g-MM102 | PPA-GMA | 1 | 162 | 4.3 | 161 | 4.5 |
| Comparative Example 3 | PB1 | DMA-g-MM102 | P-2M | 1 | 161 | 4.3 | 185 | 5.2 |
| Comparative Example 4 | PB1 | DMA-g-MM102 | PPA | 1 | 171 | 5.2 | Gelled | |
| Comparative Example 5 | PB1 | | N21116 | | 119 | 3.7 | 121 | 3.7 |

<Evaluation of Optical Performance and Heat Resistance>

Each of the blue photosensitive resin compositions obtained in Examples and Comparative Examples was applied onto a glass substrate having a thickness of 0.7 mm ("OA-10G" manufactured by Nippon Electric Glass Co., Ltd.) by use of a spin coater, heated and dried on a hot plate at 80° C. for 3 minutes, and then exposed to 60 mJ/cm² UV irradiation with an ultrahigh pressure mercury lamp, thereby obtaining a cured film (blue color layer). The film thickness was adjusted so that the film has the target chromaticity y=0.095 after dried and cured. The contrast, chromaticity (x, y), luminance (Y) and L, a, b ($L_0$, $a_0$, $b_0$) of the thus-obtained glass substrate having the color layer formed thereon was measured with a contrast measuring device "CT-1B" (manufactured by Tsubosaka Electric Co., Ltd.) and a microscopic spectrophotometer OSP-SP200 (manufactured by Olympus Corporation). The glass substrate having the color layer formed thereon was post-baked in a clean oven at 170° C. for 30 minutes. Then, the chromaticity (x, y), luminance (Y) and L, a, b ($L_1$, $a_1$, $b_1$) of the thus-obtained color layer were measured again.

For evaluation of heat resistance, color difference before and after the post-baking (ΔEab) was calculated by the following equation:

$$\Delta Eab = \{(L_1-L_0)^2 + (a_1-a_0)^2 + (b_1-b_0)^2\}^{1/2}$$

Comparative Example 2 could not be evaluated since the color material dispersion liquid was gelled.

The results are shown in Table 3.

<Hydrolysis Resistance>

Each of the blue photosensitive resin compositions obtained in Examples and Comparative Examples was applied onto a glass substrate having a thickness of 0.7 mm, by use of a spin coater, and then heated and dried on a hot plate at 80° C. for 3 minutes. The thus-obtained color layer was exposed to 60 mJ/cm² UV irradiation with an ultrahigh pressure mercury lamp, through a photomask with a 80 μm line-and-space (stripe) pattern. Then, the glass substrate having the color layer formed thereon was subjected to shower development for 60 seconds, using a 0.05% by mass potassium hydroxide aqueous solution as alkaline developer, and washed with ultrapure water for 60 seconds, and then post-baked in a clean oven at 170° C. for 30 minutes.

The thus-obtained glass substrate having a color pattern formed thereon, was immersed in a 5.0% by mass sodium hydroxide aqueous solution kept at 40° C., and then measured for the time until the color pattern was removed from the glass substrate. Comparative Example 2 could not be evaluated since the color material dispersion liquid was gelled.

The results are shown in Table 3.

TABLE 3

| Examples | Optical performance Before post-baking | | | | After post-baking at 170° C. | | | Heat Resistance | Hydrolysis resistance |
|---|---|---|---|---|---|---|---|---|---|
| | x | y | Y | Contrast | x | y | Y | ΔEab | min |
| Example 1 | 0.142 | 0.096 | 13.0 | 4910 | 0.144 | 0.101 | 13.4 | 4.5 | 17 |
| Example 2 | 0.142 | 0.097 | 13.1 | 5130 | 0.144 | 0.102 | 13.5 | 4.3 | 17 |
| Example 3 | 0.143 | 0.096 | 13.0 | 4830 | 0.144 | 0.101 | 13.4 | 4.5 | 15 |
| Example 4 | 0.143 | 0.096 | 12.9 | 4960 | 0.144 | 0.100 | 13.2 | 3.9 | 14 |

TABLE 3-continued

| | Optical performance | | | | | | | Heat Resistance ΔEab | Hydrolysis resistance min |
|---|---|---|---|---|---|---|---|---|---|
| | Before post-baking | | | | After post-baking at 170° C. | | | | |
| Examples | x | y | Y | Contrast | x | y | Y | | |
| Example 5 | 0.143 | 0.097 | 13.1 | 5010 | 0.145 | 0.102 | 13.6 | 4.5 | 15 |
| Comparative Example 1 | 0.142 | 0.096 | 13.1 | 4630 | 0.144 | 0.101 | 13.4 | 4.2 | 7 |
| Comparative Example 2 | — | — | — | — | — | — | — | — | — |
| Example 6 | 0.142 | 0.094 | 12.7 | 5150 | 0.144 | 0.099 | 13.0 | 4.5 | 17 |
| Example 7 | 0.142 | 0.096 | 12.9 | 4780 | 0.143 | 0.099 | 13.0 | 3.2 | 16 |
| Comparative Example 3 | 0.143 | 0.096 | 12.9 | 4430 | 0.143 | 0.099 | 13.0 | 3.2 | 7 |
| Comparative Example 4 | 0.143 | 0.097 | 13.2 | 3740 | 0.144 | 0.102 | 13.6 | 4.6 | 14 |
| Comparative Example 5 | 0.142 | 0.095 | 12.8 | 4410 | 0.147 | 0.110 | 14.8 | 13.5 | 16 |

Example 8

(1) Production of Blue Color Material Dispersion Liquid 8

First, 10.0 parts by mass of C.I. Pigment Blue 61 (triphenylmethane lake pigment), which is a lake pigment that serves as a color material, 9.09 parts by mass (solid content equivalent 4.00 parts by mass) of the binder resin A synthesized in Synthesis Example 1, 20.00 parts by mass (solid content equivalent 4.00 parts by mass) of the dispersant solution A produced in Production Example 1, and 60.91 parts by mass of PGMEA were mixed. The mixture was subjected to pre-dispersion for 1 hour with a paint shaker (manufactured by Asada Iron Works Co., Ltd.) using 2 mm zirconia beads. Then, the mixture was further subjected to main dispersion for two hours with the paint shaker using 0.1 mm zirconia beads, thus obtaining the blue color material dispersion liquid 8.

(2) Production of Blue Photosensitive Resin Composition 8

First, 26.67 parts by mass of the blue color material dispersion liquid 8 obtained above under "(1) Production of blue color material dispersion liquid 8", 28.00 parts by mass of the binder composition A, 45.33 parts by mass of PGMEA, 0.04 part by mass of R08MH (a surfactant manufacture by DIC Corporation) and 0.4 part by mass of KBM503 (a silane coupling agent manufactured by Shin-Etsu Chemical Co., Ltd.) were mixed. The mixture was subjected to pressure filtration, thus obtaining the blue photosensitive resin composition 8.

Examples 9 to 12

Blue color material dispersion liquids 9 to 12 and blue photosensitive resin compositions 9 to 12 were produced in the same manner as Example 8, except that the dispersant solution A used under "(1) Production of blue color material dispersion liquid 8" was changed to dispersant solutions H to K.

Comparative Examples 6 to 9

Comparative blue color material dispersion liquids 6 to 9 and comparative blue photosensitive resin compositions 6 to 9 were produced in the same manner as Example 8, except that the dispersant solution A used under "(1) Production of blue color material dispersion liquid 8" was changed to dispersant solutions F, G, L and M.

Comparative Example 10

A comparative blue color material dispersion liquid 10 and a comparative blue photosensitive resin composition 10 were produced in the same manner as Example 8, except that the dispersant solution A used under "(1) Production of blue color material dispersion liquid 8" was changed to 10.00 parts by mass (active solid content 4.00 parts by mass) of BYK-LPN21116 (a quaternary ammonium salt type acrylic block copolymer manufactured by BYK Japan KK, solid content 40% by mass) and the amount used of PGMEA was changed to 70.91 parts by mass.

<Color Material Dispersion Stability>

The blue color material dispersion liquids obtained in Examples and Comparative Examples were evaluated for color material dispersion stability, in the same manner as Example 1. The results are shown in Table 4.

TABLE 4

| | | | Pigment dispersant | | Dispersion stability | | | |
|---|---|---|---|---|---|---|---|---|
| | | | | | After dispersion | | 40° C. for 1 week | |
| Examples | Pigment | Dispersant | Modifying agent | Modified Amount | Particle diameter (nm) | Viscosity (mPa·s) | Particle diameter (nm) | Viscosity (mPa·s) |
| Example 8 | PB61 | LPN6919 | PPA-GMA | 1 | 105 | 3.4 | 106 | 3.2 |
| Comparative Example 6 | PB61 | LPN6919 | P-2M | 1 | 106 | 3.3 | 103 | 3.2 |
| Comparative Example 7 | PB61 | LPN6919 | PPA | 1 | 145 | 5.2 | 141 | 5.1 |

TABLE 4-continued

| | | Pigment dispersant | | | Dispersion stability | | | |
| --- | --- | --- | --- | --- | --- | --- | --- | --- |
| | | | | | After dispersion | | 40° C. for 1 week | |
| | | | | | Particle | | Particle | |
| Examples | Pigment | Dispersant | Modifying agent | Modified Amount | diameter (nm) | Viscosity (mPa · s) | diameter (nm) | Viscosity (mPa · s) |
| Example 9 | PB61 | DMA-g-MM102 | PPA-GMA | 1 | 101 | 3.4 | 99 | 3.2 |
| Example 10 | PB61 | VI/DMA-g-MM102 | PPA-GMA | 1 | 104 | 3.4 | 100 | 3.3 |
| Example 11 | PB61 | DMA-g-MM102 | PPA-GPE | 1 | 110 | 3.3 | 110 | 3.2 |
| Example 12 | PB61 | DMA-g-MM102 | PPA-CM100 | 1 | 110 | 3.3 | 111 | 3.3 |
| Comparative Example 8 | PB61 | DMA-g-MM102 | P-2M | 1 | 105 | 3.4 | 105 | 3.3 |
| Comparative Example 9 | PB61 | DMA-g-MM102 | PPA | 1 | 135 | 3.9 | 148 | 5.5 |
| Comparative Example 10 | PB61 | | N21116 | | 110 | 4.0 | 111 | 4.1 |

The blue photosensitive resin compositions obtained in Examples and Comparative Examples were evaluated for optical performance, heat resistance and hydrolysis resistance, in the same manner as Example 1. In Examples 8 to 12 and Comparative Examples 6 to 10, the film thickness was adjusted so that the film has the target chromaticity y=0.060 after dried and cured. The results are shown in Table 5.

TABLE 5

| | Optical performance | | | | | | | Heat | Hydrolysis |
| --- | --- | --- | --- | --- | --- | --- | --- | --- | --- |
| | Before post-baking | | | | After post-baking at 170° C. | | | Resistance | resistance |
| Examples | x | y | Y | Contrast | x | y | Y | ΔEab | min |
| Example 8 | 0.145 | 0.059 | 5.5 | 4320 | 0.146 | 0.064 | 6.1 | 4.9 | 17 |
| Comparative Example 6 | 0.145 | 0.060 | 5.5 | 4130 | 0.146 | 0.065 | 6.1 | 5.0 | 6 |
| Comparative Example 7 | 0.145 | 0.061 | 5.6 | 3875 | 0.147 | 0.068 | 6.5 | 7.2 | 18 |
| Example 9 | 0.145 | 0.060 | 5.6 | 4740 | 0.146 | 0.065 | 6.1 | 4.8 | 17 |
| Example 10 | 0.145 | 0.060 | 5.5 | 4850 | 0.146 | 0.063 | 5.8 | 2.9 | 17 |
| Example 11 | 0.145 | 0.060 | 5.5 | 4590 | 0.146 | 0.065 | 6.0 | 4.6 | 18 |
| Example 12 | 0.145 | 0.060 | 5.6 | 4540 | 0.146 | 0.065 | 6.1 | 4.9 | 18 |
| Comparative Example 8 | 0.145 | 0.060 | 5.6 | 4720 | 0.146 | 0.065 | 6.1 | 4.2 | 5 |
| Comparative Example 9 | 0.145 | 0.060 | 5.6 | 3890 | 0.146 | 0.068 | 6.5 | 6.9 | 17 |
| Comparative Example 10 | 0.145 | 0.061 | 5.6 | 3640 | 0.149 | 0.078 | 8.0 | 15.1 | 13 |

Example 13

(1) Production of Blue Color Material Dispersion Liquid 13

A triarylmethane compound laked with a Keggin type $(SiMoW_{11}O_{40})^{4-}$ heteropolyoxometalate (hereinafter may be referred to as blue lake pigment A) was synthesized with reference to Example 1 disclosed in International Publication No. WO 2012/039417.

Then, 13.0 parts by mass of the thus-obtained blue lake pigment A, 13.30 parts by mass (solid content equivalent 5.85 parts by mass) of the binder resin A synthesized in Synthesis Example 1, 22.75 parts by mass (solid content equivalent 4.55 parts by mass) of the dispersant solution A synthesized in Synthesis Example 1, and 50.95 parts by mass of PGMEA were mixed. The mixture was subjected to pre-dispersion for 1 hours with a paint shaker (manufactured by Asada Iron Works Co., Ltd.) using 2 mm zirconia beads. Then, the mixture was further subjected to main dispersion for 6 hours with the paint shaker using 0.1 mm zirconia beads, thus obtaining the blue color material dispersion liquid 13.

(2) Production of Blue Photosensitive Resin Composition 13

First, 15.30 parts by mass of the blue color material dispersion liquid 13 obtained above under "(1) Production of blue color material dispersion liquid 13", 31.05 parts by mass of the binder composition A, 53.65 parts by mass of PGMEA, 0.04 part by mass of R08MH (a surfactant manufactured by DIC Corporation), and 0.4 part by mass of KBM503 (a silane coupling agent manufactured by Shin-Etsu Chemical Co., Ltd.) were mixed. The mixture was subjected to pressure filtration, thus obtaining the blue photosensitive resin composition 13.

Example 14

A blue color material dispersion liquid 14 and a photosensitive resin composition 14 were produced in the same manner as Example 13, except that the dispersant solution A used under "(1) Production of blue color material dispersion liquid 13" was changed to a dispersant solution B.

Comparative Examples 11 and 12

Comparative blue color material dispersion liquids 11 and 12 and comparative blue photosensitive resin compositions 11 and 12 were produced in the same manner as Example 13, except that the dispersant solution A used under "(1) Production of blue color material dispersion liquid 13" was changed to dispersant solutions F and G.

Comparative Example 13

A comparative blue color material dispersion liquid 13 and a comparative blue photosensitive resin composition 13 were produced in the same manner as Example 13, except that the dispersant solution A used under "(1) Production of blue color material dispersion liquid 13" was changed to 11.38 parts by mass (active solid content 4.55 parts by mass) of BYK-LPN21116 (a quaternary ammonium salt type acrylic block copolymer manufactured by BYK Japan KK, solid content 40% by mass) and the amount used of PGMEA was changed to 62.33 parts by mass.

<Color Material Dispersion Stability>

The blue color material dispersion liquids of Examples and Comparative Examples were evaluated for color material dispersion stability, in the same manner as Example 1. The results are shown in Table 6.

Example 15

(1) Production of Red Color Material Dispersion Liquid 1

First, 10.0 parts by mass of C.I. Pigment Red 254 (PR254), which is a red pigment that serves as a color material, 9.09 parts by mass (solid content equivalent 4.00 parts by mass) of the binder resin A produced in Synthesis Example 1, 20.00 parts by mass (solid content equivalent 4.00 parts by mass) of the dispersant solution A produced in Production Example 1, and 60.91 part by mass of PGMEA were mixed. The mixture was subjected to pre-dispersion for 1 hour with a paint shaker (manufactured by Asada Iron Works Co., Ltd.) using 2 mm zirconia beads. Then, the mixture was further subjected to main dispersion for 4 hours using 0.1 mm zirconia beads, thus obtaining the red color material dispersion liquid 1.

(2) Production of Red Photosensitive Resin Composition 1

First, 60.0 parts by mass of the red color material dispersion liquid 1 obtained above under "(1) Production of red color material dispersion liquid 1", 18.0 parts by mass of the

TABLE 6

| | | Pigment dispersant | | | Dispersion stability | | | |
| | | | | | After dispersion | | 40° C. for 1 week | |
| Examples | Pigment | Dispersant | Modifying agent | Modified amount | Particle diameter (nm) | Viscosity (mPa · s) | Particle diameter (nm) | Viscosity (mPa · s) |
|---|---|---|---|---|---|---|---|---|
| Example 13 | Blue lake pigment A | LPN6919 | PPA + GMA | 1 | 93 | 4.6 | 88 | 4.4 |
| Example 14 | Blue lake pigment A | LPN6919 | PPA + GPE | 1 | 92 | 4.8 | 89 | 4.5 |
| Comparative Example 11 | Blue lake pigment A | LPN6919 | P-2M | 1 | 95 | 5.0 | 92 | 4.7 |
| Comparative Example 12 | Blue lake pigment A | LPN6919 | PPA | 1 | Gelled | | — | — |
| Comparative Example 13 | Blue lake pigment A | | N21116 | | 99 | 6.4 | 93 | 5.3 |

The blue photosensitive resin compositions obtained in Examples and Comparative Examples were evaluated for optical performance, heat resistance and hydrolysis resistance, in the same manner as Example 1. In Examples 13 and 14 and Comparative Examples 11 to 13, the film thickness was adjusted so that the film has the target chromaticity y=0.100 after dried and cured. Then, the film was post-baked in a clean oven at 200° C. for 30 minutes. The results are shown in Table 7.

binder composition A, which is the same binder composition as Example 1, 22.0 parts by mass of PGMEA, 0.04 part by mass of R08MH (a surfactant manufactured by DIC Corporation), and 0.4 part by mass of KBM503 (a silane coupling agent manufactured by Shin-Etsu Chemical Co., Ltd.) were mixed. Then mixture was subjected to pressure filtration, thus obtaining the red photosensitive resin composition 1.

TABLE 7

| | Optical performance | | | | | | | Heat resistance | Hydrolysis resistance |
| | Before post-baking | | | | After post-baking at 200° C. | | | | |
| Examples | x | y | Y | Contrast | x | Y | Y | ΔEab | Min |
|---|---|---|---|---|---|---|---|---|---|
| Example 13 | 0.142 | 0.100 | 13.8 | 4653 | 0.147 | 0.106 | 14.8 | 4.2 | 27 |
| Example 14 | 0.142 | 0.101 | 14.1 | 4595 | 0.148 | 0.107 | 15.2 | 4.2 | 27 |
| Comparative Example 11 | 0.142 | 0.100 | 13.9 | 4582 | 0.146 | 0.105 | 14.6 | 3.5 | 4 |
| Comparative Example 12 | — | — | — | — | — | — | — | — | — |
| Comparative Example 13 | 0.142 | 0.100 | 13.9 | 4398 | 0.155 | 0.127 | 18.8 | 17.5 | 22 |

Comparative Examples 14 and 15

Comparative red color material dispersion liquids 1 and 2 and comparative red photosensitive resin compositions 1 and 2 were produced in the same manner as Example 15, except that the dispersant solution A used under "(1) Production of red color material dispersion liquid 1" was changed to dispersant solutions F and G.

Example 16

(1) Production of Red Color Material Dispersion Liquid 2

First, 10.0 parts by mass of C.I. Pigment Red 177 (PR177), which is a red pigment that serves as a color material, 9.09 parts by mass (solid content equivalent 4.00 parts by mass) of the binder resin A produced in Synthesis Example 1, 20.00 parts by mass (solid content equivalent 4.00 parts by mass) of dispersant solution A produced in Production Example 1, and 60.91 parts by mass of PGMEA were mixed. The mixture was subjected to pre-dispersion for 1 hour with a paint shaker (manufactured by Asada Iron Works Co., Ltd.) using 2 mm zirconia beads. Then, the mixture was further subjected to main dispersion for 4 hours using 0.1 mm zirconia beads, thus obtaining the red color material dispersion liquid 2.

(2) Production of Red Photosensitive Resin Composition 2

First, 60.0 parts by mass of the red color material dispersion liquid 2 obtained above under "(1) Production of red color material dispersion liquid 2", 18.0 parts by mass of the binder composition A, which is the same binder composition as Example 1, 22.0 parts by mass of PGMEA, 0.04 part by mass of R08MH (a surfactant manufactured by DIC Corporation), and 0.4 part by mass of KBM503 (a silane coupling agent manufactured by Shin-Etsu Chemical Co., Ltd.) were mixed. The mixture was subjected to pressure filtration, thus obtaining the red photosensitive resin composition 2.

Comparative Examples 16 and 17

Comparative red color material dispersion liquids 3 and 4 and comparative red photosensitive resin compositions 3 and 4 were produced in the same manner as Example 16, except that the dispersant solution A used under "(1) Production of red color material dispersion liquid 2" was changed to dispersant solutions F and G.

The red color material dispersion liquids obtained in Examples and Comparative Examples were evaluated for color material dispersion stability, in the same manner as Example 1. The results are shown in Table 8.

The red photosensitive resin compositions obtained in Examples and Comparative Examples were evaluated for optical performance, heat resistance and hydrolysis resistance, in the same manner as Example 1. In Example 15 and Comparative Examples 14 and 15, the film thickness was adjusted so that the film has the target chromaticity x=0.650 after dried and cured. Then, the film was post-baked in a clean oven at 230° C. for 30 minutes. In Examples 16 and Comparative Examples 16 and 17, the film thickness was adjusted so that the film has the target chromaticity x=0.630 after dried and cured. Then, the film was post-baked in a clean oven at 230° C. for 30 minutes. The results are shown in Table 9.

TABLE 8

| | | Pigment dispersant | | | Dispersion stability | | | |
| | | | | | After dispersion | | 40° C. for 1 week | |
| Examples | Pigment | Dispersant | Modifying agent | Modified amount | Particle diameter (nm) | Viscosity (mPa·s) | Particle diameter (nm) | Viscosity (mPa·s) |
| --- | --- | --- | --- | --- | --- | --- | --- | --- |
| Example 15 | PR254 | LPN6919 | PPA-GMA | 1 | 52 | 3.3 | 48 | 3.3 |
| Comparative Example 14 | PR254 | LPN6919 | P-2M | 1 | 49 | 3.3 | 50 | 3.4 |
| Comparative Example 15 | PR254 | LPN6919 | PPA | 1 | Gelled | | — | — |
| Example 16 | PR177 | LPN6919 | PPA-GMA | 1 | 46 | 3.4 | 43 | 3.3 |
| Comparative Example 16 | PR177 | LPN6919 | P-2M | 1 | 45 | 3.6 | 42 | 3.5 |
| Comparative Example 17 | PR177 | LPN6919 | PPA | 1 | Gelled | | — | — |

TABLE 9

| | Optical performance | | | | | | | Heat resistance | Hydrolysis resistance |
| | Before post-baking | | | | After post-baking at 230° C. | | | | |
| Examples | x | Y | Y | Contrast | x | y | Y | ΔEab | min |
| --- | --- | --- | --- | --- | --- | --- | --- | --- | --- |
| Example 15 | 0.650 | 0.3336 | 21.13 | 2680 | 0.646 | 0.335 | 21.9 | 1.0 | 28 |
| Comparative Example 14 | 0.650 | 0.3337 | 21.15 | 2710 | 0.647 | 0.335 | 21.9 | 1.0 | 3 |
| Comparative Example 15 | — | — | — | — | — | — | — | — | — |
| Example 16 | 0.629 | 0.2973 | 16.25 | 8120 | 0.626 | 0.298 | 16.3 | 1.0 | 26 |
| Comparative Example 16 | 0.629 | 0.2973 | 16.24 | 8090 | 0.626 | 0.297 | 16.2 | 1.0 | 2 |
| Comparative Example 17 | — | — | — | — | — | — | — | — | — |

CONCLUSION

From the results shown in Tables 2 to 9, it is clear that the color material dispersion liquids of Examples 1 to 16, which were obtained by using the non-aqueous dispersant of the present invention, do not cause viscosity increase and are excellent in dispersibility and dispersion stability, even in the case of increasing the amount of salt formed in the dispersant. It is also clear that the photosensitive resin compositions of Examples 1 to 16, which were obtained by using the non-aqueous dispersant of the present invention, are able to form a resin layer with increased contrast and excellent hydrolysis resistance.

Especially, the coating films obtained by using the photosensitive resin compositions of Examples 1 to 14, each of which compositions was obtained by dispersing the lake pigment, which is generally low in heat resistance, by use of the non-aqueous dispersant of the present invention, have been found to show a small change in chromaticity after post-baking and to be excellent in heat resistance, even though they are resin layers with increased contrast and excellent hydrolysis resistance.

Meanwhile, it is clear from Comparative Examples 1, 3, 6, 8, 11, 14 and 16 that hydrolysis resistance is inferior in the case of using the dispersant in which salt was formed by the phosphoric diester compound only.

From Comparative Examples 2, 4, 7, 9, 12, 15 and 17, it is clear that in the case of using the dispersant in which salt was formed by the organic phosphonic acid only, not only dispersibility and dispersion stability but also contrast are deteriorated when the amount of salt formed is large. It is also clear that the effect of increasing heat resistance when used in combination with the lake pigment is deteriorated depending on the lake pigment used in combination.

From Comparative Examples 5, 10 and 13, it is clear that in the case of using the dispersant containing the quaternary ammonium salt, contrast is inferior, and when used in combination with the lake pigment, a large change in chromaticity is obtained after post-baking, and heat resistance is inferior.

REFERENCE SIGNS LIST

1. Transparent substrate
2. Light shielding part
3. Color layer
10. Color filter
20. Counter substrate
30. Liquid crystal layer
40. Liquid crystal display device
50. Organic protection layer
60. Inorganic oxide layer
71. Transparent anode
72. Positive hole injection layer
73. Positive hole transport layer
74. Light-emitting layer
75. Electron injection layer
76. Cathode
80. Organic light-emitting material
100. Organic light-emitting display device

The invention claimed is:

1. A non-aqueous dispersant which is a graft copolymer comprising at least one constitutional unit represented by the following general formula (I), wherein at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid:

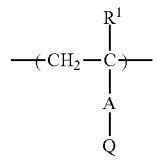

(I)

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

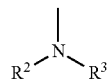

(I-a)

wherein $R^2$ and $R^3$ each independently represent a hydrogen atom or a hydrocarbon group which can contain a hetero atom, and $R^2$ and $R^3$ can be the same as or different from each other.

2. The non-aqueous dispersant according to claim 1, wherein the graft copolymer is a graft copolymer in which at least one nitrogen-containing monomer represented by the following general formula (I') and a polymerizable oligomer comprising a polymer chain having at least one of constitutional units represented by the following general formulae (III) and (IV) and a group having an ethylenically unsaturated double bond at a terminal of the chain, are contained as copolymerizable components, and in which at least part of nitrogen sites of the constitutional units represented by the general formula (I) derived from the nitrogen-containing monomers each form a salt with the acidic organophosphorous compound:

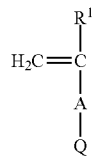

(I')

wherein $R^1$ is a hydrogen atom or methyl group; A is a direct bond or divalent linking group; and Q is a group represented by the following general formula (I-a) or a nitrogen-containing heterocyclic group which is able to form a salt with an acid and which can have a substituent group;

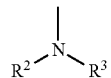

(I-a)

wherein $R^2$ and $R^3$ each independently represent a hydrogen atom or a hydrocarbon group which can contain a hetero atom, and $R^2$ and $R^3$ can be the same as or different from each other;

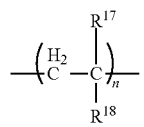 (III)

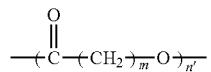 (IV)

wherein $R^{17}$ is a hydrogen atom or a methyl group; $R^{18}$ is a hydrocarbon group, a cyano group or a monovalent group described by $-[CH(R^{19})-CH(R^{20})-O]_x-R^{21}$, $-[(CH_2)_y-O]_z-R^{21}$, $-[CO-(CH_2)_y-O]_z-R^{21}$, $-CO-O-R^{22}$ or $-O-CO-R^{23}$; $R^{19}$ and $R^{20}$ each independently represent a hydrogen atom or a methyl group; $R^{21}$ is a hydrogen atom, a hydrocarbon group or a monovalent group described by a $-CHO$, $-CH_2CHO$ or $-CH_2COOR^{24}$; $R^{22}$ is a hydrocarbon group, a cyano group or a monovalent group described by $-[CH(R^{19})-CH(R^{20})-O]_x-R^{21}$, $-[(CH_2)_y-O]_z-R^{21}$ or $-[CO-(CH_2)_y-O]_z-R^{21}$; $R^{23}$ is an alkyl group having 1 to 18 carbon atoms; $R^{24}$ is a hydrogen atom or an alkyl group having 1 to 5 carbon atoms; all the hydrocarbon groups can have a substituent group each; m is an integer of 1 to 5; n and n' are each an integer of 5 to 200; x is an integer of 1 to 18; y is an integer of 1 to 5; and z is an integer of 1 to 18.

3. The non-aqueous dispersant according to claim 1, wherein the acidic organophosphorous compound contains at least one of organic phosphoric acid monoester compounds represented by the following general formulae (V) and (VI):

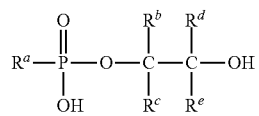 (V)

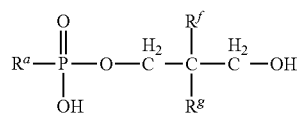 (VI)

wherein $R^a$ is a hydrocarbon group or a monovalent group described by $-[CH(R^h)-CH(R^i)-O]_s-R^j$ or $-[(CH_2)_t-O]_u-R^j$; $R^h$ and $R^i$ each independently represent a hydrogen atom or a methyl group; $R^j$ is a hydrogen atom, a hydrocarbon group or a monovalent group described by $-CHO$, $-CH_2CHO$, $-CO-CH=CH_2$, $-CO-C(CH_3)=CH_2$ or $-CH_2COOR^k$; $R^k$ is a hydrogen atom or an alkyl group having 1 to 5 carbon atoms; $R^b$, $R^c$, $R^d$, $R^e$, $R^f$ and $R^g$ each independently represent a hydrogen atom, a hydrocarbon group or a group in which hydrocarbon groups are bound by at least one of an ether bond and an ester bond; $R^b$ and $R^d$ can be bound to form a cyclic structure; the cyclic structure can have a substituent group $R^L$; $R^L$ is a hydrogen atom, a hydrocarbon group or a group in which hydrocarbon groups are bound by at least one of an ether bond and an ester bond; all the hydrocarbon groups can have a substituent group each; s is an integer of 1 to 18; t is an integer of 1 to 5; and u is an integer of 1 to 18.

4. A color material dispersion liquid comprising a color material, a dispersant and a solvent, the dispersant being a graft copolymer comprising at least one constitutional unit represented by the following general formula (I), wherein at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid:

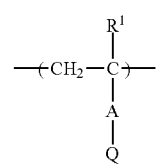 (I)

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

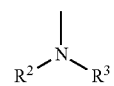 (I-a)

wherein $R^2$ and $R^3$ each independently represent a hydrogen atom or a hydrocarbon group which can contain a hetero atom, and $R^2$ and $R^3$ can be the same as or different from each other.

5. The color material dispersion liquid according to claim 4, wherein the graft copolymer of the dispersant is a graft copolymer in which at least one nitrogen-containing monomer represented by the following general formula (I') and a polymerizable oligomer comprising a polymer chain having at least one of constitutional units represented by the following general formulae (III) and (IV) and a group having an ethylenically unsaturated double bond at a terminal of the chain, are contained as copolymerizable components, and in which at least part of nitrogen sites of the constitutional units represented by the general formula (I) derived from the nitrogen-containing monomers each form a salt with the acidic organophosphorous compound:

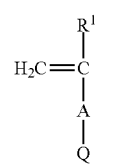 (I')

wherein $R^1$ is a hydrogen atom or methyl group; A is a direct bond or divalent linking group; and Q is a group represented by the following general formula (I-a) or a nitrogen-containing heterocyclic group which is able to form a salt with an acid and which can have a substituent group;

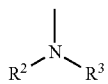

(I-a)

wherein $R^2$ and $R^3$ each independently represent a hydrogen atom or a hydrocarbon group which can contain a hetero atom, and $R^2$ and $R^3$ can be the same as or different from each other;

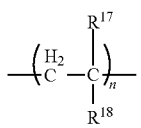

(III)

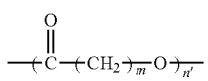

(IV)

wherein $R^{17}$ is a hydrogen atom or a methyl group; $R^{18}$ is a hydrocarbon group, a cyano group or a monovalent group described by $-[CH(R^{19})-CH(R^{20})-O]_x-R^{21}$, $-[(CH_2)_y-O]_z-R^{21}$, $-[CO-(CH_2)_y-O]_z-R^{21}$, $-CO-O-R^{22}$ or $-O-CO-R^{23}$; $R^{19}$ and $R^{20}$ each independently represent a hydrogen atom or a methyl group; $R^{21}$ is a hydrogen atom, a hydrocarbon group or a monovalent group described by a $-CHO$, $-CH_2 CHO$ or $-CH_2 COOR^{24}$; $R^{22}$ is a hydrocarbon group, a cyano group or a monovalent group described by $-[CH(R^{19})-CH(R^{20})-O]_x-R^{21}$, $-[(CH_2)_y-O]_z-R^{21}$ or $-[CO-(CH_2)_y-O]_z-R^{21}$; $R^{23}$ is an alkyl group having 1 to 18 carbon atoms; $R^{24}$ is a hydrogen atom or an alkyl group having 1 to 5 carbon atoms; all the hydrocarbon groups can have a substituent group each; m is an integer of 1 to 5; n and n' are each an integer of 5 to 200; x is an integer of 1 to 18; y is an integer of 1 to 5; and z is an integer of 1 to 18.

6. The color material dispersion liquid according to claim 4, wherein the acidic organophosphorous compound contains at least one of organic phosphonic acid monoester compounds represented by the following general formulae (V) and (VI):

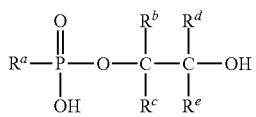

(V)

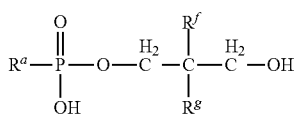

(VI)

wherein $R^a$ is a hydrocarbon group or a monovalent group described by $-[CH(R^h)-CH(R^i)-O]_s-R^j$ or $-[(CH_2)_t-O]_u-$; $R^j$; $R^h$ and $R^i$ each independently represent a hydrogen atom or a methyl group; $R^j$ is a hydrogen atom, a hydrocarbon group or a monovalent group described by $-CHO$, $-CH_2 CHO$, $-CO-CH=CH_2$, $-CO-C(CH_3)=CH_2$ or $-CH_2COOR^k$; $R^k$ is a hydrogen atom or an alkyl group having 1 to 5 carbon atoms; $R^b$, $R^c$, $R^d$, $R^e$, $R^f$ and $R^g$ each independently represent a hydrogen atom, a hydrocarbon group or a group in which hydrocarbon groups are bound by at least one of an ether bond and an ester bond; $R^b$ and $R^d$ can be bound to form a cyclic structure; the cyclic structure can have a substituent group $R^L$; $R^L$ is a hydrogen atom, a hydrocarbon group or a group in which hydrocarbon groups are bound by at least one of an ether bond and an ester bond; all the hydrocarbon groups can have a substituent group each; s is an integer of 1 to 18; t is an integer of 1 to 5; and u is an integer of 1 to 18.

7. A method for producing a color material dispersion liquid, the method comprising the steps of:
preparing an organic phosphonic acid monoester compound by adding a monofunctional epoxy compound or monofunctional oxetane compound to an organic phosphonic acid,
preparing a dispersant by mixing a polymer comprising at least one constitutional unit represented by the following general formula (I) with an acidic organophosphorous compound comprising the organic phosphonic acid monoester compound, thereby allowing that at least part of nitrogen sites of the constitutional units represented by the general formula (I) each form a salt with the acidic organophosphorous compound, and
dispersing the obtained dispersant and a color material in a solvent;

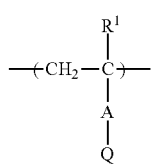

(I)

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

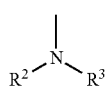

(I-a)

wherein $R^2$ and $R^3$ each independently represent a hydrogen atom or a hydrocarbon group which can contain a hetero atom, and $R^2$ and $R^3$ can be the same as or different from each other.

8. A color resin composition comprising a color material, a dispersant, a binder component and a solvent, the dispersant being a graft copolymer comprising at least one constitutional unit represented by the following general formula (I), wherein at least part of nitrogen sites of the constitutional units each form a salt with an acidic organophosphorous compound comprising one or more selected from the group consisting of organic phosphonic acid monoester compounds resulting from addition of a monofunctional epoxy compound or monofunctional oxetane compound to an organic phosphonic acid:

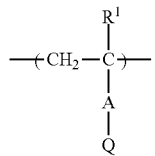
(I)

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

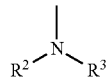
(I-a)

wherein $R^2$ and $R^3$ each independently represent a hydrogen atom or a hydrocarbon group which can contain a hetero atom, and $R^2$ and $R^3$ can be the same as or different from each other.

9. The color resin composition according to claim 8, wherein the graft copolymer of the dispersant is a graft copolymer in which at least one nitrogen-containing monomer represented by the following general formula (I') and a polymerizable oligomer comprising a polymer chain having at least one of constitutional units represented by the following general formulae (III) and (IV) and a group having an ethylenically unsaturated double bond at a terminal of the chain, are contained as copolymerizable components, and in which at least part of nitrogens sites of the constitutional units represented by the general formula (I) derived from the nitrogen-containing monomers each form a salt with the acidic organophosphorous compound:

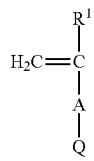
(I')

wherein $R^1$ is a hydrogen atom or methyl group; A is a direct bond or divalent linking group; and Q is a group represented by the following general formula (I-a) or a nitrogen-containing heterocyclic group which is able to form a salt with an acid and which can have a substituent group;

(I-a)

wherein $R^2$ and $R^3$ each independently represent a hydrogen atom or a hydrocarbon group which can contain a hetero atom, and $R^2$ and $R^3$ can be the same as or different from each other;

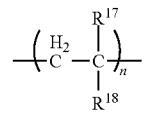
(III)

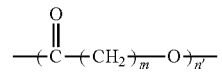
(IV)

wherein $R^{17}$ is a hydrogen atom or a methyl group; $R^{18}$ is a hydrocarbon group, a cyano group or a monovalent group described by $—[CH(R^{19})—CH(R^{20})—O]_x—R^{21}$, $—[(CH_2)_y—O]_z—R^{21}$, $—[CO—(CH_2)_y—O]_z—R^{21}$, $—CO—O—R^{22}$ or $—O—CO—R^{23}$; $R^{19}$ and $R^{20}$ each independently represent a hydrogen atom or a methyl group; $R^{21}$ is a hydrogen atom, a hydrocarbon group or a monovalent group described by a $—CHO$, $—CH_2CHO$ or $—CH_2COOR^{24}$; $R^{22}$ is a hydrocarbon group, a cyano group or a monovalent group described by $—[CH(R^{19})—CH(R^{20})—O]_x—R^{21}$, $—[(CH_2)_y—O]_z—R^{21}$ or $—[CO—(CH_2)_y—O]_z—R^{21}$; $R^{23}$ is an alkyl group having 1 to 18 carbon atoms; $R^{24}$ is a hydrogen atom or an alkyl group having 1 to 5 carbon atoms; all the hydrocarbon groups can have a substituent group each; m is an integer of 1 to 5; n and n' are each an integer of 5 to 200; x is an integer of 1 to 18; y is an integer of 1 to 5; and z is an integer of 1 to 18.

10. The color resin composition according to claim 8, wherein the acidic organophosphorous compound contains at least one of organic phosphoric acid monoester compounds represented by the following general formulae (V) and (VI):

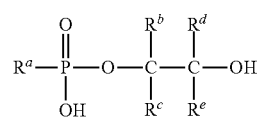
(V)

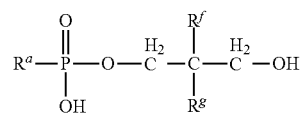
(VI)

wherein $R^a$ is a hydrocarbon group or a monovalent group described by $—[CH(R^h)—CH(R^i)—O]_s—R^j$ or $—[(CH_2)_t—O]_u—R^j$; $R^h$ and $R^i$ each independently represent a hydrogen atom or a methyl group; $R^j$ is a hydrogen atom, a hydrocarbon group or a monovalent group described by $—CHO$, $—CH_2CHO$, $—CO—CH=CH_2$, $—CO—C(CH_3)=CH_2$ or $—CH_2COOR^k$; $R^k$ is a hydrogen atom or an alkyl group having 1 to 5 carbon atoms; $R^b$, $R^c$, $R^d$, $R^e$, $R^f$ and $R^g$ each independently represent a hydrogen atom, a hydrocarbon group or a group in which hydrocarbon groups are bound by at least one of an ether bond and an ester bond; $R_b$ and $R^d$ can be bound to form a cyclic structure; the cyclic structure can have a substituent group $R^L$; $R^L$ is a hydrogen atom, a hydrocarbon group or a group in which hydrocarbon groups are bound by at least one of an ether bond and an ester bond; all the hydrocarbon groups can have a substituent group each; s is an integer of 1 to 18; t is an integer of 1 to 5; and u is an integer of 1 to 18.

11. A method for producing a color resin composition, the method comprising the steps of:
preparing an organic phosphonic acid monoester compound by adding a monofunctional epoxy compound or monofunctional oxetane compound to an organic phosphonic acid,
preparing a dispersant by mixing a polymer comprising at least one constitutional unit represented by the following general formula (I) with an acidic organophosphorous compound comprising the organic phosphonic acid monoester compound, thereby allowing that at least part of nitrogen sites of the constitutional units represented by the general formula (I) each form a salt with the acidic organophosphorous compound;
preparing a color material dispersion liquid by dispersing the obtained dispersant and a color material in a solvent; and
mixing the obtained color material dispersion liquid with a binder component;

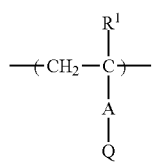
(I)

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

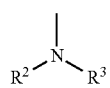
(I-a)

wherein $R^2$ and $R^3$ each independently represent a hydrogen atom or a hydrocarbon group which can contain a hetero atom, and $R^2$ and $R^3$ can be the same as or different from each other.

12. A color filter comprising at least a transparent substrate and color layers disposed on the transparent substrate, wherein at least one of the color layers is a color layer formed by curing a composition containing a color material, a dispersant and a binder component, and wherein the dispersant is a graft copolymer comprising at least one constitutional unit represented by the following general formula (I), in which at least part of nitrogen sites of the constitutional units each form a salt with an acidic organophosphorous compound comprising one or more e selected from the group consisting of organic phosphonic acid monoester compounds resulting from addition of a monofunctional epoxy compound or monofunctional oxetane compound to an organic phosphonic acid:

(I)

wherein $R^1$ is a hydrogen atom or a methyl group: A is a direct bond or a divalent linking group; and Q is a group represented by the following general formula (I-a) or a nitrogen-containing heterocyclic group which is able to form a salt with an acid and which can have a substituent group:

(I-a)

wherein $R^2$ and $R^3$ each independently represent a hydrogen atom or a hydrocarbon group which can contain a hetero atom, and $R^2$ and $R^3$ can be the same as or different from each other.

13. The color filter according to claim 12, wherein the graft copolymer of the dispersant is a graft copolymer in which at least one nitrogen-containing monomer represented by the following general formula (I') and a polymerizable oligomer comprising a polymer chain having at least one of constitutional units represented by the following general formulae (III) and (IV) and a group having an ethylenically unsaturated double bond at a terminal of the chain, are contained as copolymerizable components, and in which at least part of nitrogen sites of the constitutional units represented by the general formula (I) derived from the nitrogen-containing monomers each form a salt with the acidic organophosphorous compound:

(I')

wherein $R^1$ is a hydrogen atom or methyl group; A is a direct bond or divalent linking group; and Q is a group represented by the following general formula (I-a) or a nitrogen-containing heterocyclic group which is able to form a salt with an acid and which can have a substituent group;

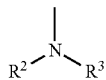
(I-a)

wherein $R^2$ and $R^3$ each independently represent a hydrogen atom or a hydrocarbon group which can contain a hetero atom, and $R^2$ and $R^3$ can be the same as or different from each other;

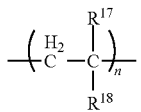
(III)

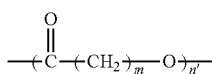
(IV)

wherein $R^{17}$ is a hydrogen atom or a methyl group; $R^{18}$ is a hydrocarbon group, a cyano group or a monovalent group described by $-[CH(R^{19})-CH(R^{20})-O]_x-R^{21}$, $-[(CH_2)_y-O]_z-R^{21}$, $-[CO-(CH_2)_y-O]_z-R^{21}$, $-CO-O-R^{22}$ or $-O-CO-R^{23}$; $R^{19}$ and $R^{20}$ each independently represent a hydrogen atom or a methyl group; $R^{21}$ is a hydrogen atom, a hydrocarbon group or a monovalent group described by a $-CHO$, $-CH_2CHO$ or $-CH_2COOR^{24}$; $R^{22}$ is a hydrocarbon group, a cyano group or a monovalent group described by $-[CH(R^{19})-CH(R^{20})-O]_x-R^{21}$, $-[(CH_2)_y-O]_z-R^{21}$ or $-[CO-(CH_2)_y-O]_z-R^{21}$; $R^{23}$ is an alkyl group having 1 to 18 carbon atoms; $R^{24}$ is a hydrogen atom or an alkyl group having 1 to 5 carbon atoms; all the hydrocarbon groups can have a substituent group each; m is an integer of 1 to 5; n and n' are each an integer of 5 to 200; x is an integer of 1 to 18; y is an integer of 1 to 5; and z is an integer of 1 to 18.

14. The color filter according to claim 12, wherein the acidic organophosphorous compound of the dispersant contains at least one of organic phosphonic acid monoester compounds represented by the following general formulae (V) and (VI):

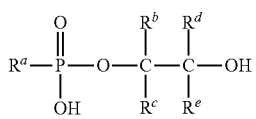
(V)

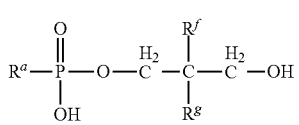
(VI)

wherein $R^a$ is a hydrocarbon group or a monovalent group described by $-[CH(R^h)-CH(R^i)-O]_s-R^j$ or $-[(CH_2)_t-O]_u-R^j$; $R^h$ and $R^i$ each independently represent a hydrogen atom or a methyl group; $R^j$ is a hydrogen atom, a hydrocarbon group or a monovalent group described by $-CHO$, $-CH_2CHO$, $-CO-CH=CH_2$, $-CO-C(CH_3)=CH_2$ or $-CH_2COOR^k$; $R^k$ is a hydrogen atom or an alkyl group having 1 to 5 carbon atoms; $R^b$, $R^c$, $R^d$, $R^e$, $R^f$ and $R^g$ each independently represent a hydrogen atom, a hydrocarbon group or a group in which hydrocarbon groups are bound by at least one of an ether bond and an ester bond; $R^b$ and $R^d$ can be bound to form a cyclic structure; the cyclic structure can have a substituent group $R^L$; $R^L$ is a hydrogen atom, a hydrocarbon group or a group in which hydrocarbon groups are bound by at least one of an ether bond and an ester bond; all the hydrocarbon groups can have a substituent group each; s is an integer of 1 to 18; t is an integer of 1 to 5; and u is an integer of 1 to 18.

15. A liquid crystal display device comprising the color filter defined by claim 12, a counter substrate, and a liquid crystal layer disposed between the color filter and the counter substrate.

16. An organic light-emitting display device comprising the color filter defined by claim 12 and an organic light-emitting material.

17. A non-aqueous dispersant which is a block copolymer comprising at least one constitutional unit represented by the following general formula (I), wherein at least part of nitrogen sites of the constitutional units each form a salt with an acidic organophosphorous compound containing at least one of organic phosphonic acid monoester compounds represented by the following general formulae (V) and (VI):

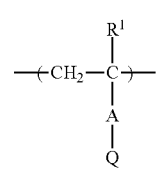
(I)

wherein $R^1$ is a hydrogen atom or a methyl group; A is a direct bond or a divalent linking group; and Q is a group represented by the following general formula (I-a) or a nitrogen-containing heterocyclic group which is able to form a salt with an acid and which can have a substituent group:

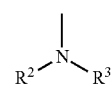
(I-a)

wherein $R^2$ and $R^3$ each independently represent a hydrogen atom or a hydrocarbon group which can contain a hetero atom, and $R^2$ and $R^3$ can be the same as or different from each other:

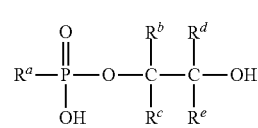
(V)

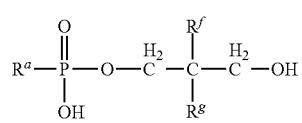
(VI)

wherein $R^a$ is a hydrocarbon group or a monovalent group described by $—[CH(R^h)—CH(R^i)—O]_s—R^j$ or $—[(CH_2)t—O]_u—R^j$; $R^h$ and $R^i$ each independently represent a hydrogen atom or a methyl group; $R^j$ is a hydrogen atom, a hydrocarbon group or a monovalent group described by —CHO, —CH$_2$CHO, —CO—CH=CH$_2$, —CO—C(CH$_3$)=CH$_2$ or —CH$_2$COOR$^k$; $R^k$ is a hydrogen atom or an alkyl group having 1 to 5 carbon atoms; $R^b$, $R^c$, $R^d$, $R^e$, $R^f$ and $R^g$ each independently represent a hydrogen atom, a hydrocarbon group or a group in which hydrocarbon groups are bound by at least one of an ether bond and an ester bond; $R^b$ and $R^d$ can be bound to form a cyclic structure; the cyclic structure can have a substituent group $R^L$; $R^L$ is a hydrogen atom, a hydrocarbon group or a group in which hydrocarbon groups are bound by at least one of an ether bond and an ester bond; at least one of $R^b$, $R^c$, $R^d$ and $R^e$ is a group in which hydrocarbon groups are bound by at least one of an ether bond and an ester bond, or $R^b$ and $R^d$ are bound to form a cyclic structure; at least one of $R^f$ and $R^g$ is a group in which hydrocarbon groups are bound by at least one of an ether bond and an ester bond; all the hydrocarbon groups can have a substituent group each; s is an integer of 1 to 18; t is an integer of 1 to 5; and u is an integer of 1 to 18.

18. A color material dispersion liquid comprising a color material, a dispersant and a solvent,
wherein the dispersant is the non-aqueous dispersant defined by claim 17.

19. A color resin composition comprising a color material, a dispersant, a binder component and a solvent,
wherein the dispersant is the non-aqueous dispersant defined by claim 17.

20. A color filter comprising at least a transparent substrate and color layers disposed on the transparent substrate,
wherein at least one of the color layers is a color layer formed by curing a composition containing a color material, a dispersant and a binder component, and
wherein the dispersant is the non-aqueous dispersant defined by claim 17.

21. A liquid crystal display device comprising the color filter defined by claim 20, a counter substrate, and a liquid crystal layer disposed between the color filter and the counter substrate.

22. An organic light-emitting display device comprising the color filter defined by claim 20 and an organic light-emitting material.

* * * * *